United States Patent
Tanizaki et al.

(10) Patent No.: US 7,423,898 B2
(45) Date of Patent: Sep. 9, 2008

(54) NONVOLATILE SEMICONDUCTOR MEMORY DEVICE

(75) Inventors: Hiroaki Tanizaki, Itami (JP); Hideto Hidaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 92 days.

(21) Appl. No.: 11/376,202

(22) Filed: Mar. 16, 2006

(65) Prior Publication Data

US 2006/0209585 A1  Sep. 21, 2006

(30) Foreign Application Priority Data

Mar. 16, 2005 (JP) ............................. 2005-075635
Dec. 8, 2005 (JP) ............................. 2005-354900

(51) Int. Cl.
*G11C 11/00* (2006.01)
(52) U.S. Cl. .................... 365/148; 365/63; 365/189.09; 365/230.03
(58) Field of Classification Search ................ 365/63, 365/148, 189.09, 230.03
See application file for complete search history.

(56) References Cited

U.S. PATENT DOCUMENTS 6,594,176 B2 * 7/2003 Lammers .................... 365/171
6,678,189 B2 * 1/2004 Tran .......................... 365/171
7,254,057 B2 * 8/2007 Hidaka ....................... 365/171

FOREIGN PATENT DOCUMENTS

JP  2003-298013 A  10/2003
JP  2004-186553 A  7/2004

* cited by examiner

*Primary Examiner*—Hoai V Ho
(74) *Attorney, Agent, or Firm*—McDermott Will & Emery LLP

(57) ABSTRACT

A path routing from a write current source supplying a write current through an internal data line, a bit line and a source line to a reference potential except a memory cell is configured to have a constant resistance independent of a memory cell position selected in a memory array, and each of the resistance value of the current path between the memory cell and the write current source and the resistance value of the current path between the selected memory cell and the reference potential node is set to 500Ω or lower. A nonvolatile semiconductor memory device having improved reliability of data read/write is achieved.

11 Claims, 41 Drawing Sheets

: SLk = SL(n/2)

: RW+RB+RS+RG=CONSTANT

4W : VARIABLE CURRENT SOURCE
S/A1–S/A4: SENSE AMPLIFIER CIRCUIT

RESISTANCE DISTRIBUTIONS IN MUTLI-VALUED CASE

NONVOLATILE SEMICONDUCTOR MEMORY DEVICE

BACKGROUND OF THE INVENTION

1. Field of the Invention

The present invention relates to a nonvolatile semiconductor memory device, and particularly to a construction for improving reliability of write and read data of a phase change memory including memory cells each having a data storing element which selectively attains a crystalline state (polycrystalline state) and an amorphous state in accordance with stored data.

2. Description of the Background Art

Nonvolatile memories storing information in a nonvolatile manner have been widely employed in application of portable equipment and others. As such nonvolatile memories, there are a flash memory storing information by storing charges on a floating gate of a stacked gate transistor, and a memory utilizing a resistance value change type memory cell having a resistance value of a memory element changed according to stored information. As the resistance value change type memories, there are known various memories such as a Magnetic RAM (MRAM) utilizing a magnetic resistance effect, a Resistance RAM (RRAM) utilizing changes in resistance of perovskite oxide caused by voltage pulse stimulation, and a Phase Change Memory (PCM) utilizing, as a storage element, a phase change material that changes between a crystalline state (polycrystalline state) and an amorphous state depending on heat treatment, and assumes different resistance values for the respective states.

A prior art reference 1 (Japanese Patent Laying-Open No. 2003-298013) discloses a structure implementing shrunk cells through use of a Sb—Te film as a main component instead of a GST film (Ge—Sb—Te film) with Sb doped by 56% or more, to attain a resistivity of 100 Ωcm for lowering a resistance of a phase change material element in the phase change memory. This prior art reference 1 also discloses that In, Ag and Ge may be added in total at an atomic rate of 15% or lower.

A prior art reference 2 (Japanese Patent Laying-Open No. 2004-186553) discloses a configuration of an RRAM in which source lines are provided in parallel to word lines, and a source line is shared between memory cells arranged in a direction perpendicular to a bit line. In the prior art reference 2, an access transistor is arranged in common to two adjacent variable resistance elements in a row direction, and the access transistor has a large gate width to have a reduced on-resistance: Additionally, this prior art reference 2 shows a construction of a unit cell for which the source line is provided parallel to the bit line.

In the structure disclosed in the foregoing prior art reference 1, the material composition of the phase change material element is selected so as to reduce the resistance value of the phase change material element. According to the prior art reference 1, the resistance value changes between the order of 10 Ω and the order of 10 KΩ corresponding to the crystallized state (crystalline or polycrystalline state) and the amorphous state. Normally, the memory cells storing data according to the resistance values have resistance values varied due to variations in parameters during manufacturing process. In particular, the variation in resistance value is remarkably large in using the phase change material elements, because the amorphous state is utilized for storing information. The prior art reference 1 has given no consideration to the problem related to such variation in resistance value.

Usually, the phase change memory internally reads concurrently the data of multiple bits of the memory cells. When the source line is shared between the memory cells from which the data are concurrently read, read currents flow in parallel through these selected memory cells, and may cause mutual interference between the selected memory cells through the shared source line, so that accurate reading may be difficult. For example, when a plurality of memory cells are connected to a common source line, the memory cell having the lowest resistance value causes a large current to flow through the common source line. When the large current raises the source line potential, the raised potential restricts the read currents of the other selected memory cells, which causes a problem of increase in access time or occurrence of erroneous reading.

As disclosed also in the prior art reference 1, a data write is performed by causing a current to flow through a storage element for changing the crystalline state to the amorphous state, and this writing current flows through the same current path as that for data reading, but is greater by one order or more of magnitude than the current for data reading. Accordingly, a read current path is associated with a stray capacitance of write circuitry for supplying the large write current, resulting in a problem that read current can not be changed fast.

The prior art reference 2 discloses a construction, in which the resistance elements sharing an access transistor are set to low and high resistance states, respectively, to provide a complementary bit line structure, and a sense amplifier senses complementary data for achieving fast data reading. In this construction, however, two variable resistance elements store data of one bit, so that a storage capacity is small.

Instead of the complementary bit line structure, such a structure may be considered that a selected memory cell is coupled to the sense amplifier, and a reference data (current) for the selected memory cell is supplied to this sense amplifier. In this configuration, a reference cell having substantially the same structure as a normal memory cell is utilized as an element for producing a reference current, and this reference cell produces a current corresponding to a resistance value state intermediate between the high and low resistance states. In this configuration, currents are supplied to the normal memory cell and the reference cell while charging a parasitic resistance and a parasitic capacitance present on the data line. Therefore, even during the charging, a current difference between the normal memory cell and the reference cell can be read, so that data can be read fast. In this case, with the use of a cell the same in structure and form as the normal memory cell for the reference cell, temperature characteristics and others can be made identical, to cancel current changes due to operation environments, so that there is no need for providing a characteristic compensating circuit to the read circuit, and the read circuit can be made simple.

Generally, the reference cells are aligned to the normal memory cells, and the normal memory cell and the reference cell on the same row are selected to connect a normal memory cell bit line and a reference cell bit line to the sense amplifier. Therefore, the reference cells are selected more times than the normal memory cells. Since the read current flows through the reference cell, this read current may cause read disturbance, that the state of the phase change material element slowly changes from the amorphous state to the crystalline state, leading to a problem that an accurate reference current cannot be produced.

In the prior art reference 2 described above, consideration is given merely to the construction for reducing the on-resistance of the access transistor in the memory cell, and no consideration is given to the construction of the read unit that produces the reference current by using the reference cell in the high resistance state.

In the data read operation, the read current is supplied to a selected memory cell for determining the resistance value of the selected memory cell, and the read operation is performed through comparison of the memory cell current with the reference voltage or reference current. The current path of the read current supplied to the selected memory cell extends from the sense amplifier (read circuit) through an internal data line, a column (bit line) select gate, a bit line, a memory cell select transistor, a memory cell resistance (phase change material element) and a source line to a ground potential (reference potential source), for example. In this current path, when the lengths of the internal data line, the bit line and the source line change depending on the position of the selected address, i.e. position of the selected memory cell in the memory cell array, the total resistance value of the read current path changes and accordingly, the read current changes. Consequently, a problem arises that a margin for the sense operation in data reading lowers, and accordingly, fast reading of accurate data cannot be achieved.

In the data write operation, a write current path is likewise formed for conducting a write current to the selected memory cell. This write current path is such a route from a write current source through an internal data line, a column select gate, a bit line, a memory cell select transistor, a memory cell (phase change material element) and a source line to a ground potential. In this case, therefore, when the lengths of the internal data line, bit line and source line included in the write current path change depending on the selected address position, the total resistance value of the write current path changes to change the write current value, which results in a problem that a margin in the data write operation is impaired and data writing cannot be performed fast.

When data reading is performed on a multi-bit basis, the data writing is likewise performed to memory cells on a multi-bit basis. When the memory cells selected concurrently share a source line, mutual interference occurs between the selected memory cells via the shared, common source line in the write operation similarly to the read operation. For example, a large write current flows to the shared source line via the memory cell of the smallest resistance value, to raise the potential on the shared source line to restrict the write currents of other memory cells, resulting in an erroneous data writing or others. Further, the write current needs to be large, but a sufficiently large write current cannot flow due to the electric resistance of the shared source line, which may cause erroneous writing.

The prior art reference 2 already described gives no consideration to the problem of changes in source potential on the shared source line during writing or reading. Further, no consideration is given to the problem of changes in read and write currents depending on the position of a selected memory cell in a memory cell array.

SUMMARY OF THE INVENTION

An object of the present invention is to provide a nonvolatile semiconductor memory device that can write and read data with high reliability.

Another object of the present invention is to provide a phase change memory that can achieve fast data reading.

A nonvolatile semiconductor memory device according to a first aspect of the invention includes: a plurality of normal memory cells arranged in rows and columns, each having a resistance value changed by heat generated through application of current and each storing information according to the resistance value; and a plurality of reference cells and arranged in at least one row being aligned to the plurality of normal memory cells. The normal memory cell has a first resistance state and a second resistance state selectively set according to the stored information. The reference cells includes at least a storage element having a resistance value other than the resistance value corresponding to the first resistance state of the normal memory cell.

The nonvolatile semiconductor memory device according to the first aspect of the invention further includes cell selecting circuit for selecting a normal memory cell and the reference cell according to an address signal; and read circuitry for comparing a current flowing through the selected normal cell with a current flowing through the selected reference cell to detect the stored information in the selected normal cell.

A nonvolatile semiconductor memory device according to a second aspect of the invention includes a plurality of memory cells arranged in rows and columns, each having a resistance value changed by application of heat to store data according to the resistance value; current supply circuitry for supplying a write current for heat generation or a read current for data reading to a selected memory cell among the plurality of memory cells in a data write operation or a data read operation; a plurality of bit lines arranged corresponding to the memory cell columns, each connecting to the memory cells in a corresponding column; and a plurality of source lines for transmitting the write current or the read current to or from the corresponding bit lines via the selected memory cells in a data write mode and a data read mode, respectively. One memory cell is selected from the memory cells connected to each source line, and a current flows to each source line through the one memory cell in the data write operation and data read operation.

In a path of the write current, each of a current path from a write current source to the selected memory cell and a current path routing from the selected memory cell through the source line to a reference potential source has a resistance value of 500 Ω or smaller.

A nonvolatile semiconductor memory device according to a third aspect of the invention includes a plurality of memory cells arranged in rows and columns, each having a resistance value changed through application of heat to store data according to the resistance value; write current supply circuit for supplying a write current for heat generation to a selected memory cell among the plurality of memory cells; a plurality of bit lines arranged corresponding to memory cell columns, each connecting to the memory cells in a corresponding column; and a plurality of source lines conducting the write currents to and from the corresponding bit lines through selected memory cells. A resistance value of a current path routing from the write current source to the bit line, the source line and the reference potential source, excluding the memory cell is substantially constant independently of the position of the selected memory cell.

In the nonvolatile semiconductor memory device according to the first aspect, the reference cell is formed of the memory element in the state other than the state corresponding to the first resistance state. Therefore, even when the read current flows through the reference cell more times than the normal memory cell, the possibility that the state of the reference cell changes is small. Thus, the read disturbance can be prevented, and the reference current can be accurately produced.

In the nonvolatile semiconductor memory device according to the second aspect, memory cells are arranged so as for each source line to be connected to the selected memory cell of one bit in the data write operation. Thus, the write current merely flows to the source line through the one selected memory cell. Therefore, the mutual interference of the write currents between the selected memory cells can be prevented, and fast and accurate data writing can be achieved. By configuring the write current path each to have the resistance value not greater than 500 Ω, the voltage applied to the memory cell is 2 V even when the power supply voltage is 3 V, and therefore a sufficiently large current can be supplied to the memory cell, so that the data writing can be reliably performed even under a low power supply voltage-condition.

According to the nonvolatile semiconductor memory device of the third aspect, the path of the write current routing from the write current source through the data line, the bit line and the source line, excluding memory cells is formed to have the total resistance value substantially constant independently of the position of a selected address, and it is possible to suppress dependency of the write current on the position of the selected memory cell in the array, so that accurate writing can be performed, and the write margin can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
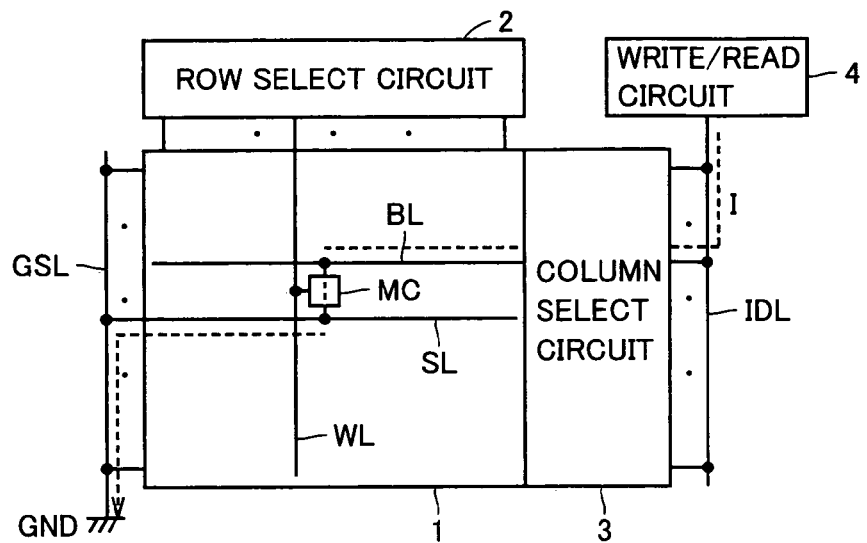
FIG. 1 schematically shows a construction of a main portion of a nonvolatile semiconductor memory device according to a first embodiment of the invention.

FIG. 1 schematically shows a configuration of a main portion of a nonvolatile semiconductor memory device according to a first embodiment of the invention. In FIG. 1, a nonvolatile semiconductor memory device includes a memory cell array 1 having memory cells MC arranged in rows and columns. In memory cell array 1, word lines WL are arranged corresponding to the respective rows of memory cells MC, and bit lines BL are arranged corresponding to the respective memory cell columns. Source lines SL are provided corresponding to and in parallel to bit lines BL, respectively. Source lines SL are coupled to a global source line GSL that extends along a first side of memory cell array 1 perpendicularly to bit line BL and source line SL. Global source line GSL is coupled to a ground node (ground pad; reference potential source). Memory cell MC, of which structure will be described later, includes a phase change material element as a storage element, and the phase change material element attains a crystallized state (crystalline or polycrystalline state) or an amorphous state according to a write current. The crystallized state corresponds to a low resistance state, and the amorphous state corresponds to a high resistance state (first resistance state).

The nonvolatile semiconductor memory device further includes a row select circuit 2 for driving a word line WL corresponding to a selected row in memory cell array 1 to the selected state according to an address signal received from an address input circuit (not shown), a column select circuit 3 for selecting a bit line BL corresponding to the selected column in memory cell array 1 according to a column address signal received from the address input circuit (not shown), an internal data line IDL arranged, outside column select circuit 3, extending in an extending direction of word line WL, and a write/read circuit 4 for supplying a write/read current to internal data line IDL.

When memory cell MC is selected, write/read circuit 4 supplies a write or read current I, and a current flows from bit line BL selected by column select circuit 3 into global source line GSL via memory cell MC and source line SL.

Source line SL crosses word line WL, and a memory cell MC corresponding to the crossing in between is selected. Accordingly, only one memory cell MC is selected with respect to one source line SL to pass the write/read current in between, so that it is possible to prevent mutual interference of the source line potential between selected memory cells in the data write and read operations.

Bit line BL and source line SL have an equal resistance value per unit length. Likewise, internal data line IDL and global source line GSL have an equal resistance value per unit length. Except for the resistance value of memory cell MC, therefore, the total resistance value of the current path routing from write/read circuit 4 through memory cell MC to the ground node can be constant independently of the position of memory cell MC in memory cell array 1, and it is possible to suppress dependency of the write/read current on the position of memory cell within the array, so that accurate writing and reading can be achieved.

Figure 2:
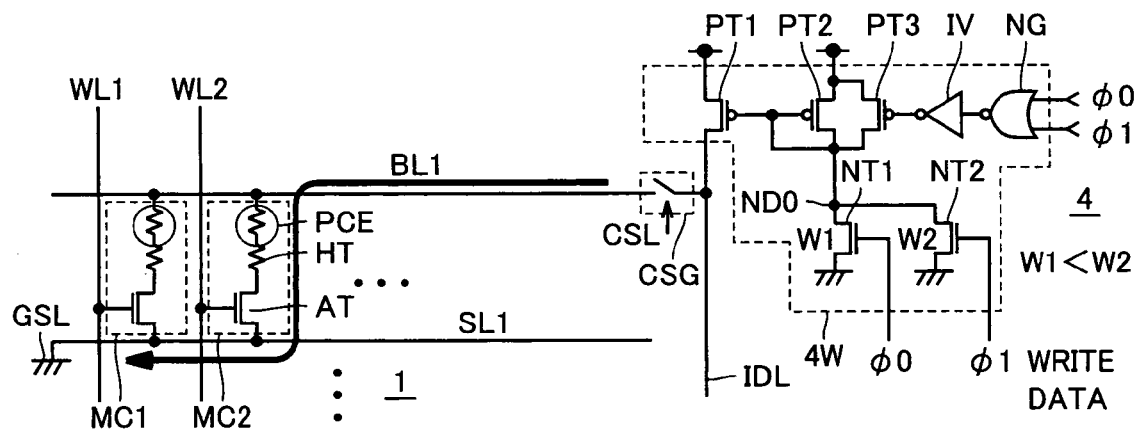
FIG. 2 schematically shows a configuration of a part of the nonvolatile semiconductor memory device shown in FIG. 1 and particularly a portion related to data writing.

FIG. 2 shows an example of a configuration of a portion related to the data writing of the nonvolatile semiconductor memory device shown in FIG. 1. FIG. 2 representatively shows memory cells MC1 and MC2 arranged between bit line BL1 and source line SL1. Memory cells MC1 and MC2 are coupled to word lines WL1 and WL2, respectively. Memory cells MC1 and MC2 have the same structure, and only components of memory cell MC2 are allotted with reference characters in FIG. 2. Memory cell MC2 includes a phase change material element PCE formed of a chalcogenide material such as a GST film, a heater layer HT for heating phase change material element PCE for writing, and an access transistor AT electrically coupling heater layer HT to source line SL1 when word line WL2 is selected. These phase change material element PCE, heater layer HT and access transistor AT are connected in series between bit line BL1 and source line SL1. Access transistor AT is formed of an N-channel-MOS transistor (insulated gate field effect transistor), as an example.

Phase change material element PCE may be a GST film, or may be formed of (Ag)—In—Sb—Te-system material element. A resistance element (heater layer HT) for the heater is generally made of a refractory metal having a high melting point such as tungsten.

Write/read circuit 4 includes a variable current source 4W for supplying a write current for data writing. Variable current source 4W includes a NOR gate NG receiving write control signals $\phi 0$ and $\Phi 1$ produced selectively according to the write data, an inverter IV inverting an output signal of NOR gate NG, a P-channel MOS transistor (insulated gate field effect transistor) PT1 connected between a power supply node and internal data line IDL and having a gate connected to an internal node ND0, a P-channel MOS transistor PT2 connected between the power supply node and internal node ND0 and having a gate connected to internal node ND0, a P-channel MOS transistor PT3 coupling internal node ND0 to the power supply node when inverter IV generates an output signal at an L level (logical low level), an N-channel MOS transistor NT1 for driving a current from internal node ND0 to the ground node according to write control signal $\phi 0$ and an N-channel MOS transistor NT2 driving a current from internal node ND0 to the ground node according to write control signal $\phi 1$.

MOS transistor NT1 has a channel width W1 smaller than a channel width W2 of MOS transistor NT1, and has a larger current drive power than MOS transistor NT1. Write control signals $\phi 0$ and $\phi 1$ become active when data "0" and "1" are to be written, respectively.

Internal data line IDL is coupled to bit line BL1 via a column select gate CSG which is selectively turned on in response to column select signal CSL.

Figure 3:
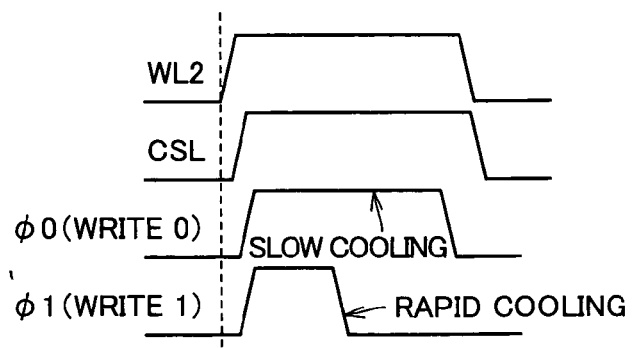
FIG. 3 is a signal waveform diagram representing an operation for data writing of write related circuitry shown in FIG. 2.

FIG. 3 is a signal waveform diagram illustrating an operation of the data write related circuitry shown in FIG. 2. The operation of data write related circuitry shown in FIG. 2 will now be described with reference to FIG. 3.

Before data writing, both write control signals $\phi 0$ and $\phi 1$ are at the L level, and the output signal of inverter IV is at-the L level. MOS transistor PT3 maintains internal node ND0 at the power supply voltage level. Both MOS transistors PT1 and PT2 are in a non-conductive state. Since write control signals $\phi 0$ and $\phi 1$ are at the L level, MOS transistors NT1 and NT2 are also non-conductive.

For data writing, word line WL corresponding to a selected row is driven to the selected state. It is now assumed that word line WL2 is selected. In this state, access transistor AT in memory cell MC2 is turned on to form a path of current flow from bit line BL1 via memory cell MC2 to source line SL1. Source line SL1 is connected to global source line GSL, and is coupled via this global source line GSL to the ground node (ground pad).

Then, column select signal CSL is driven to the selected state, column select gate CSG is turned on and internal data line IDL is coupled to bit line BL1. When data "0" is to be written, write control signal $\phi 0$ is driven. When write control signal $\phi 0$ rises to the H level (logical high level), NOR gate NG produces the output signal at the L level, and responsively, inverter IV generates the output signal at the H level to turn off MOS transistor PT3. MOS transistor NT1 is turned on to discharge a current from internal node ND0 to the ground node. MOS transistor PT2 supplies the driving current of MOS transistor NT1. MOS transistors PT2 and PT1 form a current mirror circuit with MOS transistor PT2 being a master, and a current corresponding to the current driven by MOS transistor NT1 is supplied from internal data line IDL to bit line BL1 as indicated by a heavy black line in FIG. 2, and flows through memory cell MC2. This write current causes heater layer HT to generate heat for causing phase change in phase change material element PCE. However, the write current for writing data "0" is long in pulse width and is small in current amount. Therefore, when the heat generated by heater layer HT changes the phase change material element from the amorphous state to the crystallized state, the crystallized state will be maintained owing to subsequent slow cooling. The memory cell in the crystallized state maintains the crystallized state according to the write current.

When write control signal $\phi 1$ is driven for writing data "1", MOS transistor NT2 is turned on to supply a larger write current having a smaller pulse width than that for writing data "0". Therefore, the phase change material element is rapidly heated by heater layer HT and then is rapidly cooled, and this rapid heating and quenching changes phase change material element PCE from the crystallized state to the amorphous state. The memory cell in the amorphous state maintains the amorphous state owing to the rapidly heating and cooling. The amorphous state is a high resistance state, and the crystallized state is a low resistance state. Accordingly, data "0" and "1" can be stored as the resistance value information of phase change material element PCE according to write control signals $\phi 0$ and $\phi 1$, respectively.

The high resistance state usually measures the resistance value from about 85 K$\Omega$ to about 100 K$\Omega$, and the low resistance state measures the resistance value from about 0.1 K$\Omega$ to 2.0 K$\Omega$. In this case, memory cell current Icell (write current) for writing data "0" is about 0.3 mA, and memory cell current Icell for writing data "1" ranges from about 0.75 mA to about 1.0 mA.

Figure 4:
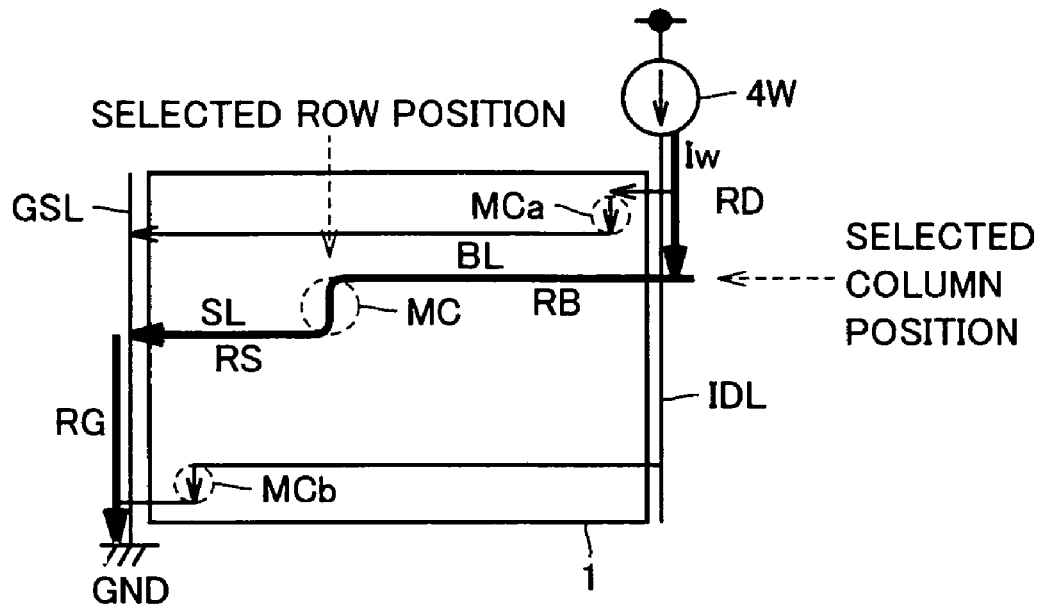
FIG. 4 schematically shows a resistance distribution of a write current path in the first embodiment of the invention.

FIG. 4 schematically shows a path of the write current. In FIG. 4, variable current source 4W supplies a write current Iw to bit line BL placed on the selected column via internal data line IDL. The write current supplied to bit line BL flows through memory cell MC to corresponding source line SL. The current on source line SL flows through global source line GSL to ground node (ground pad) GND. Internal data line IDL and global source line GSL are parallel to each other, and bit line BL and source line SL are parallel to each other. Source line SL and bit line BL have an equal resistance value per unit length, and internal data line IDL and global source line GSL have an equal resistance value per unit.

For memory cell MC, it is assumed that internal data line IDL upstream to the bit line has an interconnection resistance of RD, bit line BL upstream to memory cell MC has a resistance of RB, source line SL upstream to global source line GSL has a resistance value of RS and global source line GSL between source line SL and the ground node has a resistance value of RG. In this case, a total resistance value Rall of the current path of write current Iw except the resistance value of memory cell MC is expressed by the following equation:

$$Rall = RD + RB + RS + RG$$

Bit line BL and SL are arranged parallel to each other, and a sum, (RB+RS), of resistances of bit and source lines BL and SL is always constant independently of the position of a selected row. Likewise, a sum, (RD+RG), of the resistances of internal data line IDL and global source line GSL is constant independently of the position of the selected column. Therefore, total resistance value Rall is always constant independently of the position of a selected memory cell in the memory cell array.

For example, when memory cell MCa closest to variable current source 4W is selected, combined resistance of (RD+RB) takes the minimum value. In this case, the sum, (RS+RG), of the resistances of source line SL and global source line GSL takes the maximum value. When memory cell MCb at the trailing ends of internal data line IDL and bit line BL is selected, the sum of bit line resistance RB and interconnection resistance RD of the internal data line takes the maximum value. In this case, the sum of resistances (RS+RG) of source line SL and global source line GSL takes the minimum value.

In memory cell array 1, therefore, the total resistance value of the path of the write current except the resistance value of the memory cell can always be constant, and the write current Iw of the same magnitude can be supplied. Variable current'source 4W is not required to adjust the amount of write current depending on the position of a selected memory cell, but is merely required to supply the write current of a predetermined magnitude according to the write data, so that the control of the write current source can be made easy.

According to the parallel arrangement of source and bit lines SL and BL, each source line SL conducts the write current flowing through only one memory cell even when a plurality of bit lines are selected in parallel when writing data of multiple bits, and it is possible to prevent mutual interference of the write currents between the selected memory cells.

Figure 5:
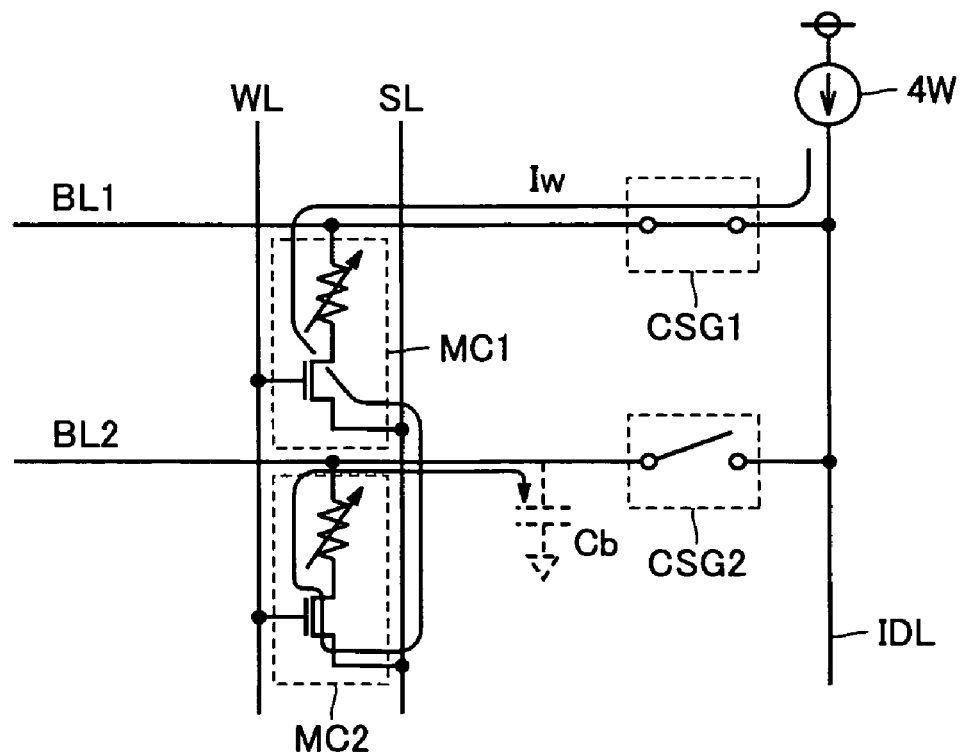
FIG. 5 illustrates an advantageous effect of the construction shown in FIG. 4.

In the arrangement as shown in FIG. 5, in which source line SL is perpendicular to bit line BL, and thus is parallel to word line WL, the access transistors of memory cells MC1 and MC2 have gates commonly connected to word line WL, and also have sources connected to source line SL. The variable resistance elements of memory cells MC1 and MC2 are connected to bit lines BL1 and BL2, respectively. Each variable resistance element includes a phase change material element and a heater element. Bit line BL1 is connected to internal data line IDL via column select gate CSG1. Bit line BL2 is connected to internal data line IDL via column select gate CSG2. A parasitic capacitance Cb is present on bit line BL2. Variable current source 4W is arranged at an end of internal data line IDL.

It is assumed that write current Iw is supplied to memory cell MC1. In this state, variable current source 4W supplies write current Iw to memory cell MC1 through column select gate CSG1. Write current Iw flows to source line SL through memory cell MC1. In memory cell MC2, the access transistor is conductive according to the potential on word line WL, and the current on source line SL further flows through bit line BL2 to charge the parasitic capacitance Cb.

Accordingly, in the case where memory cells MC1 and MC2 to be selected by the same word line are commonly connected to source line SL, the write current flows in unselected memory cell MC2 in writing data into memory cell MC1, and accordingly, the write disturbance that the crystal phase (the crystallized state or the amorphous state) change may occur in the unselected memory cell MC2. Particularly, in the state where memory cell MC2 is in the amorphous state, there is a high likelihood that memory cell MC2 changes from the amorphous state to the crystallized state due to slow cooling even when the current flowing from memory cell MC1 to source line SL is small. Accordingly, the parallel arrangement of bit line BL and source line SL can eliminates the problem of write disturbance which may occur when the source line SL is arranged perpendicular to bit lines BL (BL1 and BL2). Thus, only one selected memory cell is connected to source line SL, and only the selected memory cell provides the current path to the source line, so that the problem of write disturbance can be solved.

Figure 6:
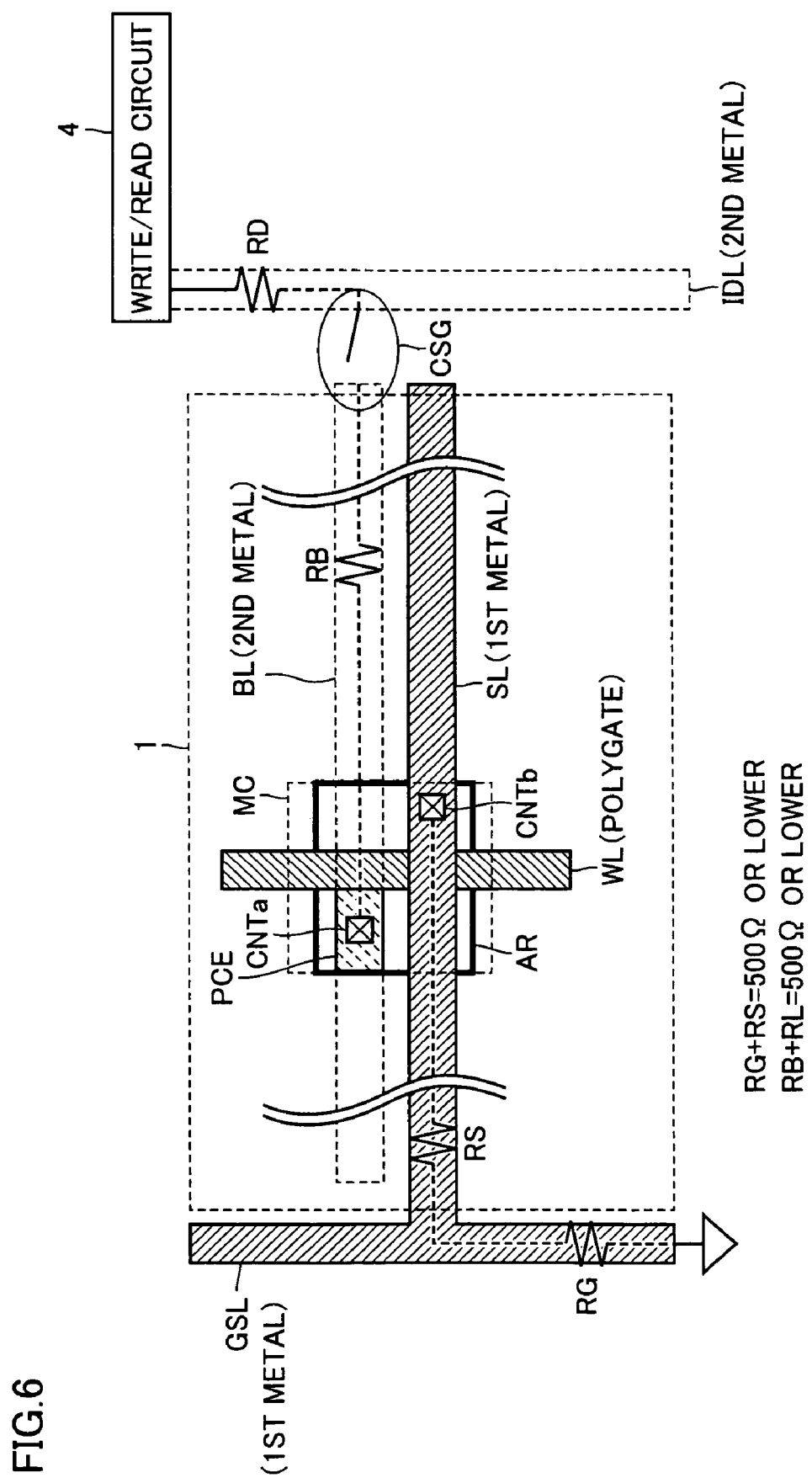
FIG. 6 schematically shows an interconnection layout of the write circuitry in the first embodiment of the invention.

FIG. 6 schematically shows a layout of a main portion of the nonvolatile semiconductor memory device according to the first embodiment of the invention. In FIG. 6, internal data line IDL is formed of a second level metal, and has an end coupled to write/read circuit 4. The second metal is a second metal interconnection layer in a multilayer interconnection structure. Bit line BL is formed of the second metal similarly to internal data line IDL. Source line SL is formed of a first metal (a first layer of the metal interconnection layers) and is arranged parallel to bit line BL.

Word line WL formed of polycrystalline silicon is arranged crossing bit and source lines BL and SL, under these first and second metal interconnection layers. Word line WL provides the gate of the access transistor of memory cell MC.

Memory cell MC is arranged at the crossing between word line WL and bit and source lines BL and SL. Memory cell MC and the adjacent memory cell share an isolation region formed in between, and therefore the region of memory cell MC is larger than an active region AR. An access transistor (not shown) is formed in active region AR. The access transistor is electrically connected to source line SL via a contact CNTb. Phase change material element PCE is formed parallel to bit line BL, and its upper electrode (not shown) is electrically connected to bit line BL via a contact CNTa.

Source line SL is connected to global source line GSL, which in turn is located outside memory cell array 1 and extends in the same direction as word line WL. Global source line GSL is made of the first metal similarly to source line SL.

Internal data line IDL and bit line BL are electrically connected via column select gate CSG. The write current path from write/read circuit 4 to memory cell MC has a sum of resistances (RD+RB) of 500 Ω or lower. Likewise, the write current path from source line SL of memory cell MC via global source line GSL to the ground node has a sum of resistances (RS+RG) of 500 Ω or lower. By setting each of resistances of (RD+RB) and (RG+RS) to 500 Ω or lower with respect to a selected memory cell MC, the following advantageous effect can be achieved.

Figure 7:
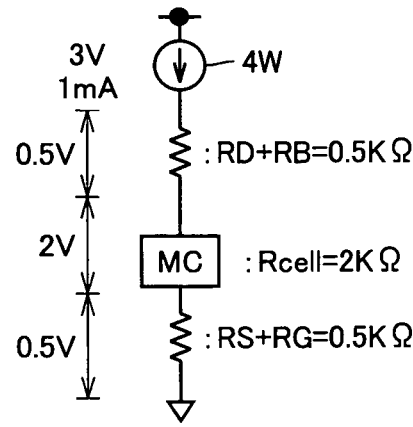
FIG. 7 schematically shows a voltage distribution of resistances of the interconnection layout shown in FIG. 6.

As shown in FIG. 7, it is now assumed that the sum of resistances, (RD+RB), from variable current source 4W to memory cell MC is 0.5 KΩ, memory cell MC is in the low resistance state with Rcl=2 KΩ, and the sum of resistances, (RS+RG), from memory cell MC to the ground node is 0.5 KΩ. The power supply voltage of variable current source 4W for writing is 3 V. Memory cell MC needs to be supplied with a current of 1 mA or more for writing into the high resistance state. In this case, when variable current source 4W supplies a current of 1 mA, voltage drop of 0.5 V occurs on the path of resistance of (RD+RB), and voltage drop of 2 V occurs across memory cell MC. Voltage drop of 0.5 V occurs across the path of resistance (RS+RG). For supplying the write current to memory cell MC when the bit and source lines have large resistances, variable current source 4W is required to generate a voltage higher than 3 V. This increases its transistor size, and makes it difficult for writing variable current source to operate with the low power supply voltage.

As shown in FIG. 7, therefore, each of the resistance value between memory cell MC and variable current source 4W and the resistance value between memory cell MC and the ground node is set to 500 Ω (0.5 KΩ) or lower, whereby the write current can be-sufficiently supplied to memory cell MC even with the use of the power supply voltage of 3 V, and the write current can be accurately supplied to memory cell MC without increasing the scale of variable current source 4W.

When a read current is supplied to memory cell MC, as will be described later, only a current of about 10 μA at most flows through memory cell MC, and the current value thereof is much smaller than that in the write operation, so that it is possible to avoid the problem of read disturbance that the read current changes the crystal phase of the phase change material element of a selected memory cell from the amorphous state to the crystallized state.

First Modification

Figure 8:
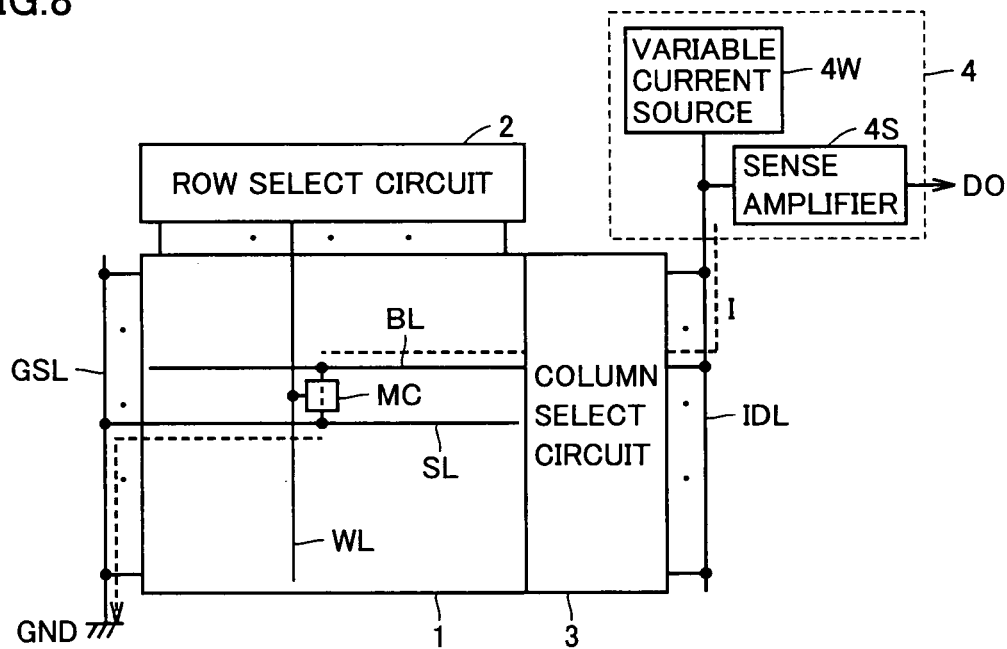
FIG. 8 schematically shows a construction of a modification of the first embodiment of the invention.

FIG. 8 schematically shows a configuration of a main portion of a nonvolatile semiconductor memory device of a modification of the first embodiment according to the invention. In the nonvolatile semiconductor memory device shown in FIG. 8, a sense amplifier 4S is connected to internal data line IDL in parallel to variable current source 4W supplying the write current. Other configurations of the nonvolatile semiconductor memory device shown in FIG. 8 are the same as those shown in FIGS. 1 and 2. Corresponding components are allotted with the same reference numerals or characters, and description thereof will not be repeated.

Sense amplifier 4S may be of a voltage sense type or of a current sense type. When it is of the voltage sense type, the voltage on the internal data line is compared with a reference voltage to produce the internal read data. In the case of the current sense type, the internal read data may be produced by comparing the memory cell current flowing through the internal data line with a reference current, may be produced by current amplification of amplifying the memory cell current or may be produced by internally converting the memory cell current to the voltage. Sense amplifier 4S can be formed of any configuration, as far as the current is supplied to the memory cell in the data read operation.

Memory cell MC is set to either the high resistance state (amorphous state) or the low resistance state (polycrystalline or crystalline state), depending on the storage data. Sense amplifier 4S supplies a read current to bit line BL on a selected column through a column select circuit 3. Therefore, the read current supplied from sense amplifier 4S is selectively discharged to source line SL according to the resistance value of memory cell MC, and the voltage level of internal data line IDL changes according to the storage data of memory cell MC. When sense amplifier 4S is of the voltage sense type, it produces internal read data DO by comparison with the reference voltage.

Figure 9:
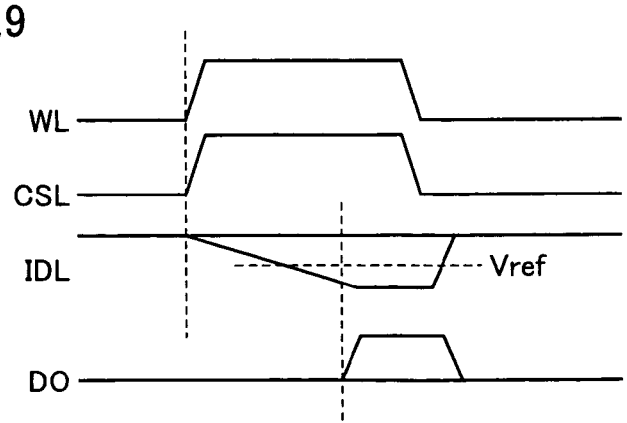
FIG. 9 is a signal waveform-diagram representing a data read operation of the nonvolatile semiconductor memory device shown in FIG. 8.

FIG. 9 is a signal waveform diagram representing an operation in data reading of the nonvolatile semiconductor memory device shown in FIG. 8. Referring to FIG. 9, the operation for data reading of the nonvolatile semiconductor memory device shown in FIG. 8 will now be described briefly.

Before the data reading, internal read data line IDL is precharged to a predetermined voltage (power supply voltage level). Bit line BL and source line SL are precharged to the ground voltage level.

When the memory access starts, row select circuit 2 drives word line WL to the selected state and, concurrently, column select signal CSL generated from a column decoder, which is not shown but is included in column select circuit 3, is driven to the selected state. Accordingly, the corresponding column select gate (CSG) is turned on to electrically connect corresponding bit line BL to internal read data line IDL. In the data read operation, sense amplifier 4S supplies read current I. Read current I is discharged via source line SL to the ground node at a rate depending on the storage data (resistance value) of memory cell MC. The potential on internal read data line IDL lowers when memory cell MC is in the low resistance state, but lowers only slightly when memory cell MC is in the high resistance state.

In the case in which sense amplifier 4S is of the voltage sense amplifier, when a predetermined time elapses and the potential on internal data line IDL sufficiently changes, sense amplifier 4S compares the potential on internal data line IDL with a reference voltage Vref, and produces internal read data DO based on a result of comparison.

In the data read operation, as shown in FIG. 8, sense amplifier 4S likewise supplies read current I to the ground node via bit line BL, memory cell MC, source line SL and global source line GSL. Bit line BL and source line SL are arranged in parallel, and internal data line IDL and global source line GSL are arranged parallel to word line WL. Bit line BL and source line SL have an equal resistance value per unit length, and global source line GSL and internal data line IDL have an equal resistance value per unit length. Thus, the flow path of read current I can have a constant total resistance value, except for the resistance of the memory cell, independently of the position of the selected memory cell MC in memory cell array 1, and the read current of a constant magnitude can be supplied through the read current path independently of the position of the selected memory cell in memory cell array 1.

In this case, as shown in FIG. 7, each of the resistance of (RD+RB) between memory cell MC and sense amplifier 4S and the resistance of (RS+RG) between memory cell MC and ground node GND is set to 0.5 KΩ. Thereby, even when memory cell MC is in the low resistance state (2 KΩ), a sufficiently large read current of about 10 μA can be produced even with a low power supply voltage, and the accurate data reading can be achieved.

Second Modification

Figure 10:
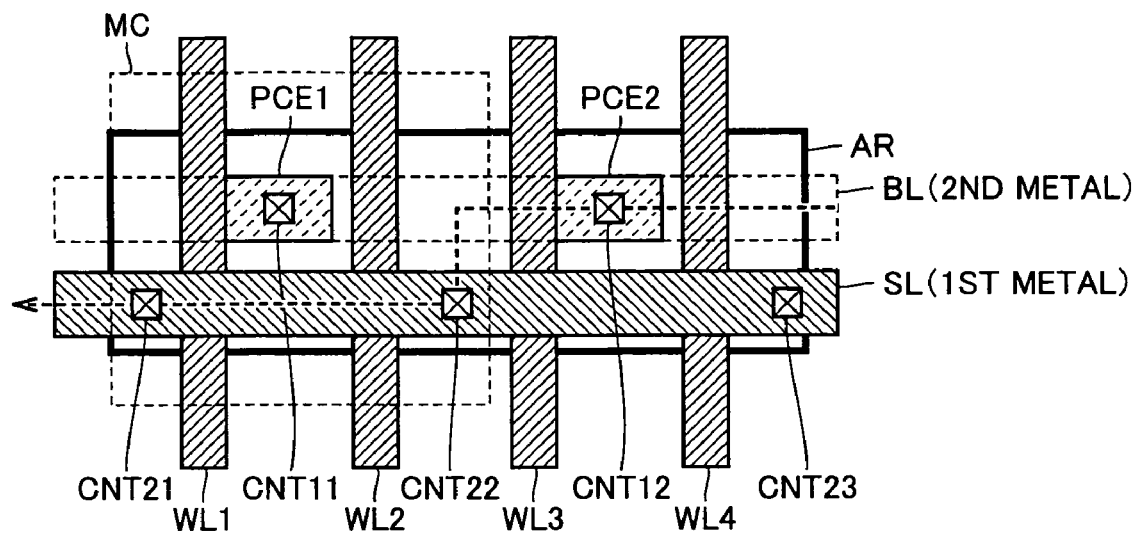
FIG. 10 schematically shows a planar layout of a memory cell in the first embodiment of the invention.

FIG. 10 shows a modification of a layout of the memory cell according to the first embodiment of the invention. Referring to FIG. 10, bit line BL and source-line SL are formed of second and first metal interconnection lines, respectively, and are parallel to each other. The first and second metal interconnection lines represent the metal interconnections at the first and second layers in a multilayer interconnection structure, respectively.

Word lines WL1-WL4 crossing bit line BL are spaced from each other by a predetermined distance. Phase change material elements PCE1 and PCE2 are formed parallel to bit line BL, and are adjacent to word lines WL1 and WL3, respectively. Phase change material elements PCE1 and PCE2 are connected to bit line BL via contacts CNT11 and CNT12.

Contacts CNT21 and CNT22 are formed point-symmetrically to contacts CNT11 and CNT12 with respect to word lines WL1 and WL3, respectively. Each of contacts CNT21 and CNT22 electrically connects an impurity region formed at an active region AR to source line SL. A contact CNT23 is formed opposing to contact CNT12 with respect to word line WL4 and corresponding to source line SL.

In active region AR, an impurity region is not formed under word lines WL1-WL4, and the substrate region (not shown clearly) is exposed with impurity implantation for adjusting a threshold voltage being performed.

Phase change material elements PCE1 and PCE2 are shown in the figure being spaced from word lines WL2 and WL4, respectively. However, word lines WL2 and WL4 may overlap with phase change elements PCE1 and PCE2 in a plan view, respectively.

In the structure shown in FIG. 10, memory cell MC is formed of phase change material element PCE1, word line WL1, contact CNT21 and source line SL. When word line WL3 is selected, contact CNT22 forms the current path to source line SL for phase change material element PCE of the adjacent memory cell.

When word line WL2 is selected, a current flows from bit line BL to contact CNT22 through phase change element PCE1 and active region AR, and further flows to source line SL. When an even-numbered word line WL2 or WL4 is selected, a current temporarily flows away from the global source line through source line SL. In the structure shown in FIG. 10, therefore, active region AR may be formed continuously in a band-like form extending in the column direction, and even-numbered word lines WL2 and WL4 may be utilized as field plate lines for cell isolation to prevent continuous flow of a current through a plurality of memory cells in the column direction via active region AR.

In the structure shown in FIG. 10, when an odd-numbered word line is selected, the write current indicated by broken line always flows leftward from bit line BL toward the global source line. For example, when phase change material element PCE2 is selected, word line WL3 is selected, and the current flows from bit line BL through phase change material element PCE2, active region AR, contact CNT22 and source line SL. Word line WL2 is not selected, and a channel is not formed under word line WL2 so that the current path is interrupted.

When word line WL1 is selected, the current flows from phase change material element PCE1 through contact CNT21 to source line SL. In the construction of rendering one word line into the selected state, a portion contributive to the bit line resistance and a portion contributive to the source line resistance do not normally overlap each other at any point on a path through which the current flows, and the total resistance value of bit line BL and source line. SL can be constant independently of the position of the selected memory cell.

Figure 11:
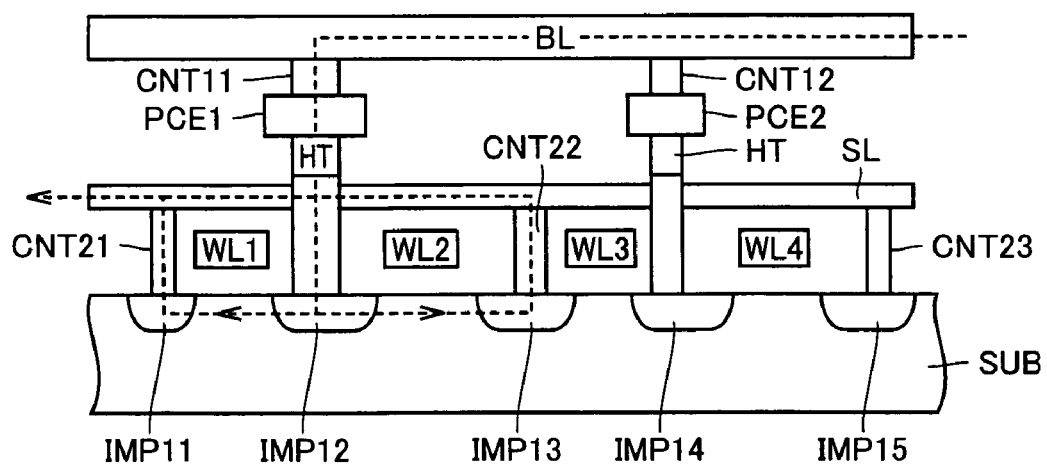
FIG. 11 schematically shows a sectional structure of the planar layout shown in FIG. 10.

FIG. 11 schematically shows a sectional structure corresponding to a memory cell layout shown in FIG. 10. In the sectional structure shown in FIG. 11, the cell layout shown in FIG. 10 is employed, and the two word lines are simultaneously driven to the selected state, so that two access transistors are utilized to conduct the write/read current.

Impurity regions IMP11-IMP15 are formed at the surface of substrate region SUB spaced apart with each other. Impurity region IMP11 is connected to source line SL via contact CNT21. Impurity region IMP12 is coupled to phase change material element PCE1 via a resistive electrode and heater layer HT. Phase change material element PCE1 is connected to bit line BL via an upper electrode (not shown) and contact CNT11. Impurity region IMP13 is coupled to source line SL via contact CNT22. Impurity region IMP14 is connected to phase change material element PCE2 via a resistive electrode and heater layer HT. Phase change material element PCE2 is connected to bit line BL via contact CNT12.

Impurity region IMP15 is connected to source line SL via contact CNT23. Impurity regions IP11 and IMP12 are formed in a self-aligned manner with respect to word line WL1. Impurity regions 112 and IMP13 are formed in a self-aligned manner with respect to Word line WL2. Impurity regions IMP13 and IMP14 are formed in a self-aligned manner with respect to word line WL3. Impurity regions IMP4 and IMP5 are formed in a self-aligned manner with respect to word line WL4.

When word line WL2 is selected, a channel is formed at the surface of substrate region SUB, to connect impurity regions IMP12 and IMP13, and a current flows from bit line BL through contact CNT22 to source line SL. Likewise, when word line WL4 is selected, a channel is formed to connect electrically impurity regions IMP14 and IMP15 together. Thus, phase change material element PCE is shared between two word lines adjacent thereto, and a set of the word lines located on the opposite sides of phase change material element PCE are simultaneously selected. Therefore, even if the access transistor has a small size (channel width), a current path can be widened for phase change material element PCE1 by simultaneously selecting word lines WL1 and WL2. Thus, a path discharging a sufficiently large write current to source line SL can be ensured in the path of conducting the write current from bit line BL, and phase change material element PCE1 can be accurately set to the resistance state corresponding to the storage information.

In the data read operation, the read current corresponding to the storage data can be reliably discharged from the bit line to source line SL, and the data corresponding to the storage data can be read accurately. Likewise, when word lines WL3 and WL4 are selected, the current path through impurity regions IMP14 and IMP15 to source line SL and the current path through impurity regions IMP14 and IMP13 to source line SL can be formed in parallel. Accordingly, even if the transistor size (channel width) is miniaturized, by simultaneously selecting word lines WL3 and WL4 with respect to phase change material element PCE2, it is possible to drive the write/read current of a sufficient magnitude to source line SL through impurity regions IMP13 and IMP15.

By utilizing the layout of the memory cell shown in FIG. 11 and selecting the two adjacent word lines in parallel, even in the miniaturized transistor structure, it is possible to form a current path having a sufficiently large current driving power to the source line. By utilizing the structure shown in FIGS. 10 and 11, it is possible to conduct the current through the bit line and source line SL in substantially the same direction, so that all the memory cells can be reliably provided with a write current path of an equal electrical length (equal resistance value).

In the structure of the layout shown in FIG. 10; when odd-numbered word lines are utilized for selecting a memory cell row and even-numbered word lines are utilized as the field plate lines, for interrupting the current path more reliably, a gap region may be formed between word line WL2 and each of impurity regions IMP12 and IMP13, and a gap region may also be formed between word line WL4 and each of impurity regions IMP14 and IMP15. Alternatively, only channel cut regions for impurity regions IMP12 and 14 electrically connected to phase change material elements PCE1 and PCE2 may be formed with respect to word lines WL2 and WL4. Further alternatively, word line WL2 may be provided with a gap region with respect to only one of impurity regions IMP12 and IMP13, and word line WL4 may be provided with a gap region with respect to only one of impurity regions IMP14 and IMP15, in the case where one word line is selected.

As for formation of the gap regions for word lines WL2 and WL4, side walls (side wall insulating films) are formed for word lines WL2 and WL4, and impurity implantation is performed in a self-aligned manner to form the impurity regions to form the gap regions using the side walls as a mask. When the side walls are to be formed for all word lines WL1-WL4, thick side walls are formed for word lines WL2 and WL4.

According to the first embodiment of the invention, as described above, the source and bit lines are arranged parallel to each other, the global source line and the internal data line are arranged perpendicularly to these bit and source lines. Thus, the paths of the write current and read current except the memory cell can have an equal resistance value independently of the position of a selected memory cell-in the memory cell array, so that it is possible to reduce the dependency of the write data and read current on the position of a selected memory cell in the memory cell array.

Each of the resistance between memory cell MC and the write/read circuit and the resistance between memory cell MC and the ground node takes the value of 0.5 KΩ or lower, whereby it is possible to supply the sufficiently large write and read current with a low power supply voltage.

Second Embodiment

Figure 12:
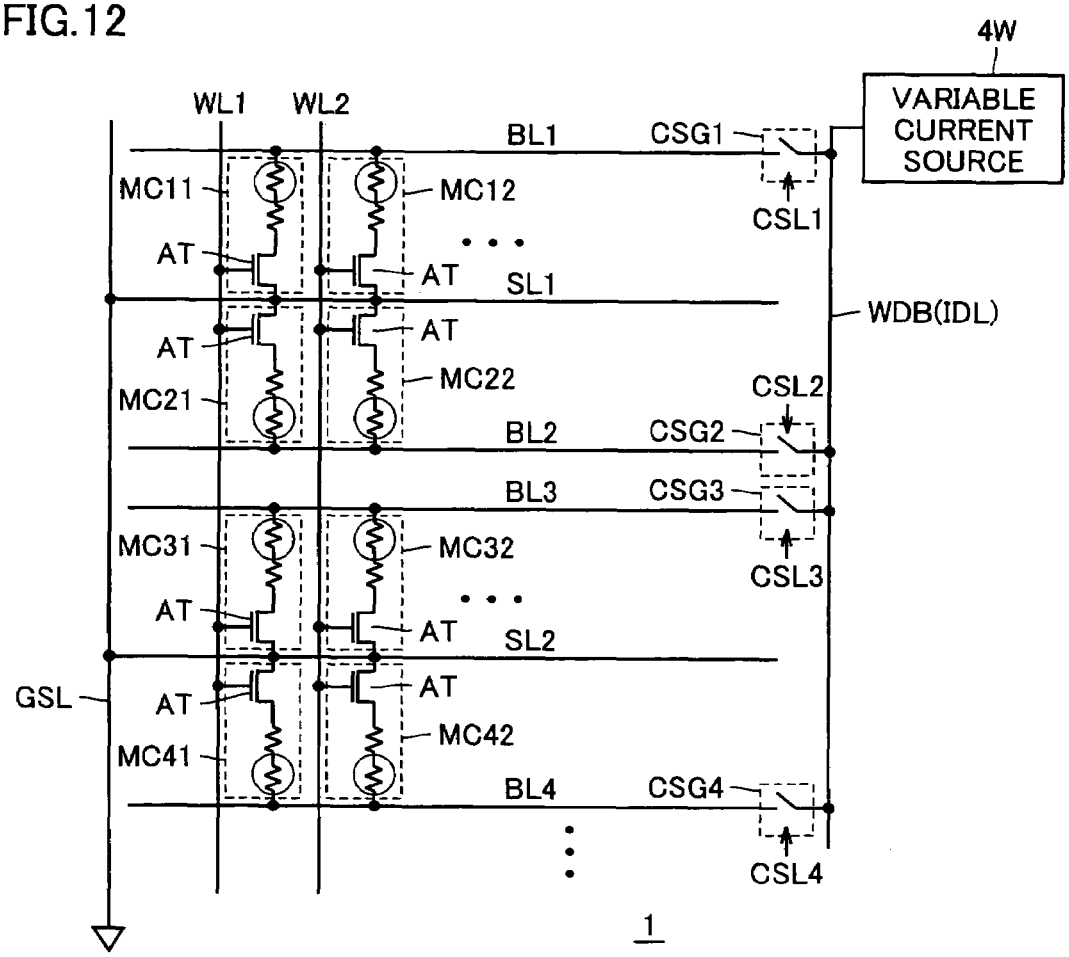
FIG. 12 schematically shows an arrangement of memory cells in an array of a second embodiment according to the invention.

FIG. 12 shows a construction of an array portion of a nonvolatile semiconductor memory device according to a second embodiment of the invention. In FIG. 12, bit lines BL1-BL4 are arranged, and source line SL1 is arranged corresponding to and between bit lines BL1 and BL2, in parallel to them. Source line SL2 is arranged corresponding to and between bit lines BL3 and BL4, in parallel to them. Bit lines BL1-BL4 are coupled to an internal write data line WDB included in internal data line IDL via column select gates CSG1-CSG4, respectively.

Source lines SL1 and SL2 are commonly connected to global source line GSL. Memory cells MC11, MC12, ... are connected to bit line BL1, memory cells MC21, MC22, ... are connected to bit line BL2, memory cells MC31, MC32, ... are connected to bit line BL3 and memory cells MC41, MC42, ... are connected to bit line BL4.

Source line SL1 is shared between the memory cells connected to bit line BL1 and BL2. Thus, access transistors AT of the memory cells connected to bit lines BL1 and BL2 are commonly connected to source line SL1. Likewise, access transistors AT of the memory cells connected to bit lines BL3 and BL4 are commonly connected to source line SL2.

Similarly to the first embodiment, bit lines BL1-BL4 and source lines SL1 and SL2 have the equal resistance value per unit length, and internal write data line WDB and global source line GSL have the equal resistance value per unit length.

Variable current source 4W is connected to internal write data line WDB. The positional relationship between variable current source 4W and the ground node of global source line GSL is substantially the same as that in the first embodiment.

In the configuration shown in FIG. 12, therefore, the total resistance value of the path of the write current for each memory cell except for each respective memory cell can be equal to those for other memory cells.

Each of source line SL1 is provided so as to be shared between the two adjacent bit lines, and access transistors AT of the memory cells adjacent to each other in the row direction (in the word line extending direction) can be connected to the source line via the common contact, so that the layout area of each memory cell (MC11, MC12, ... MC41, MC42, ...) can be reduced.

It is merely required to arrange each of source lines SL1 and SL2 for the two columns of memory cells, and the pitch requirement for the source lines can be relaxed so that the source lines and the memory cells can be arranged with an adequate margin. Thus, a large margin can be ensured for mask misalignment, to improve the product yield.

Figure 13:
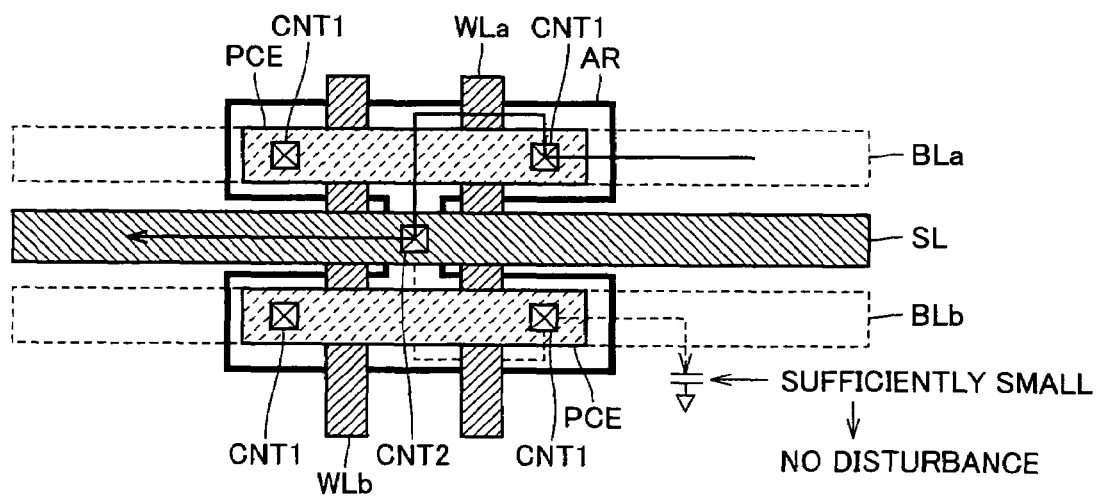
FIG. 13 schematically shows a planar layout of the memory cell arrangement shown in FIG. 12.

FIG. 13 schematically shows a planar layout of the memory cell array shown in FIG. 12, and particularly shows the planar layout of the four bits of memory cells.

Referring to FIG. 13, rectangular-shaped phase change material elements PCE formed of, e.g., a GCT film are arranged parallel to bit lines BLa and BLb (BL1 and BL2, or BL3 and BL4), and each phase change material element PCE is shared between memory cells of two bits. Bit line BLa is connected to phase change material element PCE via contact CNT1, and bit line BLb is connected electrically to corresponding phase change material element PCE via contact CNT1. Active region AR of a laterally H-shaped form is formed commonly to these four bits of memory cells. In the memory cell array, active region AR thus configured is arranged repeatedly in the row and column directions.

Active region AR includes regions parallel to bit lines BLa and BLb, and a region concatenating between bit lines BLa and BLb. Active region AR is electrically connected to source line SL arranged parallel to bit lines BLa and BLb via contact CNT2. Word lines WLa and WLb crossing source line SL and bit lines BLa and BLb are arranged outside contact CNT2 and inside phase change material element PCE.

In the layout shown in FIG. 13, only one contact CNT2 is arranged for connecting the four bits of memory cells to common source line SL, and the area occupied by the memory cells can be made smaller than that in a layout having an individual source line contact for each memory cell.

When the current flows from bit line BLa to source line SL, a parasitic capacitance of bit line BLb may be charged by a shunting current of the source line current. However, the bit line parasitic capacitance is sufficiently small (for example, it is reduced by connecting a smaller number of memory cells to one bit line than the memory cells (phase change elements) connected to one word line). Therefore, the charging of the parasitic capacitance causes almost no change in the potential on bit line BLb, and no disturbance substantially occurs on adjacent bit lines BLb.

Figure 14:
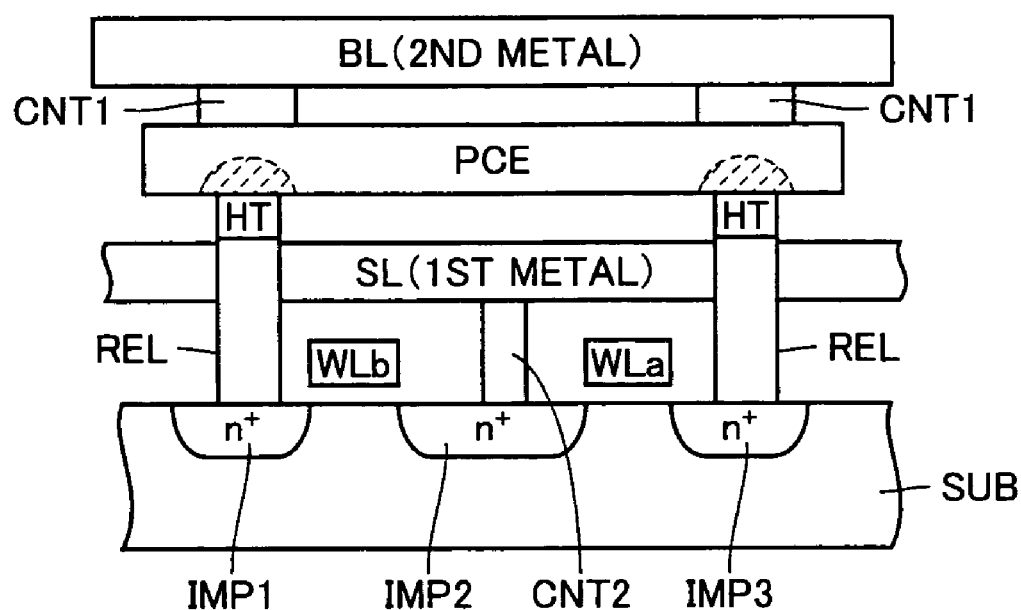
FIG. 14 schematically shows a sectional structure of the planar layout shown in FIG. 13.

FIG. 14 schematically shows a sectional structure of memory cells of two bits among the four bits of memory cells shown in FIG. 13. In FIG. 14, bit line BL (BLa or BLb) is coupled to phase change material element PCE via contact CNTL1. Heater layer HT is arranged corresponding to contact CNT1 under phase change material element PCE. Heater layers HT are connected to impurity regions IMP1 and IMP3 formed at the surface of substrate region SUB via electrode layers (plugs) REL of a low resistance, respectively. Impurity region IMP2 is formed at the surface of substrate region between impurity regions IMP1 and IMP3, and is connected to source line SL via contact CNT2.

Source line SL is arranged parallel to bit line BL and extending in the column direction, at a position displaced from heater layer HT and resistive electrode layer REL for preventing physical collision with them. Word line WLb is arranged above the surface of the substrate region between impurity regions IMP1 and IMP2, and word line WLa is arranged above the surface of the substrate region between impurity regions IMP2 and IMP3.

In the structure shown in FIG. 14, for example, bit line BL is formed of the second metal interconnection line, source line SL is formed of the first metal interconnection line and word lines WLa and WLb are formed using polycrystalline silicon.

In the case where memory cells of two bits share phase change material element PCE, as shown in FIG. 14, phase change material element PCE may be formed continuously for the two bits of memory cells. Even in such arrangement, heater layer HT merely causes the phase change corresponding to the storage data only at its neighboring portion, and the heat is not conducted to the adjacent bits. Accordingly, each memory cell accurately forms a crystalline phase (resistance state) corresponding to storage data in accordance with the write current. When phase change material element PCE is in the amorphous state, it has a high resistance value, and a shunting current of the write/read current can be prevented from flowing to the phase change element portion of the adjacent memory cell.

In the case where the source line is shared between the memory cells in adjacent columns as shown in FIG. 12, when one word line WL (WL1, WL2, . . . ) is selected, only one of the two bit lines (BL1 or BL2, or BL3 or BL4) provided for the memory cells sharing the source line (in the case of the multiple-bit data writing). Thus, parallel writing of the multiple-bit data can be achieved without causing collusion of the data. For example, one of column select signals CSL1 and CSL2 is driven to the selected state, and one of column select signals CSL3 and CSL4 is driven to the selected state, so that 2-bit data can be written (with write data line WDB having a width of 2 bits).

Alternatively, the rising of the source line potential is fully suppressed even when source line SL is supplied with the write/read current via two bits of memory cells, if the bit lines sharing the source line are connected to different data lines, to be supplied with the write current corresponding to the storage data in data writing, and with the read current in the data read operation.

In the structure shown in FIG. 12, the sense amplifiers are likewise coupled to the bit lines via the column select gates (CSG1-CSG4). Internal data line IDL may be shared between variable current source 4W and the sense amplifier. Write data line WDB may be provided separately from the internal read data line transmitting the read current of the sense amplifier.

First Modification

Figure 15:
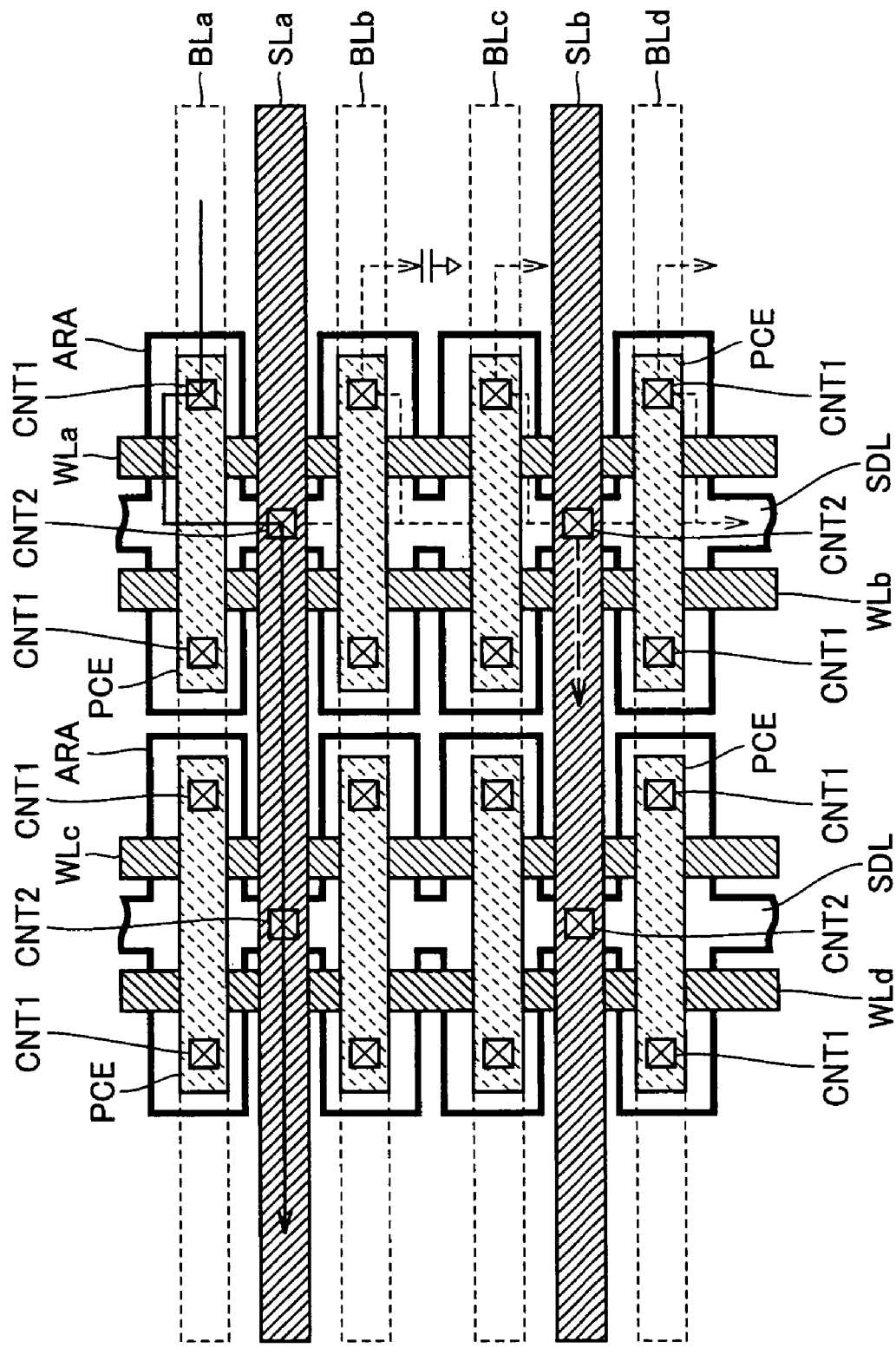
FIG. 15 schematically shows a memory cell arrangement of a first modification of the second embodiment according to the invention.

FIG. 15 schematically shows a planar layout of a first modification of the layout of memory cells in the second embodiment according to the invention. In the arrangement of the memory cells previously shown in FIG. 13, active region AR of the laterally H-shaped form is arranged repeatedly in the row and column directions. Therefore, each active region AR is provided individually and is isolated from the others for each four bits of memory cells. In the arrangement of memory cells according to the first modification shown in FIG. 15, in a structure of an active region ARA, the source impurity region continuously extends in the row direction or the word line extending direction. In the column direction (bit line extending direction), each active region ARA is continuously formed for two bits of memory cells, and each active region ARA is isolated from the others for each two bits of memory cells. In the arrangement of the memory cells shown in FIG. 15, the active regions of the laterally H-shaped form shown in FIG. 13 have the source impurity regions concatenated continuously in the row direction. Phase change element PCE is coupled to corresponding active region ARA through contact CNT1.

A word line is arranged between source line contact CNT1 and a source impurity region SDL. FIG. 15 shows word lines WLa-WLd. Each source line is provided for each two bit lines. In the layout of FIG. 15, source line SLa is arranged between bit lines BLa and BLb, and source line SLb is arranged between bit lines BLc and BLd. Each of source lines SLa and SLb is coupled to source impurity region SDL via contact CNT2.

In the layout of the memory cells shown in FIG. 15, therefore, source impurity region SDL continuously extending in the row direction is connected to source lines SL (SLa and SLb) via contacts CNT2. Since source impurity region SDL continuously extends in the row direction, source impurity region SDL is lined with source lines SL (SLa and SLb) like a word line shunt structure, so that variations in resistance of source impurity region SDL is substantially suppressed, and the source line resistance for the memory cell is reduced.

Figure 16:
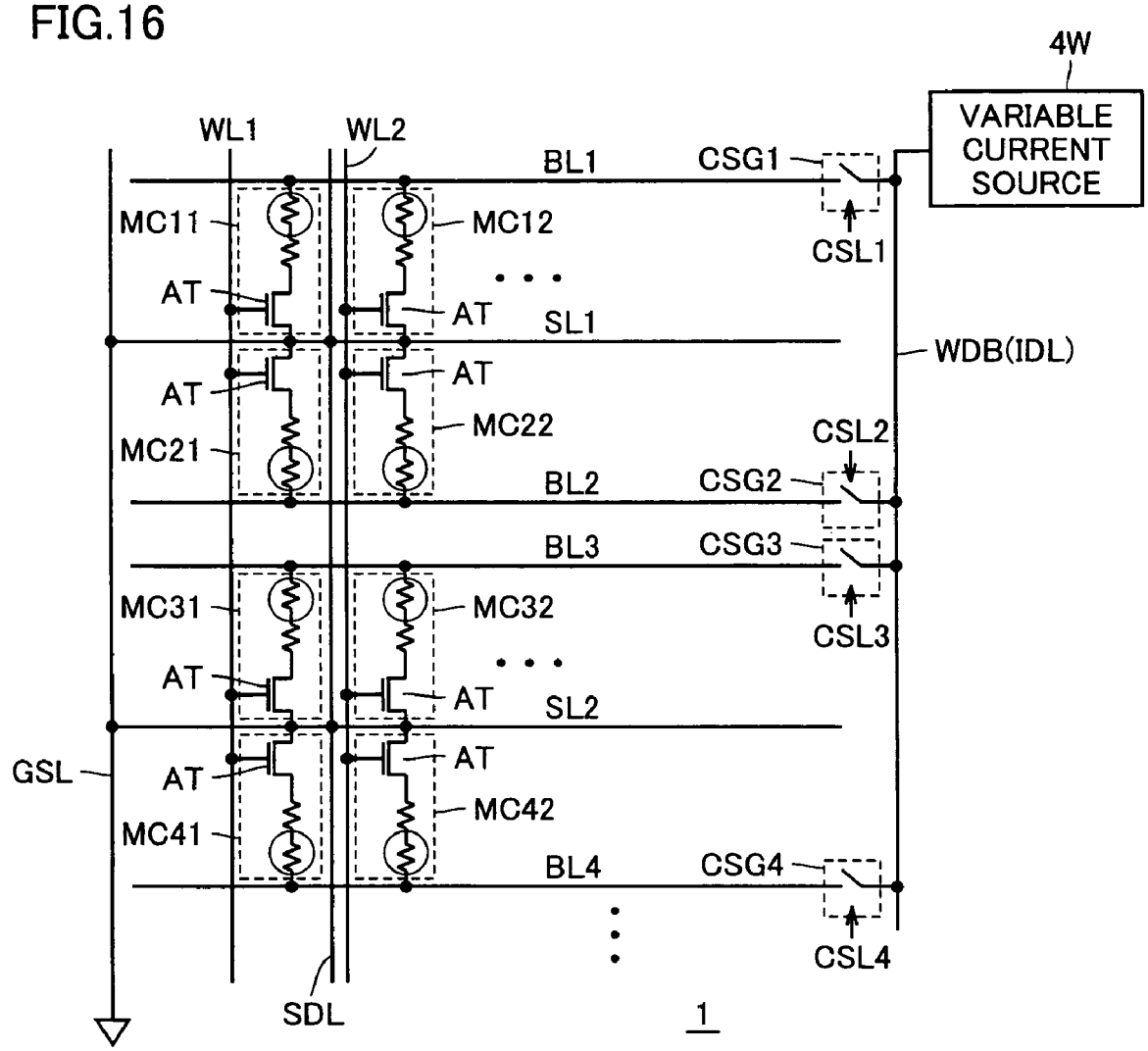
FIG. 16 shows an electrically equivalent circuit of the memory cell arrangement shown in FIG. 15.

FIG. 16 shows an electrically equivalent circuit of the memory cell array having the memory cells laid out as shown in FIG. 15. The memory cell array shown in FIG. 16 differs from the memory cell array shown in FIG. 12 in the following construction. Source impurity region (diffusion source line) SDL is placed parallel to the word line, and is connected to source lines SL (SL1 and SL2) at the crossing thereof. Other constructions of the memory cell array shown in FIG. 16 are the same as those of the memory cell array shown in FIG. 12. Corresponding components are allotted with the same reference numerals or characters, and detailed description thereof is not repeated.

In the following description, basically, the term of source impurity region SDL will be used for describing the structure of memory cell, and the term of the diffusion source line will be used for describing the electrically equivalent circuit.

In the data write operation, when bit line BLa is selected, a current flows from bit line BLa through phase change material element PCE to source line SLa as shown in FIG. 15. The current on source line SLa flows to global source line GSL shown in FIG. 16. In this state, the current flows in the row direction through source impurity region (diffusion source line) SDL as indicated by broken line in FIG. 15. In this state, shunting leakage currents will flow to bit lines BLb, BLc and BLd, respectively. Further, the current flowing through source impurity region (diffusion source line) SDL is shunted and supplied to other source lines such as adjacent source line SLb. Thus, the leakage current flowing to an unselected bit line can be reliably suppressed. Accordingly, the leakage currents flowing to bit lines BLb, BLc and BLd decrease so that the occurrence of the disturbance can be prevented more reliably.

As will be described later, a resistance network of the diffusion source lines and the source lines is formed so that variations in source line potential can be suppressed, and it is possible to suppress variations in source potential of the memory cells, which may occur depending on the position of a memory cell in the memory cell array. The source resistance for the memory cell can be substantially neglected in the write and read operations so that the phase change memory device that operates with a low power supply voltage can be achieved.

Figure 17:
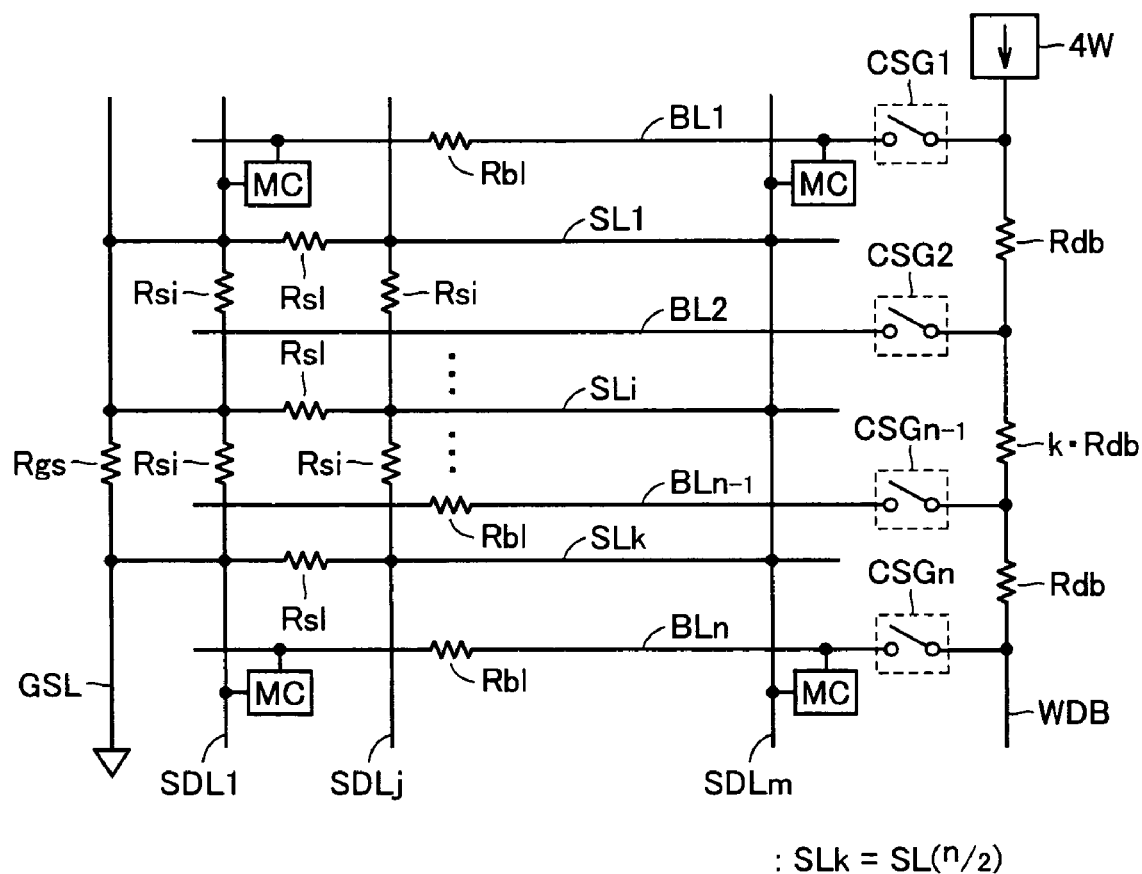
FIG. 17 schematically shows a distribution of resistances in an array of the memory cell arrangement shown in FIG. 15.

FIG. 17 schematically shows a resistance distribution of the bit line, source line and write data line in a first modification of the second embodiment of the invention. In FIG. 17, source line SL1 is arranged parallel to bit lines BL1 and BL2. A source lines SLk (k=n/2) is provided for bit lines BLn-1 and BLn. Source lines SL1, . . . , SLl and SLk are commonly coupled to global source line GSL extending in the row direction.

Bit lines BL1, BL2, . . . , BLn-1 and BLn are coupled to write data line WDB via column select gates CSG1, CSG2, CSGn-1 and CSGn, respectively. Memory cells MC are arranged corresponding to crossings of the bit lines and the source lines, respectively. Source lines SL1, . . . , SLi and SLk are interconnected in the row direction by diffusion source lines SDL1, SDLj, . . . SDLn.

The positional relation between write current source (variable current source) 4W and the ground node of global source line GSL is substantially the same as that in the first embodiment already described.

On bit line BL, there is a resistance distribution based on a unit interconnection resistance Rb1, and a resistance distribution based on a unit interconnection resistance Rsl is likewise present on each of source lines SL (SL1, SLi, . . . SLk). Further, a resistance distribution based on a unit diffusion resistance Rsi is present on each of diffusion source lines SDL (SDL1, SDLj, . . . , SDLn). Likewise, a resistance distribution based on a unit interconnection resistance Rgs is present on global source line GSL. Further, a resistance distribution based on a unit interconnection resistance Rdb is present on write data line WDB. In FIG. 17, it is assumed that an interconnection resistance of (k·Rdb) is present between column select gates CSG2 and CSGn-1.

As can be seen from the resistance distribution shown in FIG. 17, a resistance network is formed with respect to sources of memory cells MC, and memory cells MC each have substantially equal source resistance (resistance over a path to the ground node), so that memory cells MC each in the memory cell array can have substantially the same source potential.

Write data line WDB is supplied with a current from variable current source 4W in data writing. If variable current source 4W is a-low voltage supply, a constant voltage can be supplied across the bit line and source line of a selected memory cell, although the resistance value of the path from variable current source 4W to memory cell MC is varied depending on the resistance distributions of the bit line and write data line WDB. Accordingly, it is possible to suppress changes in write characteristics which may occur depending on the position of the selected memory cell in the memory array. The source line resistance is reduced, and voltage drop on the source line can be substantially neglected. The source line can satisfy the interconnection resistance requirement on the current path in the first embodiment, and the data can be written and read stably with the low power supply voltage.

The resistance network of source lines SL and diffusion source lines SDL disperses and sufficiently suppresses the leakage currents to the unselected memory cells, so that the disturbance of the memory cells on the unselected bit lines can be suppressed in both the write and read operations.

Second Modification

Figure 18:
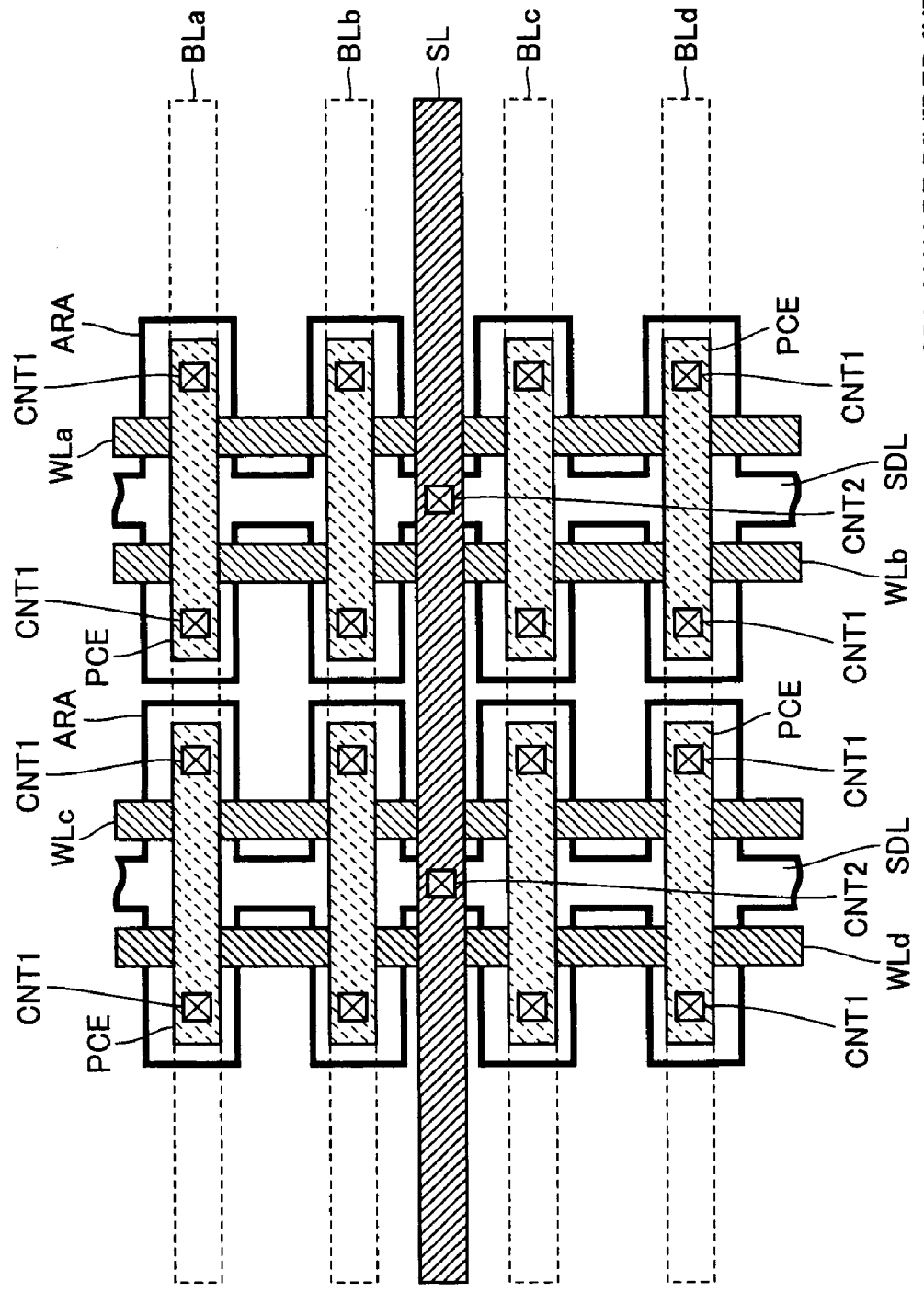
FIG. 18 schematically shows a memory cell arrangement of a second modification of the second embodiment according to the invention.

FIG. 18 schematically shows a layout of memory cells in a second modification of the second embodiment according to the invention. In the layout of the memory cells shown in FIG. 18, one source line SL is arranged commonly for four bit lines BLa, BLb, BLc and BLd. Source line SL is connected via contact CNT2 to source impurity region SDL provided in active region ARA. Source impurity region SDL continuously extends in the row direction similarly to the first modification of the second embodiment already described. Other arrangements in the layout of the memory cells shown in FIG. 18 are the same as those of the layout in FIG. 15. Corresponding portions are allotted with the same reference numerals or characters, and detailed description thereof is not repeated.

Figure 19:
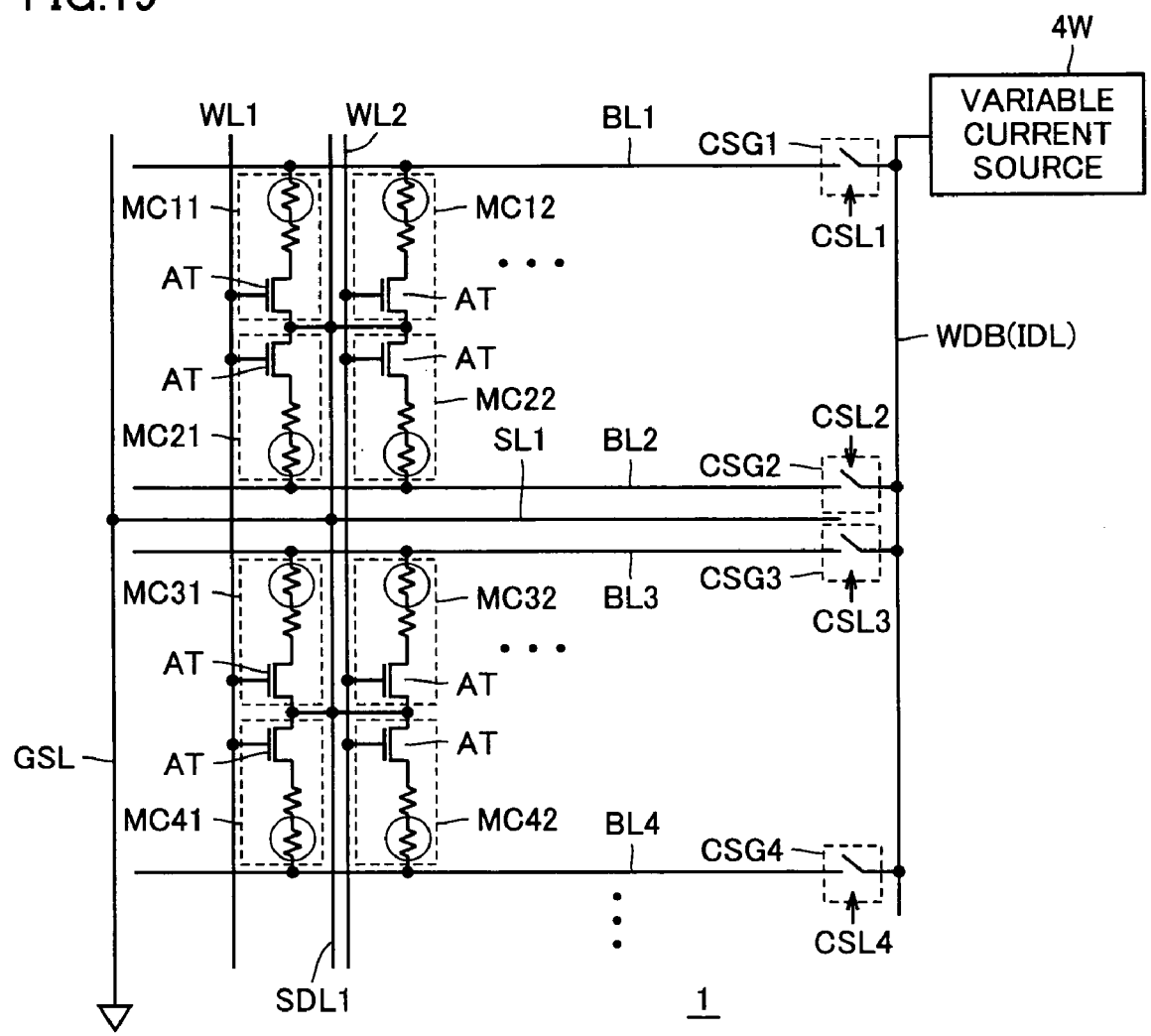
FIG. 19 shows an electrically equivalent circuit of the memory cell arrangement shown in FIG. 18.

FIG. 19 shows an electrically-equivalent circuit of the memory cell array having the layout of memory cells shown in FIG. 18. In FIG. 19, source line SL1 is arranged extending continuously in the column direction, and in parallel and common to bit lines BL1, BL2, BL3 and BL4. Source line SL1 is coupled at its one end to global source line GSL. Source line SL1 is coupled to diffusion source line (source impurity region) SDL1 extending in the row direction. Diffusion source line SDL1 is provided commonly to memory cells MC11, MC12, MC21, MC22, MC31, MC32, MC41 and MC42 arranged in two rows. Other configuration of the circuit shown in FIG. 19 is substantially the same as that of the electrically equivalent circuit shown in FIG. 16. Corresponding portions are allotted with the same reference numerals or characters, and detailed description thereof is not repeated.

As shown in FIGS. 18 and 19, only one source line SL (SL1) is arranged for four bit lines BL, and the pitch requirement of the source line SL can be further relaxed, so that the source lines can be arranged with a margin.

An electrical contact is made between source line SL and diffusion source line SDL (SDL1), and the resistance network of the source line can be formed similarly to the first modification so that the effect similar to that of the first modification can be achieved.

In the layout of memory cells shown in FIG. 18, source impurity region SDL continuously extends in the row direction. However, active region ARA may be provided and isolated for each four bit lines BLa-BLd, and this arrangement may be repeated in the row direction. In this arrangement, the source potential of the memory cell is variable depending on the interconnection resistances of the bit line and source line, but the resistance value of the path for each memory cell routing from the variable current source to the ground node of the global source line can be substantially equal to that for the other memory cells. Similarly to the first embodiment, therefore, writing/reading of the data can be reliably performed.

Third Modification

Figure 20:
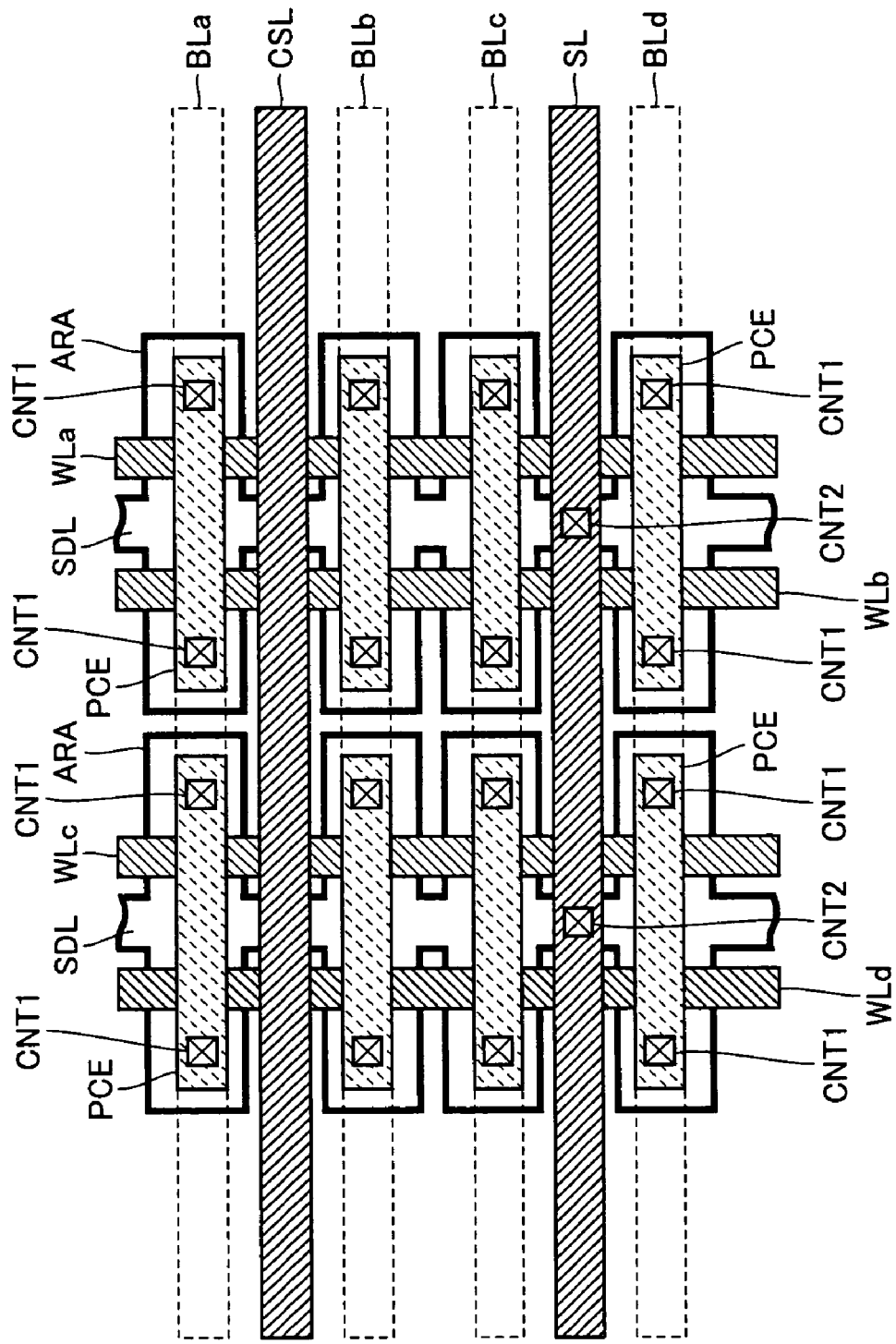
FIG. 20 schematically shows a memory cell arrangement of a third modification of the second embodiment of the invention.

FIG. 20 schematically shows a layout of memory cells in a third modification of the second embodiment of the invention. In the layout shown in FIG. 20, one source line SL is arranged for four bit lines BLa-BLd. The source line SL is arranged between bit lines BLc and BLd. Column select line CSL is arranged between bit lines BLa and BLb. Column select line CSL and source line SL are formed of interconnection lines at the same interconnection layer.

Other arrangements in the layout shown in FIG. 20 are the same as those in the layout of the memory cell shown in FIG. 18. Corresponding portions are allotted with the same reference numerals, and description thereof is not repeated.

Figure 21:
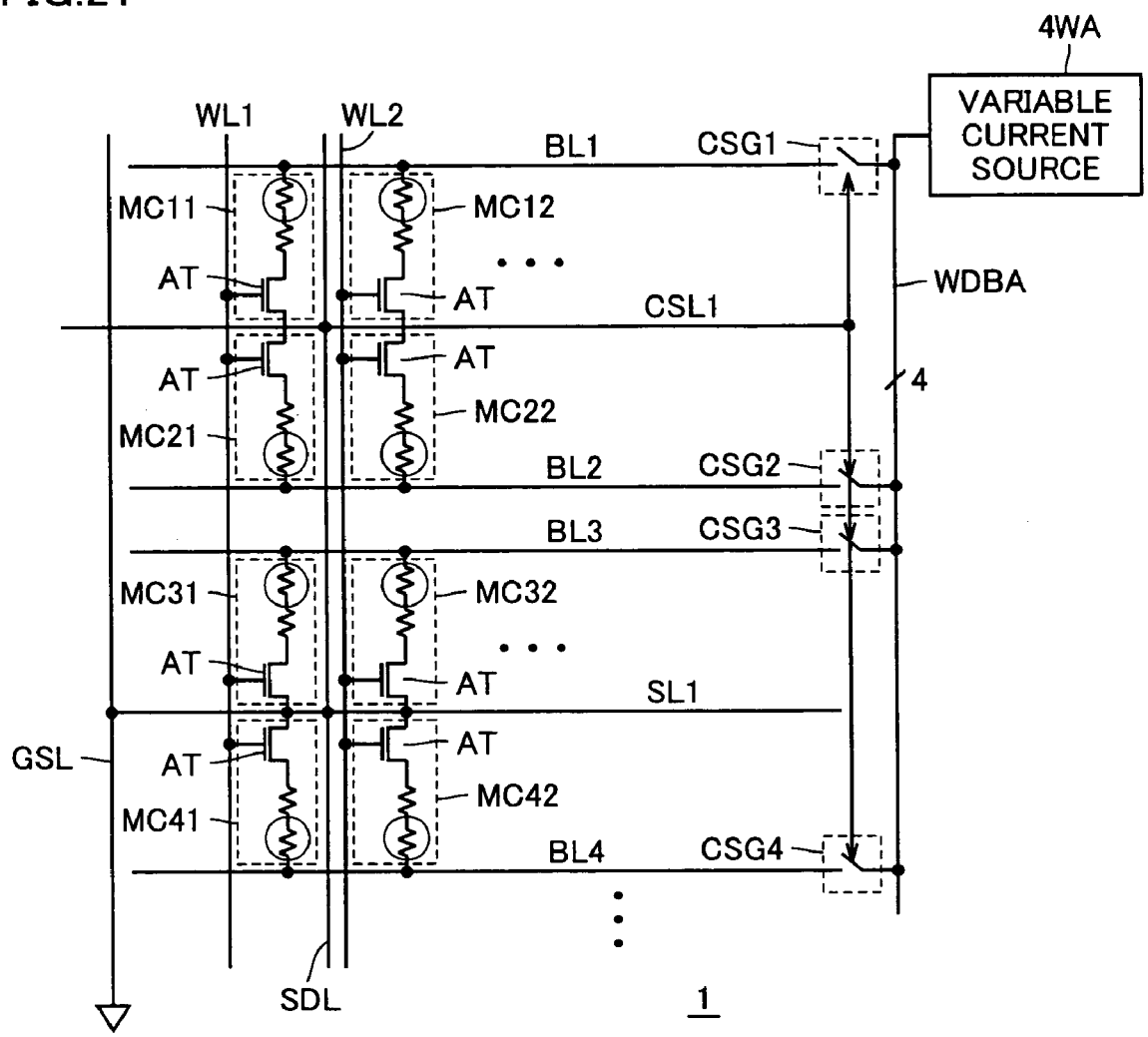
FIG. 21 schematically shows an electrically equivalent circuit in the array of the memory cell arrangement shown in FIG. 20.

FIG. 21 shows an electrically equivalent circuit of the memory cell array having the layout shown in FIG. 20. In FIG. 21, source line SL1 and column select line CSL1 are arranged for bit lines BL1-BL4 in parallel to these bit lines. Column select line CSL1 is arranged between bit lines BL1 and BL2, and source line SL1 is arranged between bit lines BL3 and BL4. Source line SL1 has an end electrically coupled to global source line GSL. Column select line CSL1 transmits the column select signal commonly to column select gates CSG1-CSG4 provided corresponding to bit lines BL1-BL4, respectively. Column select gates CSG1-CSG4 are coupled to write data bus (internal data bus) WDB having a width of 4 bits, and a variable current source 4WA supplies the write current (or read current) to each data bus line in accordance with the four bits of data. The data writing and reading are performed on a four-bit basis.

In the arrangements shown in FIGS. 20 and 21, the column select line and the source line can be formed in the same interconnection layer, and therefore, the interconnection layers can be further reduced in number, and the manufacturing process can be simplified. Further, the other interconnection layer can be used for other interconnection lines than the column select lines, and flexibility in interconnection layout can be improved. Further, the arrangement of source line SL and diffusion source line SDL can achieve the advantageous effect similar to that in the second modification of the second embodiment previously described.

Figure 22:
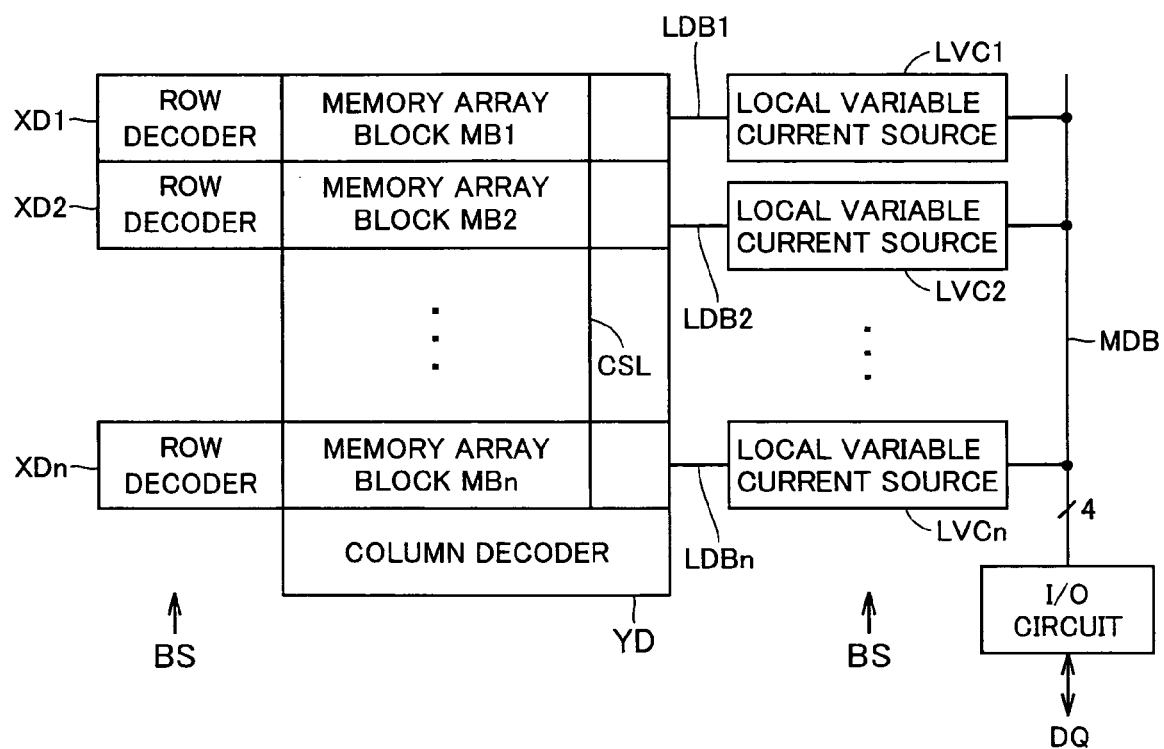
FIG. 22 schematically shows a configuration of a main portion of the semiconductor memory device in the memory cell arrangement according to a third modification of the second embodiment of the invention.

FIG. 22 schematically shows a construction of a main portion of a memory device having the memory cell arrangement of the third modification of the second embodiment according to the invention. In FIG. 22, the nonvolatile semiconductor memory device includes memory array blocks MB1-MBn each having a plurality of memory cells arranged in rows and columns, row decoders XD1-XDn provided corresponding to respective memory array blocks MB1-MBn, local variable current supplies LVC1-LVCn coupled to memory array blocks MB1-MBn via local data buses LDB1-LDBn, respectively, and a column decoder YD arranged commonly to memory array blocks MB1-MBn.

Each of local variable current supplies LVC1-LVCn corresponds to variable current source 4WA shown in FIG. 21. Each of local data buses LDB1-LDBn corresponds to a data bus WDBA shown in FIG. 21. FIG. 22 does not show the column select gates as shown in FIG. 21.

Memory array blocks MB1-MBn has the cell arrangements and circuit constructions shown in FIGS. 20 and 21. Column select lines CSL extend commonly to memory array blocks MB1-MBn from column decoder YD, and transmit the column select signal produced from column decoder YD.

Each of local variable current supplies LVC1-LVCn has a function of writing data of four bits, and the data writing is performed by activating the local variable current source corresponding to the memory array block that is selected according to a block select signal BS.

Likewise, row decoders XD1-XDn are selectively activated according to block select signal BS, to decode an address signal (not shown) for driving the word line on a selected row of the corresponding memory array block to the selected state.

Local variable current supplies LVC1-LVCn are commonly coupled to an input/output circuit IOK via a main data bus MDB. In the data write operation, input/output circuit IOK produces internal data according to external data DQ, and transmits the produced internal data onto main data bus MDB.

In the arrangement in which column select line CSL is arranged commonly to the plurality of memory array blocks MB1-MBn, the interconnection lines formed in the same interconnection layer as the source lines can be used, and thus, the column select lines can be easily arranged commonly to the memory array blocks MB1-MBn without employing an additional interconnection layer.

It has been described that column select line CSL concurrently selects the memory cells of four bits. However, the column select signal line may be configured to have a hierarchical structure of a main column select line and a sub-column select line so that column select line CSL selects the memory cells of four bits, and sub-column select lines select one memory cell (one bit line) among the memory cells of four bits. In this construction, writing and reading of one bit data are performed.

In this third modification, diffusion source line SDL may be isolated for each four bit lines in the row direction. In this structure, the resistance value from the variable current source to the ground node can be substantially uniform independently of the position of a selected memory cell in the array, and the write currents for the respective memory cells can be made equal to each other.

Fourth Modification

Figure 23:
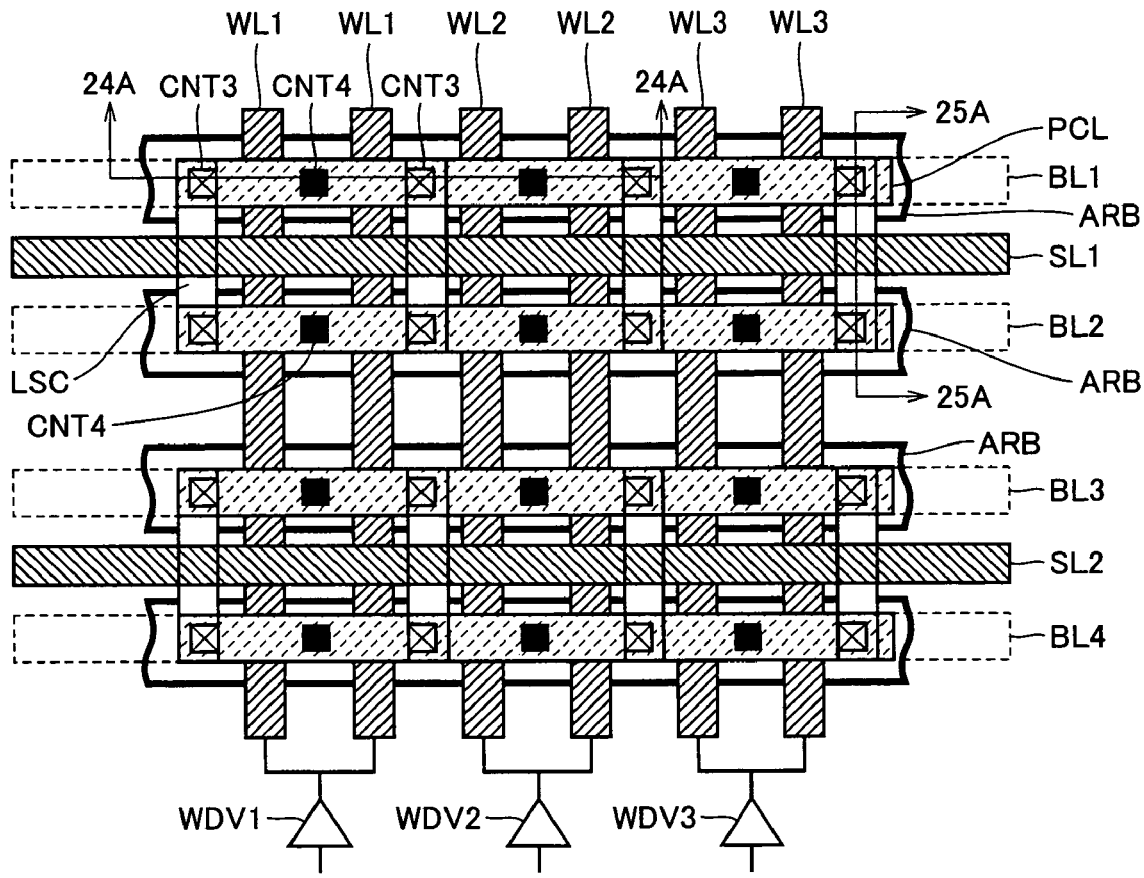
FIG. 23 schematically shows a memory cell arrangement of a fourth modification of the second embodiment according to the invention.

FIG. 23 schematically shows a layout of memory cells in a fourth modification of the second embodiment of the invention. In FIG. 23, active regions ARB are formed continuously extending in the column direction and in parallel to bit lines BL (BL1-BL4). Phase change layers PCL made of a phase change material are formed parallel to active regions ARB. FIG. 23 shows phase change layer PCL continuously extending in the column direction similarly to the bit line BL. However, phase change layer PCL may be divided in the column direction for each predetermined number of memory cells. Phase change layer PCL is coupled to corresponding bit line BL (BL1-BL4) via contact CNT4.

Source line SL is arranged for two bit lines. In FIG. 23, source line SL1 is arranged continuously extending in parallel to bit lines BL1 and BL2, and source line SL2 is arranged for bit lines BL3 and BL4, extending continuously in the column direction.

A local source connection line LSC is arranged for the memory cells that are connected to the bit lines sharing a source line SL. Local source connection line LSC connects a source impurity region of the corresponding active region to the corresponding source line SL. Local source connection line LSC is electrically connected to the corresponding active region via contact CNT3. Source line SL and local source connection line LSC may be formed in the same interconnection layer or in different interconnection layers, respectively. FIG. 23 shows, by way of example, a structure in which source line SL and local source connection line LSC are formed in the same interconnection layer.

The gate interconnection line (gate line) forming the word line is arranged, between contacts CNT3 and CNT4, extending continuously in the row direction. The gate interconnection lines arranged on the opposite sides, in the column direction, of contact CNT4 are driven to the selected or unselected state concurrently with each other, and form a common word line. FIG. 23 shows a set of word lines WL1, WL2 and WL3. Word line drivers WDV1, WVD2 and WDV3 drive word lines WL1, WL2 and WL3 to the selected state, respectively.

Since active region ARB extends continuously in the column direction similarly to bit line BL, isolation insulating films between the active regions are merely required to be arranged extending in the row direction only for the columns. Accordingly, patterning of active region ARB can be made easy, and a region for isolating the memory cells in the column direction is not necessary, and therefore, the memory cells can be arranged at high density.

Figure 24:
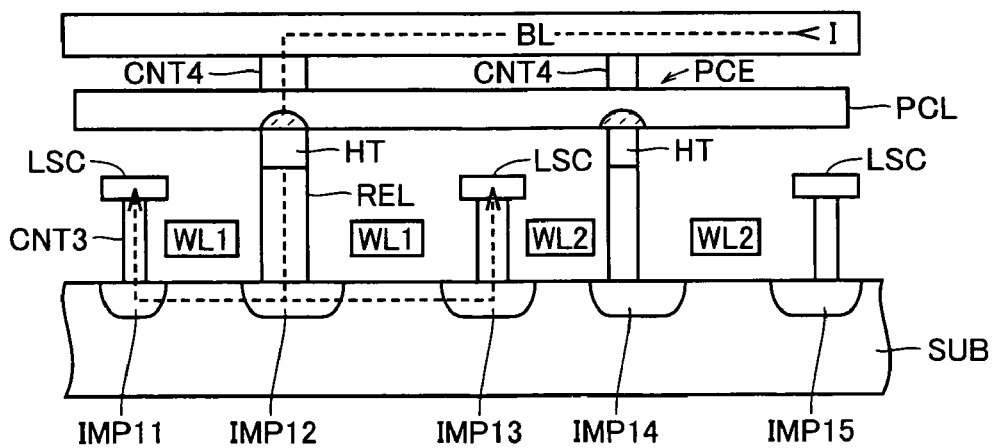
FIG. 24 schematically shows a sectional structure taken along line 24A-24A in FIG. 23.

FIG. 24 schematically shows a sectional structure taken along line 24A-24A in FIG. 23. In FIG. 24, impurity regions INP11, INP12, INP13, INP14 and INP15 included in the same active region are formed being spaced apart at the surface of semiconductor substrate region SUB. Impurity regions INP11, NP13 and INP15 are coupled to local source connection lines LSC via corresponding source contacts CNT3, respectively. Impurity regions INP12 and INP14 are coupled to heater layers HT via resistive electrode layers (plug layers) REL. Heater layer HT is coupled to phase change layer PCL. Phase change layer PCL is highly resistive, and the phase change occurs only at a region near heater layer HT. Thus, even if phase change layer PCL is arranged continuously and commonly to the plurality of memory cells, no adverse effect is exerted on the memory operation (writing, reading and storing of data). This is equivalent to the structure in which phase change material element PCE is arranged near heater layer HT individually.

Phase change layer PCL is coupled to a corresponding bit line BL via bit line contacts CNT4 arranged above heater layers HT.

The gate interconnection line between impurity regions INP11 and INP12 as well as the gate interconnection line between impurity regions INP12 and INP13 form word line WL1, and the gate interconnection line between impurity regions INP13 and INP14 and the gate interconnection line between impurity regions INP14 and INP15 form word line WL2.

In the structure shown in FIG. 24, therefore, when bit line BL conducts a current and word line WL1, for example, is selected, a current flows from phase change material element PCE to impurity region INP12, and further the current flows to impurity regions INP11 and INP13. Therefore, this structure is equivalent to the construction in which two access transistors are connected in parallel to one phase change material element, and the channel width of the access transistor becomes equivalently as large as twice, so that a large current can be supplied to perform fast writing and reading.

Figure 25:
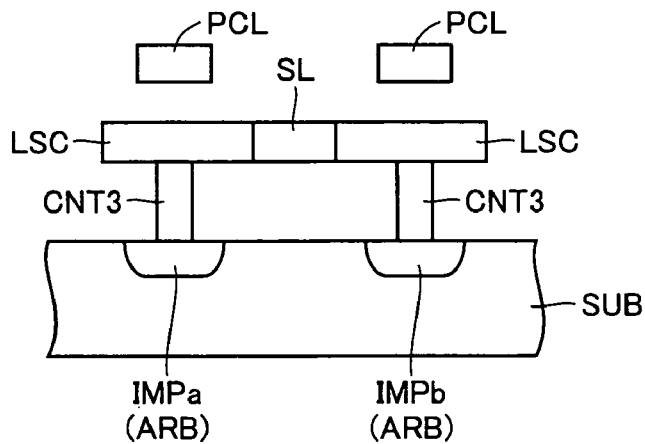
FIG. 25 schematically shows a sectional structure taken along line 25A-25A in FIG. 23.

FIG. 25 is a cross section taken along line 25A-25A shown in FIG. 23. In FIG. 25, impurity regions INPa and INPb are arranged at the surface of semiconductor substrate region SUB. These impurity regions INPa and INPb are regions within active regions ARB arranged corresponding to the bit lines adjacent to each other. These impurity regions INPa and INPb are coupled to local source connection line LSC via contacts CNT3, respectively. Local source connection line LSC extends in the row direction, and is coupled to source line SL extending continuously in the column direction. Phase change layers PCL are arranged being aligned to impurity regions IMPa and IMPb above source line SCL and local source connection lines LSC.

By forming local source connection line LSC and source line SL in the same interconnection layer, the source line can be arranged commonly for the memory cells on a plurality of columns without employing an additional interconnection layer even if active region ARB is formed in a band-like form extending in the column direction.

However, local source connection line LSC and source line. SL may be formed in different interconnection layers, respectively.

Figure 26:
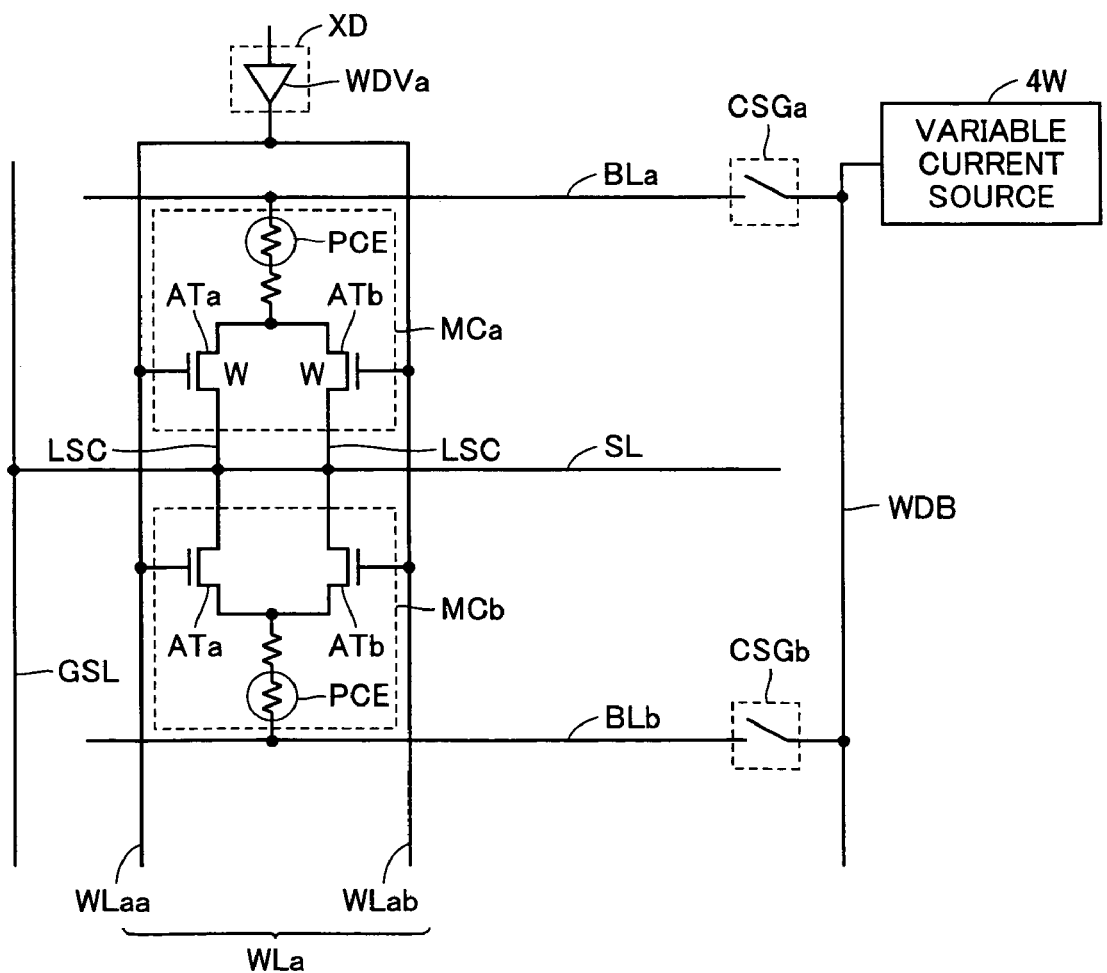
FIG. 26 shows an electrically equivalent circuit of the memory cell arrangement shown in FIG. 23.

FIG. 26 shows an electrically equivalent circuit of the memory cell array having the arrangement of memory cells shown in FIG. 23. FIG. 26 representatively shows memory cells MCa and MCb arranged corresponding to the crossings between word line WLa and bit lines BLa and BLb, respectively. Memory cell MCa includes phase change material element PCE coupled to bit line BLa, and access transistors ATa and ATb arranged in parallel and connected to phase change material element PCE. One conduction node (source node) of each of access transistors ATa and ATb is coupled to source line SL via local source connection line LSC. One local source connection line LSC connects the source nodes of access transistors of the memory cells in the different columns to the corresponding source line SL.

Access transistors ATa and ATb have control gates connected to gate lines WLaa and WLab spaced from each other, respectively. Gate lines WLaa and WLab are commonly driven by a word line driver WDVa included in row decoder XD, and serves as word line WLa.

Memory cell MCb has substantially the same structure, and includes one phase change material element and two parallel access transistors.

Bit lines BLa and BLb are coupled to write data line WDB via column select gates CSGa and CSGb. Write data line WDB is coupled to variable current source 4W, and source line SL is coupled to global source line GSL.

As is apparent from the electrically equivalent circuit shown in FIG. 26, one source line SL is arranged for two bit lines, so that the source lines can be reduced in number. Further, the distance from variable current source 4W to the ground node of the global source line can be substantially constant independently of the position of a selected memory cell in the array.

Since access transistors ATa and ATb are turned on concurrently, channel widths W of access transistors ATa and ATb are added in parallel, to provide equivalently the structure in which one access transistor having a channel width of 2×W is connected, and thus a large current can flow from variable current source 4W to achieve fast writing and reading.

Fifth Modification

Figure 27:
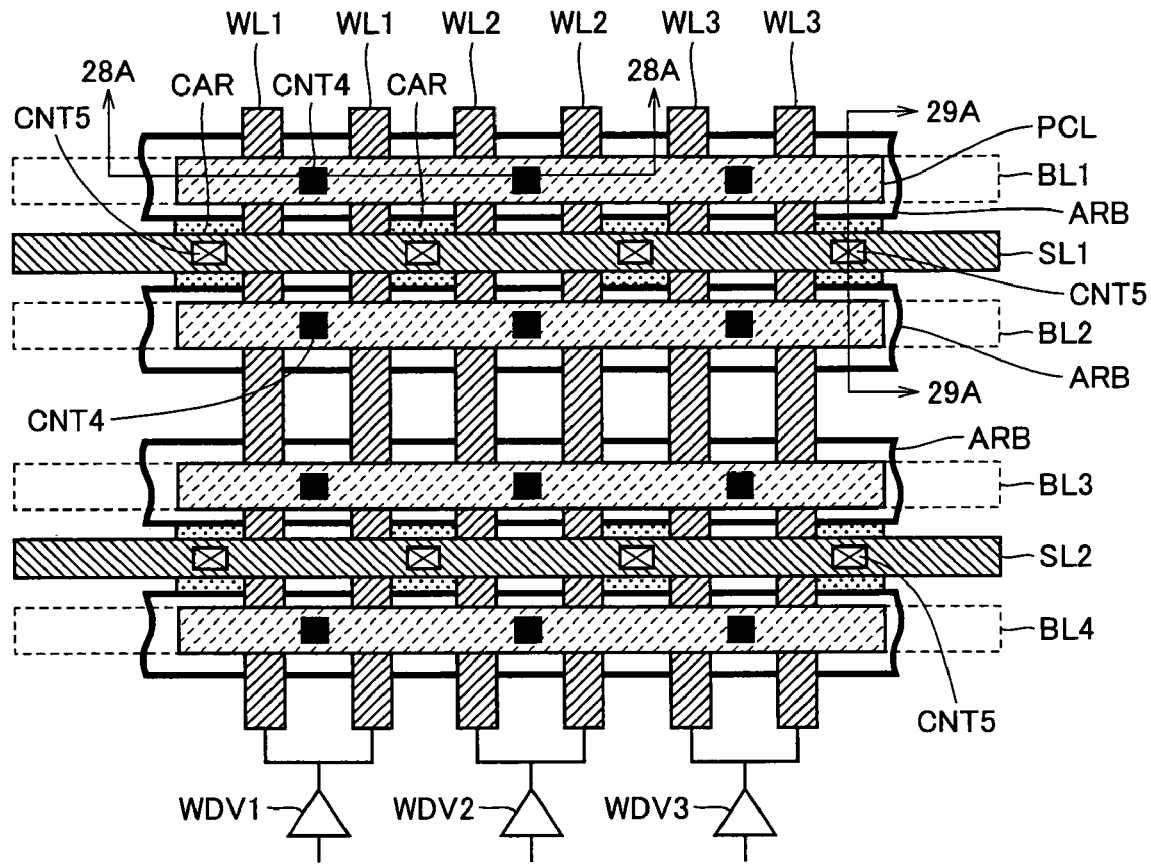
FIG. 27 schematically shows a memory cell arrangement of a fifth modification of the second embodiment of the invention.

FIG. 27 schematically shows a layout of memory cells according to a modification of the second embodiment according to the invention. In FIG. 27, active regions ARB are arranged in parallel to bit lines BL (BL1-BL4) and continuously extending in a band-like form similarly to the fourth modification described above. Phase change layers PCL are formed parallel to bit lines BL, each being connected to corresponding bit line via contacts CNT4 provided for each two gate interconnection lines (the same word line). Also, phase change layer PCL is electrically connected to active region ARB located below at the regions where contacts CNT4 are formed.

Source lines SL (SL1 and SL2) are arranged parallel to bit lines BL. Active regions ARB-(source impurity regions) corresponding to the two memory cells are mutually coupled by concatenating active regions CAR which are formed for the source impurity regions every two gate lines. Each source line SL (SL1 or SL2) is electrically connected to concatenating active regions CAR via contacts CNT5. Other arrangements in the layout of the memory cells shown in FIG. 27 are the same as those shown in FIG. 23. Corresponding portions are allotted with the same reference numerals or characters, and description thereof is not repeated.

In the layout of the memory cells according to the fifth modification, concatenating active regions CAR are employed instead of local source connection lines LSC formed of the metal interconnection lines, and this concatenating active region connect the memory cells in two columns to the common source line.

Figure 28:
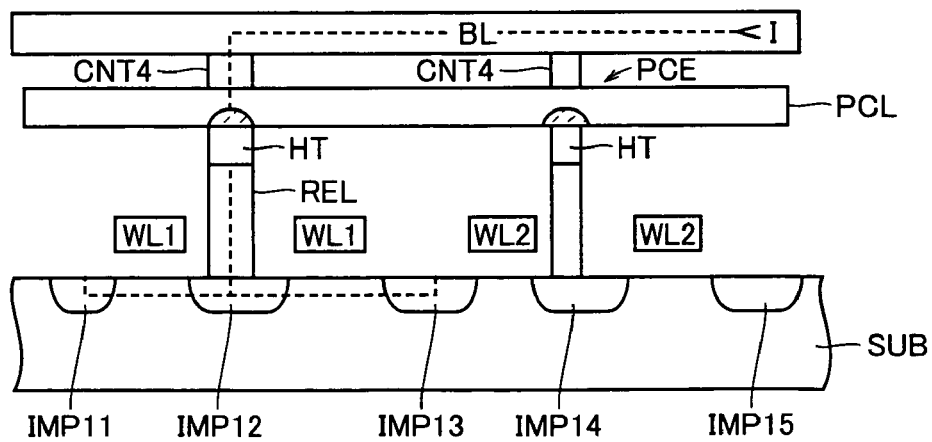
FIG. 28 schematically shows a sectional structure taken along line 28A-28A in FIG. 27.

FIG. 28 schematically shows a sectional structure taken along line 28A-28A shown in FIG. 27. In FIG. 28, impurity regions IMP11-IMP15 are formed being spaced from each other at the surface of semiconductor substrate region SUB, in a common active region ARB. The gate interconnection lines forming the word lines are arranged above the substrate region surface between impurity regions IMP11-IMP15. Impurity regions IMP12 and IMP14 are coupled to phase change layer PCL via resistive electrode layer REL and heater layer HT. Contact CNT4 is arranged corresponding to heater layer HT, and phase change material element PC is connected to corresponding bit line BL (BL1). The gate interconnection lines on the opposite sides of low-resistance electrode layer REL form a common word line and, in FIG. 28, word lines WL1 and WL2 are each formed of two gate interconnection lines. Impurity regions IMP11 and IMP13 are separated from each other because the concatenating active region is not formed along the direction of bit line BL.

When word line WL1 is selected, for example, the current flows from bit line BL to impurity region IMP12 via contact CNT4 as shown in FIG. 28, and further the current flows via a channel region (not shown) to impurity regions IMP11 and IMP13.

Figure 29:
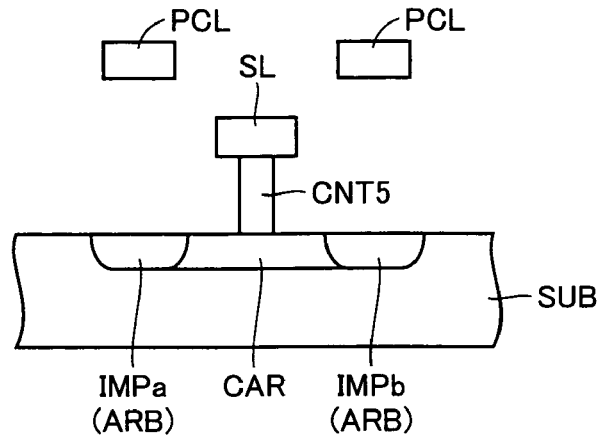
FIG. 29 schematically shows a sectional structure taken along line 29A-29A in FIG. 27.

FIG. 29 schematically shows a sectional structure taken along line 29A-29A in FIG. 27. In FIG. 29, impurity regions INPa and INPb are formed on semiconductor substrate region SUB. Impurity regions INPa and INPb are included in the active regions (ARB) provided for the memory cells connected to different bit lines. Concatenating active region CAR is formed between these impurity regions INPa and INPb, and electrically couples them with each other. Contact CNT5 is formed at concatenating active region CAR, and source line SL is coupled via concatenating active region CAR to impurity regions INPa and INPb.

Phase change layers PCL corresponding to the respective columns are arranged at a layer higher than source line SL.

Therefore, the structure of the fifth modification differs from the structure of the fourth modification in that concatenating active regions CAR are employed instead of the local source connecting lines (LSC), and can achieve the similar effect. The electrically equivalent circuit of the memory cell is the same in structure as that shown in FIG. 26. Concatenating active region CAR can be formed in a self-aligned manner with respect to the word line concurrently in the step of implanting impurities into source/drain impurity regions (impurity regions INPa and INPb).

Sixth Modification

Figure 30:
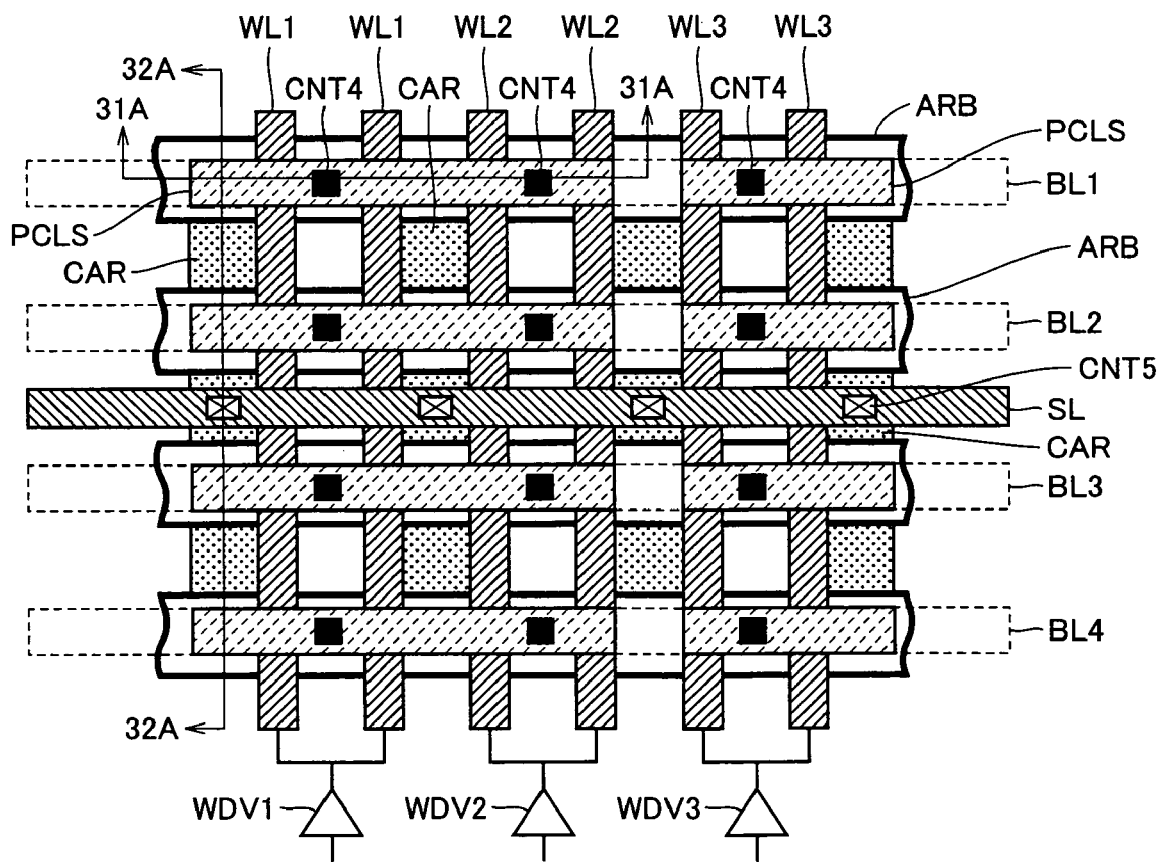
FIG. 30 schematically shows a memory cell arrangement of a sixth modification of the second embodiment according to the invention.

FIG. 30 schematically shows a planar layout of a memory cell layout in a sixth modification of the second embodiment of the invention. In the layout shown in FIG. 30, active regions ARB are likewise formed parallel to bit lines BL (BL1-BL3) in a band-like form. Divided phase change layers PCLS are formed extending in the column direction and separated from each other for each predetermined number (four in FIG. 30) of gate interconnection lines. Divided phase change layer PCLS is electrically coupled to corresponding active region ARB via contact CNT4 between the gate interconnection lines forming a common word line.

In the region outside the gate interconnections forming the same word line, concatenating active region CAR is formed to couple electrically the active regions ARB (source impurity regions). In FIG. 30, concatenating active region CAR mutually connects the active regions (source impurity regions) provided for four bit lines BL1-BL4.

One source line SL is provided for these four bit lines BL1-BL4. Source line SL is arranged parallel to the bit lines, and is electrically coupled, at each row, to concatenating active region CAR via contact CNT5. In FIG. 30, source line SL is arranged between bit lines BL2 and BL3.

Other structures in the planar layout shown in FIG. 30 are the same as those in the planar layout shown in FIG. 27. Corresponding portions are allotted with the same reference numerals or characters, and description thereof is not repeated.

Figure 31:
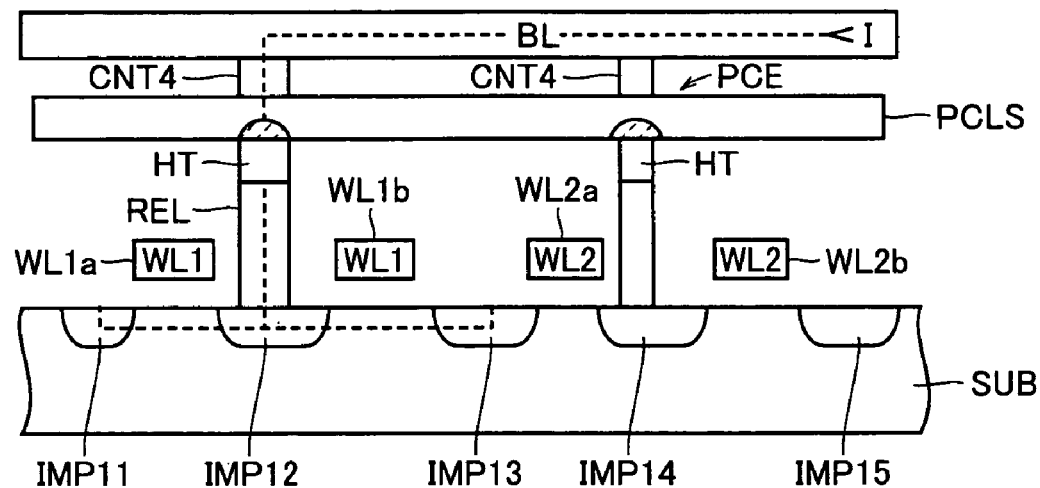
FIG. 31 schematically shows a sectional structure taken along line 31A-31A in FIG. 30.

FIG. 31 schematically shows a sectional structure taken along line 31A-31A shown in FIG. 30. In FIG. 31, impurity regions IMP11-IMP15 included in the same active region are formed at the surface of the semiconductor substrate region SUB, spaced from each other, and gate interconnection lines WL1a, WL1b, WL2a and WL2b forming word lines WL are arranged between impurity regions IMP11-IMP15 above the substrate SUB. Gate interconnection lines WL1a and WL1b serves as a word line WL1, and gate interconnection lines WL2a and WL2b serves as a word line WL2.

Impurity regions IMP12 and IMP14 are coupled to heater layers HT via low-resistance electrode layers REL, respectively. Heater layer HT is coupled to divided phase change layer PCLS, which in turn is coupled to bit line BL via contact CNP4. Divided phase change layer PCLS neighboring heater layer HT forms phase change material element PCE.

The sectional structure of the memory cells shown in FIG. 31 is the same as that of the memory cells shown in FIG. 28 except for that phase change layer PCL (PCLS) does not extend in parallel to bit line BL continuously in the column direction, but is divided into portions for each predetermined number of memory cells (two bits of memory cells). By dividing the phase change layer into portions for each predetermined number of gate interconnection lines, it is possible to reduce an area of portions where the phase change layers overlap the bit lines so that the parasitic capacitances between interconnection lines are reduced, and accordingly, the bit line parasitic capacitances are reduced.

Figure 32:
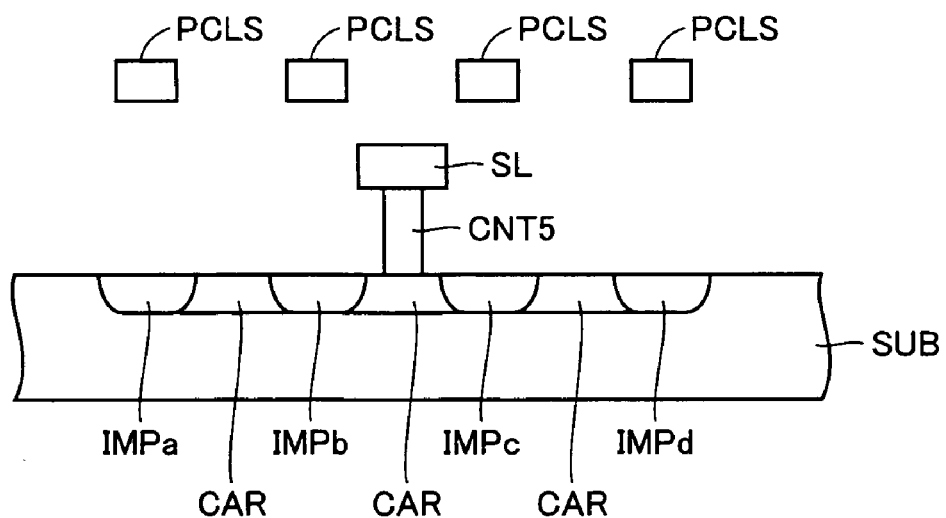
FIG. 32 schematically shows a sectional structure taken along line 32A-32A in FIG. 30.

FIG. 32 schematically shows a sectional structure taken along line 32A-32A shown in FIG. 30. In FIG. 32, impurity regions IMPa-IMPd included in different active regions are arranged being spaced at the surface of semiconductor substrate region SUB. Concatenating active regions CAR are arranged between impurity regions IMPa-IMPd, and electrically couple them with each other.

Concatenating active region CAR between impurity regions IMPb and IMPc is coupled to source line SL via contact CNT5. Divided phase change layers PCLS are arranged corresponding to respective impurity regions IMPa-IMPd at a layer above source line SL.

Figure 33:
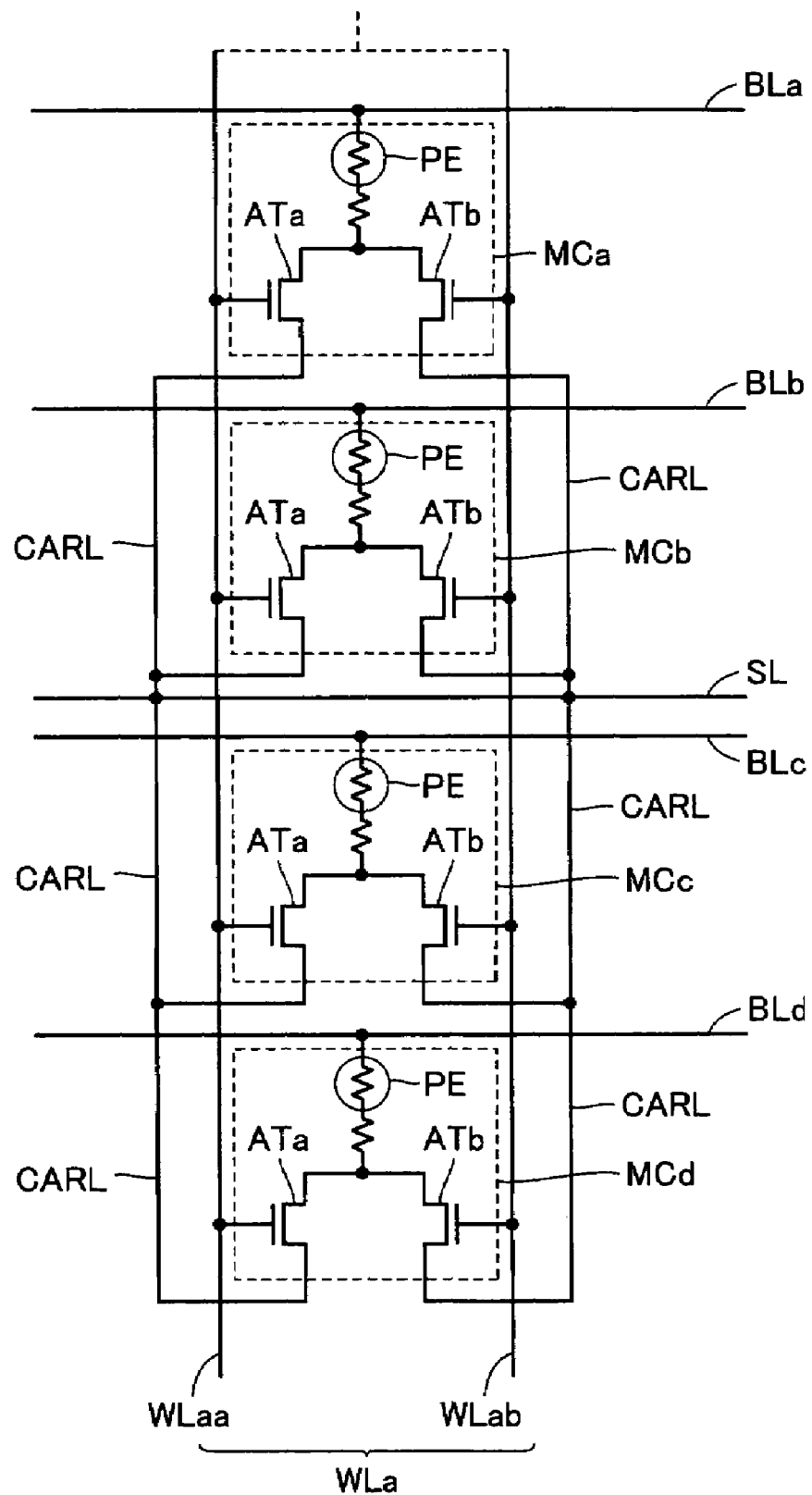
FIG. 33 shows an electrically equivalent circuit of the memory cell arrangement shown in FIG. 30.

FIG. 33 shows an electrically equivalent circuit of the memory cells in the layout of the sixth modification of the second embodiment according to the invention. FIG. 33 shows the electrically equivalent circuit of the memory cells of four bits aligned in the row direction. Bit lines BLa, BLb, BLc and BLd are connected to memory cells MCa, MCb, MCc and MCd, respectively. Each of memory cells MCa-MCd includes a phase change element PE and access transistors ATa and ATb which are made conductive according to the signals on gate interconnection lines WLaa and WLab, respectively. Source regions of access transistors ATa in memory cells MCa-MCd are coupled by a diffusion concatenating line CARL corresponding to the concatenating active region, and source regions of access transistors ATb in memory cells MCa-MCd are coupled diffusion concatenating line CARL. These diffusion concatenating interconnections CARL are coupled to source line SL, which in turn is arranged commonly to the four bits of memory cells aligned in the column direction. Both gate interconnection lines WLaa and WLb serve as word line WLa and are driven at ends, shown by broken line in FIG. 33, by a common word line driver (or different word line drivers selected by the same address signal).

According to the construction of the sixth modification, one source line SL is provided for four bit lines, and the requirement on the pitch of source lines can be further mitigated. In the structure in which concatenating active region CAR (diffusion coupling line CARL) mutually connects the memory cells of four bits, a current path from the variable current source to the ground node of the global source line can have the resistance value substantially equal for each current path.

For preventing variations in source potential of each memory cell, concatenating diffusion region CAR may be arranged extending in the row direction between the bit lines in each pair, to form the diffusion source line continuously extending in the row direction.

The phase change layer may be formed extending continuously in the column direction.

Seventh Modification

Figure 34:
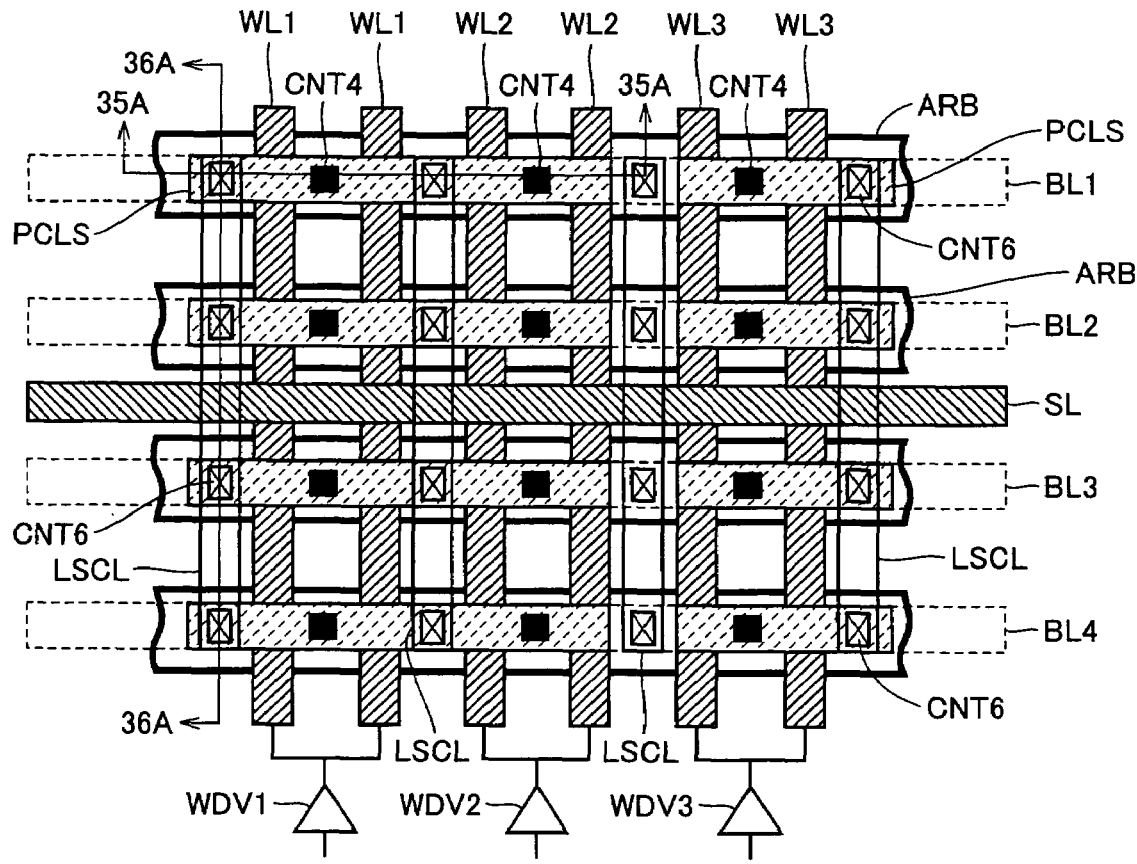
FIG. 34 schematically shows a memory cell arrangement of a seventh modification of the second embodiment according to the invention.

FIG. 34 schematically shows a planar layout of the memory cell array portion of a seventh modification of the second embodiment according to the invention. In the layout shown in FIG. 34, no concatenating active region is provided, and alternatively, a local source connection line LSCL is provided. Local source connection line LSCL extends in the row direction over a length corresponding to four columns, and is coupled via contacts CNT6 to active regions ARB of the memory cells in these four columns. Local source line LSCL is arranged outside the pair of gate lines forming a common word line, and therefore contacts CNT6 are arranged alternately in the column direction with respect to contacts CNT4 provided for divided phase change layers PCLS.

Other structures in the planar layout of the memory cell array shown in FIG. 34 are the same as those in the plane layout shown in FIG. 30. Corresponding portions are allotted with the same reference numerals or characters, and description thereof is not repeated.

Figure 35:
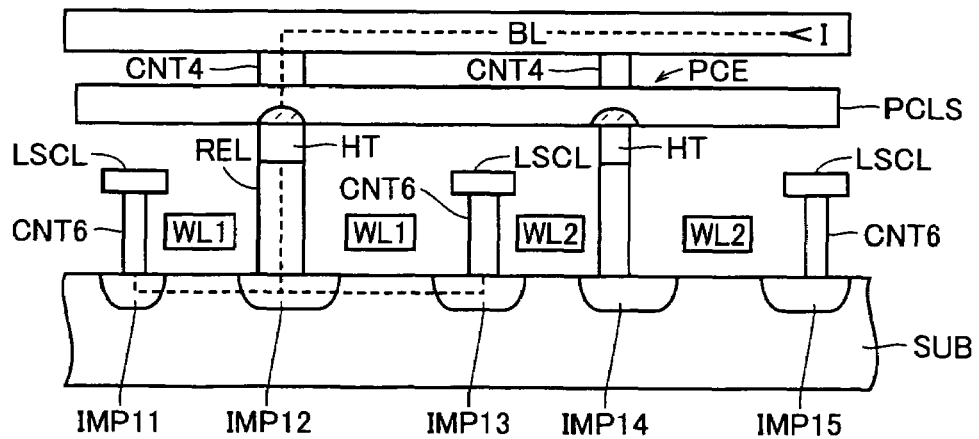
FIG. 35 schematically shows a sectional structure taken along line 35A-35A in FIG. 34.

FIG. 35 schematically shows a sectional structure taken along line 35A-35A in FIG. 34. In FIG. 35, impurity regions INP11-INP15 are formed at distances at the surface of the semiconductor substrate region. These impurity regions INP11-INP15 are included in a common active region ARB. Impurity regions INP11, INP13 and INP15 are coupled to local source connection line LSCL via contacts CNT6, respectively, and impurity regions INP12 and INP14 are coupled to heater layers HT via plugs REC, respectively. Divided phase change layer PCLS is coupled to bit line BL (BL1) via contacts CNT4 provided corresponding to heater layers HT.

In the column direction, therefore, local source connection lines LSCL and low-resistance electrode layers REC are arranged alternately. Two gate interconnection lines form a common word line. FIG. 35 shows word lines WL1 and WL2, as a representative.

In the structure of the seventh modification, therefore, two access transistors in the memory cell are connected in parallel, and the width of the current path between the phase change material element and the source line can be increased (the channel width of the access transistor can be increased), so that the a large current can flow in the memory cell even when it has a miniaturized cell size.

Figure 36:
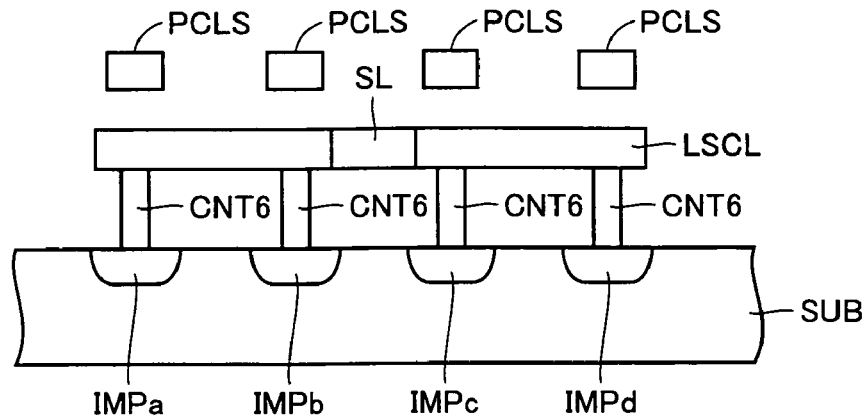
FIG. 36 schematically shows a sectional structure taken along line 36A-36A in FIG. 34.

FIG. 36 schematically shows a sectional structure taken along line 36A-36A in FIG. 34. Impurity regions INPa-INPd are formed at the surface of semiconductor substrate region SUB being spaced from each other. These impurity regions INPa-INPd are included in the active regions on different columns, respectively. Local source connection line LSCL is formed at the same layer as source line SL, as an example. One local source connection line LSCL is provided for the four bits of memory cells aligned in the row direction. Local source connection line LSCL is electrically coupled to impurity regions IMPa-IMPd via contacts CNT6, respectively. Divided phase change layers PCLS are arranged above local source connection lines LSCL and source line SL, being aligned to impurity regions IMPa-IMPd, respectively.

In the structure of this seventh modification, therefore, one source line SL is arranged for the memory cells in four columns, which mitigates the interconnection pitch requirement of the source lines. Further, each current path from the variable current source to the ground node of the global source line can be substantially equal to the other current paths in the same memory cell array independently of the position of a selected memory cell, and therefore, accurate writing can be performed.

In the seventh modification may, such a construction may be employed that local source connection line LSCL is formed continuously extending in the row direction to connect the active regions in all the columns to each other, for configuring the source lines into a meshed-shape form. Rising of the source potentials of the memory cells can be suppressed.

The electrically equivalent circuit of the memory cell is the same as that of the structure employing the concatenating active region shown in FIG. 33, and local source connection line LSCL, instead of concatenating active region CARL, mutually connects the access transistors of the four bits.

Although the interconnection parasitic capacitances between the bit lines can be reduced by utilizing the divided phase change layer, the phase change layer may be formed extending continuously in the column direction.

Eighth Modification

Figure 37:
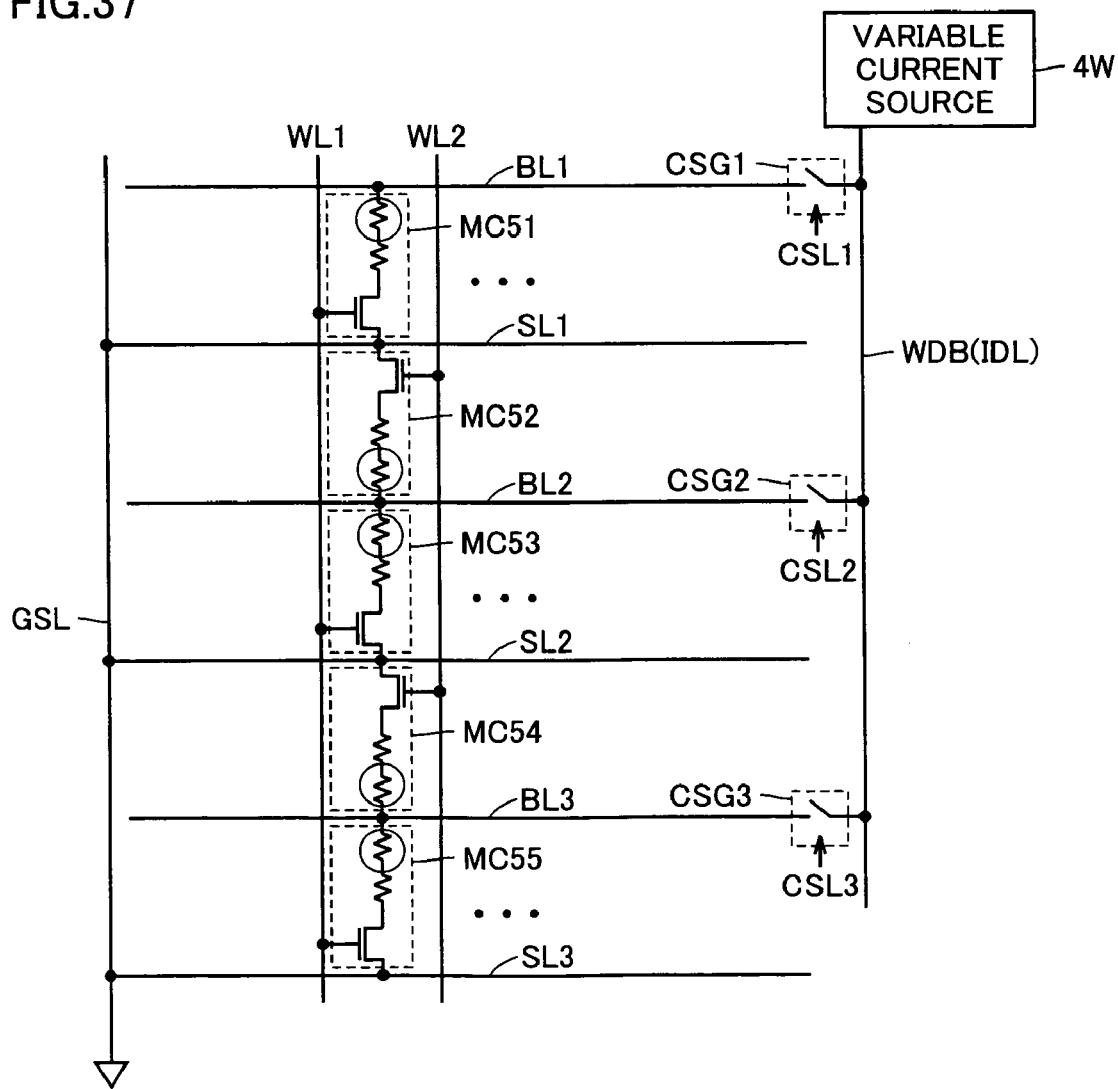
FIG. 37 schematically shows a memory cell arrangement of an eighth modification of the second embodiment according to the invention.

FIG. 37 schematically shows a construction of an eighth modification of the arrangement of memory cells in the second embodiment according to the invention. In FIG. 37, memory cells MC51-MC55 are aligned in the row direction (in the word line extending direction). These memory cells MC51-MC55 share the bit lines or the source lines. Thus, memory cells MC51 and MC52 share source line SL1, and memory cells MC52 and MC53 share bit line BL2. Memory cells MC53 and MC54 share source line SL2, and memory cells MC54 and MC55 share bit line BL3.

Bit lines BL1-BL3 are coupled to write data line WDB (internal data line IDL) via column select gates CSG1-CSG3 which are selectively turned on in response to column select signals SCL1-CSL3, respectively. Variable current source 4W is connected to write data line WDB. Source lines SL1-SL3 are commonly connected to global source line GSL.

The positional relation between variable current source 4W and the ground node of the global source line as well as the relation in resistance value between the bit line, source line, internal write data line and global source line are the same as those of the structure shown in FIG. 12.

In the memory cell arrangement shown in FIG. 37, the phase change material elements share the bit line, so that the size of the memory cell can be further reduced. Since the source line and the bit line are each shared between the memory cells in the adjacent columns, the memory cells in the adjacent columns are connected to different word lines WL1 and word line WL2. More specifically, memory cells MC51, MC53 and MC55 are connected to word line WL1, and memory cells MC52 and MC54 are connected to word line WL2.

The structure shown in FIG. 37 can provide the effect similar to that of the structure shown in FIG. 12. In addition, the contact of the phase change material element can be shared, and accordingly, the occupation areas of the cells can be reduced. Further, the phase change material element can be shared between the adjacent cells such that the phase change material element can extend over the two-bit cells, and this structure mitigates restrictions on the working component sizes.

Figure 38:
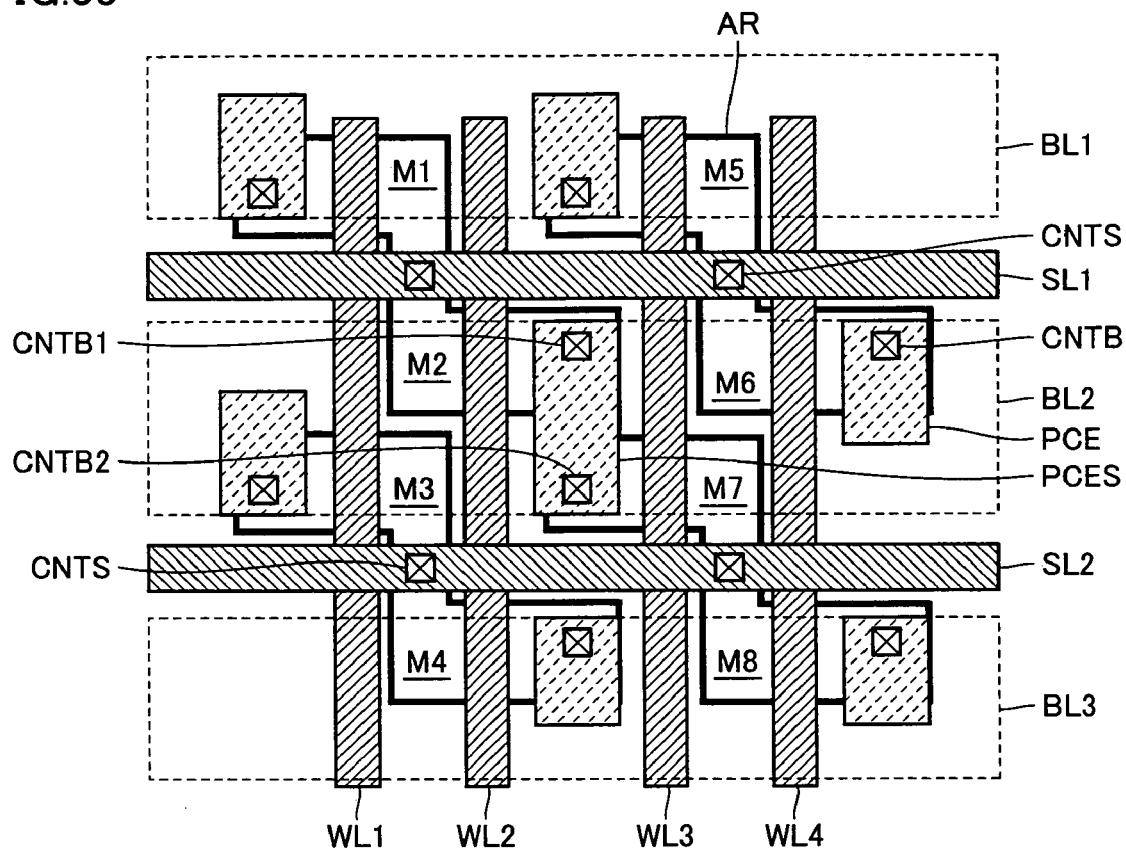
FIG. 38 schematically shows a planar layout of the memory cell arrangement shown in FIG. 37.

FIG. 38 schematically shows a planar layout of the memory cell array shown in FIG. 37. Referring to FIG. 38, bit lines BL1-BL3 are formed of second metal interconnection lines, respectively, and source lines SL1 and SL2 are arranged in parallel to and between bit lines BL1-BL3. Word lines WL1-WL4 made of polycrystalline silicon are arranged in the direction crossing bit lines BL1-BL3 and source lines SL1 and SL2.

Active region AR has a hooked form that rectangular portions are arranged point-symmetrically with respect to a source line contact CNTS, and are arranged corresponding to different bit lines, respectively. Hook-shaped active regions AR are arranged for each two bits of memory cells, and are arranged repeatedly in the row and column directions. Hook-shaped active region AR has a portion extending in the row direction, which is connected to corresponding source line SL1 or SL2 via source line contact CNTS. Phase change material elements PCE each for one bit of memory cell are formed at point-symmetrical positions in active region AR with respect to the source contact, respectively. Phase change material elements PCE is connected to the corresponding bit line via a bit line contact CNTB. A phase change material elements PCES of the memory cells sharing the bit line are arranged commonly to the adjacent memory cells of two bits. The phase change material elements PCES for the two bits of memory cells are connected to bit line BL2 via contacts CNTB1 and CNTB2. Phase change material element PCES is formed by expanding phase change material element PCE for the one-bit memory cell in the row direction.

For the sake of simplicity, FIG. 38 shows phase change material element PCE as if it is arranged for one bit of memory cell. However, each phase change material element PCE is expanded to be shared between the memory cells in the adjacent columns.

Active regions AR are arranged for alternate word lines in the column direction (bit line extending direction) and for each the respective columns in the row direction. Accordingly, phase change material element PCE is expanded such that it is shared between the memory cells to be selected by adjacent word lines.

Bit line BL has a width in the word line extending direction substantially equal to the length of the phase change material elements corresponding to two bits of memory cells. For example, the phase change material elements each shared between two bits of memory cells are arranged in alignment between word lines WL2 and WL3. In each row, the phase change material elements each shared between two bits of memory cells are arranged.

Specifically, in the layout shown in FIG. 38, memory cells M1 and M2 share source line contact CNTS to be connected to source line SL1. Memory cells M1 and M2 are selected by word lines WL1 and WL2, respectively. Likewise, memory cells M3 and M4 share source line contact CNTS to be connected to source line SL2. Memory cell M1 has the phase change material element connected to bit line BL1 via the bit line contact. Memory cell M2 has the phase change material element connected to bit line BL2 via bit line contact CNTB1. Memory cell M3 is likewise has the phase change element connected to bit line BL2 via the bit line contact. Memory cell M4 has the phase change material element connected to bit line BL3 via the bit line contact.

Memory cells M5 and M6 share source line contact CNTS to be connected to source line SL1, and have phase change material elements PCE connected to bit lines BL1 and BL2 via bit line contacts CNTB, respectively. Memory cells M7 and M8 are connected to source line SL2 via the shared source line contact, and are connected to bit lines BL2 and BL3 via the bit line contacts, respectively.

In the layout shown in FIG. 38, the phase change layer forming the phase change material element extends in the row direction to be shared between the memory cells in the adjacent columns, and is connected to different active regions AR via separate and individual contacts CNTB1 and CNTB2, respectively, so that the phase change material elements are formed at the regions neighboring these contacts. Even if the phase change material elements are connected to a common bit line, the bit line contacts are arranged individually corresponding to the respective phase change material elements. However, the source line contact can be shared between adjacent memory cells to reduce the memory cell area. In phase change material element PCES, the upper electrode is provided for the phase change material element, and is connected to the bit line via the contact. Therefore, the memory cells of two bits may share the contact for the upper electrode of the phase change material element for these two bits of memory cells. Thus, contacts CNTB1 or CNTB2 may be formed to be arranged commonly at a central region in the row direction of phase change material element PCES.

According to the second embodiment of the invention, as described above, the adjacent memory cells are configured to share at least the source line, and thus can share the source line contact so that the memory cell area can be reduced.

The structure as described above can be applied not only to the data write path conducting the write current, but also to the read current path conducting the read current.

Third Embodiment

Figure 39:
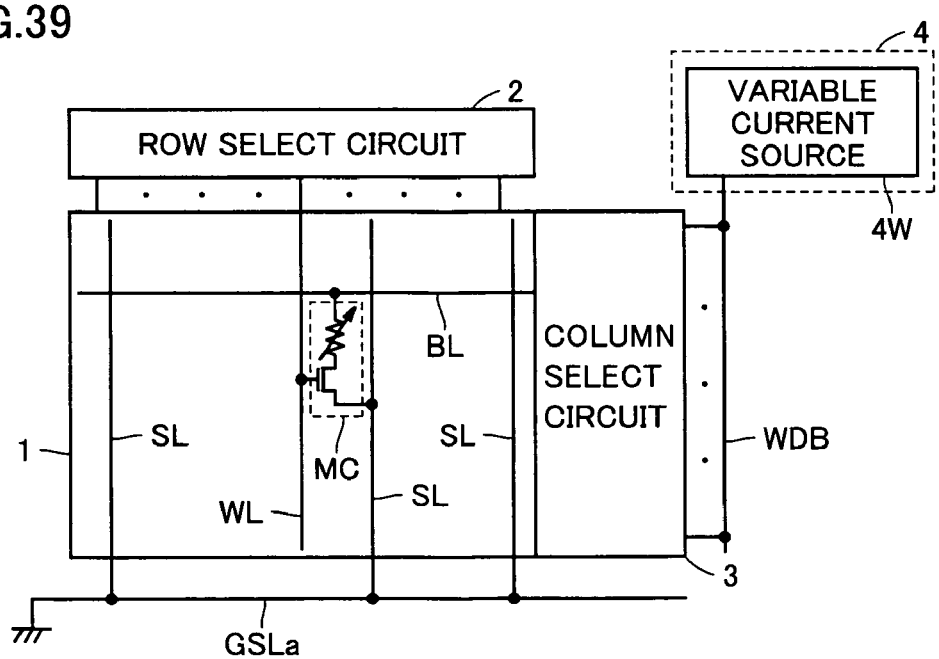
FIG. 39 schematically shows a configuration of a main portion of a nonvolatile semiconductor memory device according to a third embodiment of the invention.

FIG. 39 schematically shows a construction of a main portion of a nonvolatile semiconductor memory device according to a third embodiment of the invention. In FIG. 39, the nonvolatile semiconductor memory device includes, similarly to the first embodiment, memory cell array 1 having memory cells MC arranged in rows and columns, row select circuit 2 for driving a word line corresponding to the selected row in memory cell array 1 to the selected state, column select circuit 3 for producing a column select signal for a selected column in memory cell array 1 according to an address signal (not shown), and connecting the selected column to write data line WDB according to the column select signal, and write/read circuit 4 including variable current source 4W supplying the write current to write data line WDB in the data write operation.

In memory cell array 1, bit line BL is arranged corresponding to each column of memory cells MC, and word line WL is arranged corresponding to each row of memory cells MC. In the third embodiment, source line SL is arranged in parallel to word line WL and perpendicularly to bit line BL. Memory cell MC includes a variable resistance element including the phase change material element, and an access transistor for forming a current path between bit line BL and source line SL according to a signal on word line WL.

The positional relationship between variable current source 4W and the ground node of global source line GSLa is substantially the same as that in the first embodiment already described.

In the nonvolatile semiconductor memory device shown in FIG. 39, word line WL is parallel to write data line WDB, and source line SL is parallel to write data line WDB. Bit line BL is parallel to global source line GSLa. Source line SL has a resistance value per unit length made equal to a resistance value per unit length of write data line WDB. Bit line BL has a resistance value per unit length made equal to a resistance value per unit length of global source line GSLa. In this case, the total resistance value of each write current paths except the memory cell can be uniform independent of the position of a selected memory cell in memory cell array 1, similarly to the first embodiment.

Figure 40:
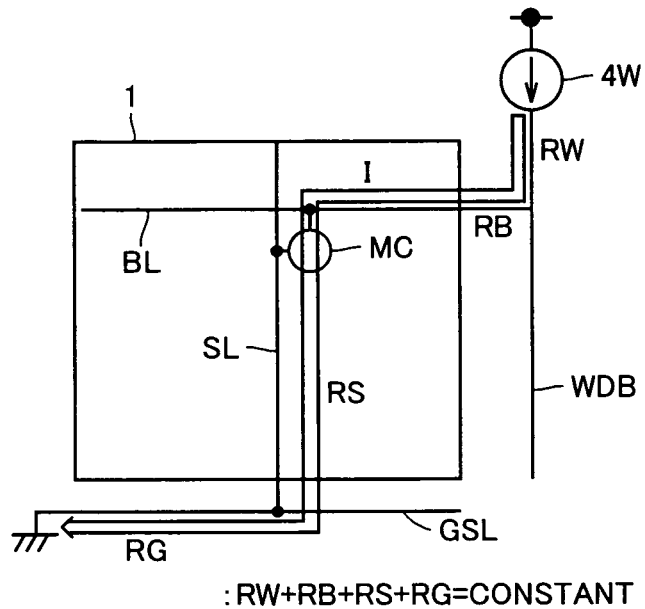
FIG. 40 schematically shows a resistance distribution of a write current path of the nonvolatile semiconductor memory device shown in FIG. 39.

FIG. 40 schematically shows a path of the write current in the third embodiment of the invention. In FIG. 40, write current I supplied form variable current source 4W flows from write data line WDB through bit line BL to memory cell MC. Write current I supplied to memory cell MC is discharged via source line SL to global source line GSL, and finally to the ground node (ground pad). Bit line BL and global source line GSL have the same resistance value per unit length, and are arranged parallel to each other. Therefore, a sum (RB+RG) of the resistances is constant independently of the position of a selected row of memory cell MC. Likewise, source line SL and write data line WDB have the same resistance value per unit length, are parallel to source line SL and write data line WDB and are perpendicular to the bit line BL. Therefore, a sum (RW+RS) of a resistance RW on write data line WDB and resistance RS of source line SL between memory cell MC and global source line GSL is constant independently of the selected column position of memory cell MC. Therefore, the total sum (RW+RB+RS+RG) of these resistances can be constant independently of the position of a selected memory cell MC in memory cell array 1.

Similarly to the first embodiment, each of the sums of resistances (RW+RB) and (RS+RG) is set to 0.5 KΩ or lower, whereby the write can be performed by supplying a current of about 1 mA from variable current source 4W to memory cell MC even with a power supply voltage of about 3 V.

As the interconnection layout of write data line WDB, bit line BL, source line SL and global source line GSL shown in FIG. 40, the interconnection layout shown in FIG. 6 can be utilized with source line SL being arranged perpendicularly to bit line BL, and global source line GSL being arranged parallel to bit line BL. Further, in the layout shown in FIG. 6, the layout of source line SL and global source line GSL is rotated counterclockwise by 90 degrees. After this rotation, the lengths of source line SL and global source line GSL are adjusted according to the length of memory cell array 1 so that the intended interconnection layout can be easily achieved.

According to the third embodiment of the invention, as described above, the global source line is arranged parallel to the bit line, and the source line and the write data line are arranged perpendicularly to the bit line and the global source line. Also, the bit line and the global source line have the equal resistance value per unit length, and the write data line and the source line have the equal resistance value per unit length. Thus, the write current path except the memory cell can have a constant resistance value independent of the position of a selected memory cell in the array, and it is possible to reduce the dependency of the write current on the position of the selected memory cell in the array.

Each of the sum of resistances from the write current supply to the memory cell and the sum of resistances from the memory cell to the ground node is set to 500 Ω or lower, whereby the write current of a sufficient magnitude can be supplied to the memory cell even when the power supply voltage of the variable current source is low.

Fourth Embodiment

In either of the case where the source line is parallel to the bit line and the case where the source line is perpendicular to the bit line, the memory cells in adjacent columns can share the phase change material element (the bit line contact is shared between the adjacent memory cells). According to the fourth embodiment, the structure of the memory cell will be described, in which adjacent memory cells of two bits share the phase change material element.

(Sharing Structure 1)

Figure 41:
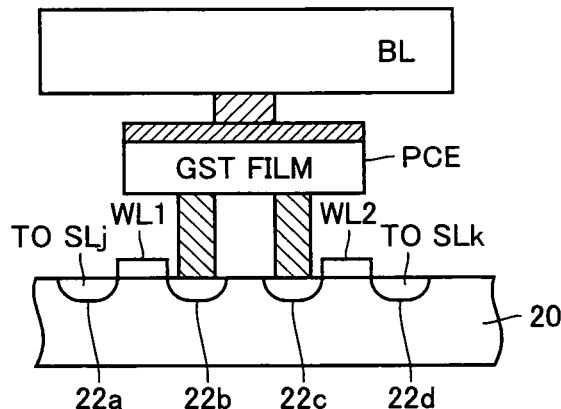
FIG. 41 schematically shows a sectional structure of a memory cell according to a fourth embodiment of the invention.

FIG. 41 schematically shows a sectional structure of the phase change memory cell according to the fourth embodiment of the invention. Phase change material element PCE is shared between memory cells of two bits, and is connected to bit line BL via the contact. This phase change material element PCE has a GST film causing the crystalline phase change according to the storage data, and an upper electrode located between the GST film and the contact. FIG. 41 does not clearly show the heater layer.

Impurity regions 22a-22d are formed being spaced at the surface of substrate region 20. Impurity regions 22b and 22c are coupled to phase change material element PCE via different contacts. Impurity regions 22a and 22b are connected to different source lines SLj and SLk, respectively. Word line WL1 is formed above the surface of substrate region 20 between impurity regions 22a and 22b with a gate insulating film (not shown) in between, and word line WL2 is formed above the surface of substrate region 20 between impurity regions 22a and 22b with a gate insulating film (not shown) in between.

In the memory cell structure shown in FIG. 41, when word line WL1 or WL2 is selected, phase change material element PCE causes the phase change at the vicinity of the corresponding resistance electrode (including the heater layer) due to heating. This phase change locally occurs. Thus, the resistance value (crystal phase) corresponding to the storage data can be provided individually in each memory cell even when two bits of memory cells share phase change material element PCE.

As shown in FIG. 41, the memory cells sharing phase change material element PCE are connected to different source lines SLj and SLk, respectively. In this arrangement, the connection manner of the access transistors can be determined according to the direction of the source line arranged.

Figure 42A:
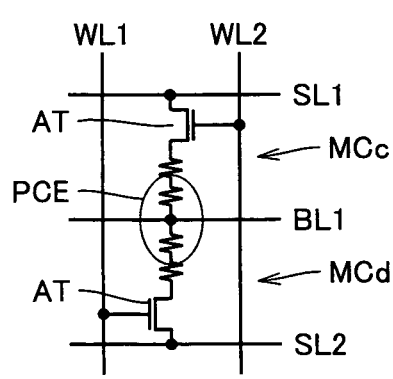
FIGS. 42A and 42B show electrically equivalent circuits of the memory cell structure shown in FIG. 41.

FIG. 42A shows an electrically equivalent circuit for the memory cell arrangement having the source and bit lines parallel to each other. In FIG. 42A, the phase change material element of memory cells MCc and MCd are coupled to bit line BL1 via a common contact. The access transistors of memory cells MCc and MCd are connected to source lines SL1 and SL2, respectively. Access transistor AT of memory cell MCc is connected to word line WL2, and access transistor AT of memory cell MCd is connected to word line WL1.

In selecting word lines WL1 and WL2, current paths to the different source lines are formed, respectively, and change material element PCE selectively causes the phase change according to the storage data at a region between the bit line and the corresponding access transistor.

Figure 42B:
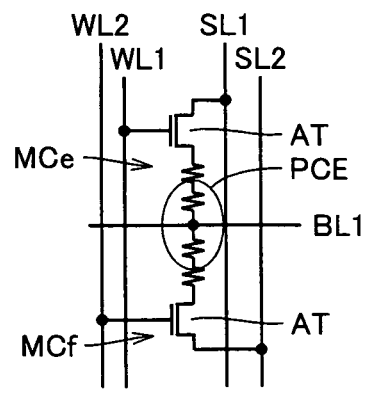

FIG. 42B shows an electrically equivalent circuit in the memory cell arrangement having the source line and the bit line perpendicular to each other. Phase change material element PCE of memory cells MCe and MCf is commonly connected to bit line BL1. Access transistor AT in memory cell MCe is rendered into the selected state by word line WL1, to connect corresponding phase change material element PCE to source line SL1. Access transistor AT in memory cell MCf is driven into the selected state by word line WL2, to connect corresponding phase change material element PCE to source line SL2. Thus, memory cell MCe or MCf can be supplied with the write current to perform data writing without causing contention between the write currents in the selected memory cells and without causing the write disturbance.

As shown in FIGS. 42A and 42B, only one contact is present between bit line BL (BL1) and phase change material element PCE so that the number of the bit line contact for two bits of memory cells can be reduced to one. Further, only one source contact is required for two bits of memory cells. Therefore, the memory cell size can be reduced.

(Sharing Structure 2)

Figure 43:
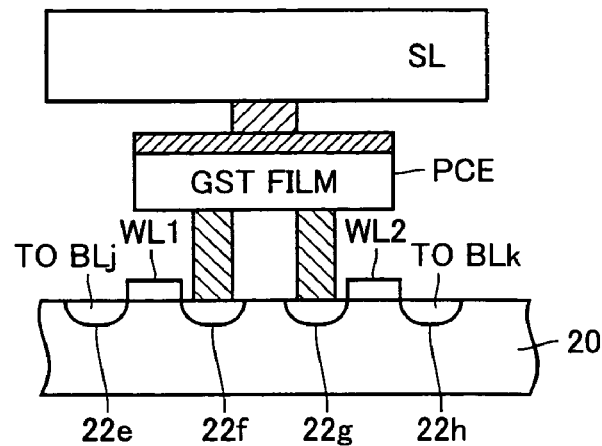
FIG. 43 schematically shows a second sectional structure of the memory cell of the fourth embodiment of the invention.

FIG. 43 schematically shows a second structure of the memory cells according to the fourth embodiment of the invention. In FIG. 43, impurity regions 22e-22h are formed being spaced from each other at the surface of substrate region 20. Impurity regions 22e and 22h are connected to bit lines BLj and BLk, respectively. Impurity regions 22f and 22g are connected to phase change material element PCE via the contacts and lower electrodes (resistive electrodes). Phase change material element PCE includes the GST film and an upper electrode, and is connected to source line SL via a common contact. Word line WL1 is formed above the surface of substrate region 20 between impurity regions 22e and 22f, and word line WL2 is formed above the surface of substrate region 20 between impurity regions 22g and 22h.

In the case where phase change material element PCE of two bits of memory cells is commonly connected to source line SL, the write current may be supplied to source line SL via the variable current source. In this case, the bit line is maintained at the ground voltage level. By arranging column select gates at source line SL and bit line BL, respectively, the write current can be supplied from the variable current source to a selected memory cell via the source line. Similarly to the first and third embodiments as described above, however, such a construction may be employed that the write current is supplied via the bit line, and source line SL is connected to the global source line.

Figure 44A:
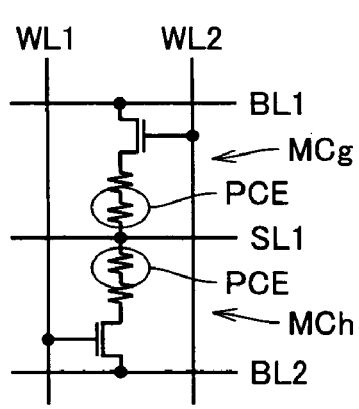
FIGS. 44A and 44B show electrically equivalent circuits of the memory cell structure shown in FIG. 43.

FIG. 44A shows an electrically equivalent circuit of the memory cells shown in FIG. 43, in which the source line SL and bit line BL are arranged parallel to each other. The access transistors of memory cells MCg and MCh are connected to bit lines BL1 and BL2, respectively, and phase change material elements PCE of memory cells MCg and MCh are commonly connected to source line SL1. For specifically showing the phase change region of each of memory cells MCg and MCh, FIG. 44A shows the structure as if the memory cells are comprised of separate phase change material elements, respectively.

When word lines WL2 and WL1 are selected, memory cells MCg and MCh connect phase change material element PCE to bit lines BL1 and BL2, respectively.

Figure 44B:
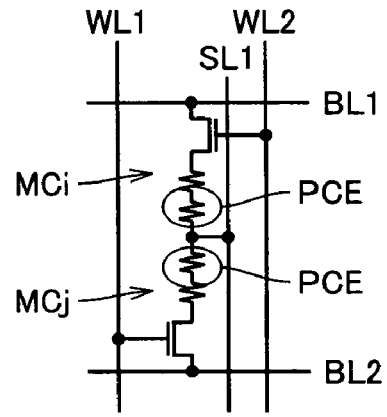

FIG. 44B shows an electrically equivalent circuit of the memory cells shown in FIG. 44, in which bit line BL and source line SL are arranged perpendicular to each other. Phase change material elements PCE of memory cells MCi and MCj are commonly connected to source line SL1. When word lines WL2 and WL1 are selected, memory cells MCi and MCj connect the corresponding phase change material elements to bit lines BL1 and BL2, respectively.

In either of the constructions shown in FIGS. 44A and 44B, the phase change material elements PCE for two bits of memory cells are connected to a common source line SL (SL1) via one contact. Thus, the contacts of the memory cells can be reduced in number, and accordingly, the memory cell size can be reduced.

In the constructions shown in FIGS. 44A and 44B, data writing may be performed such that the variable current source is connected to the global source line, the bit line is connected to the write data line via the column select circuit and the write data line is connected to the ground node.

(Sharing Structure 3)

Figure 45:
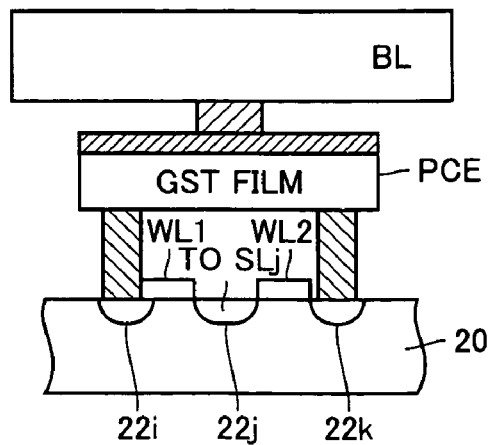
FIG. 45 schematically shows a third sectional structure of the memory cell of the fourth embodiment of the invention.

FIG. 45 schematically shows a sectional structure of the memory cell of a third sharing structure according to the fourth embodiment of the invention. In FIG. 45, impurity regions 22i, 22j and 22k are formed being spaced at the surface of substrate region 20. Word line WL1 is arranged above the surface of substrate region 20 between impurity regions 22i and 22j. Word line WL2 is arranged above the surface of substrate region 20 between impurity regions 22j and 22k. Impurity regions 22i and 22k are coupled to phase change material element PCE via separate contacts, respectively. Phase change material element PCE includes the GST film serving as a variable resistance element, and an upper electrode for forming the contact. Phase change material element PCE is connected to bit line BL via a common contact. Impurity region 22j is coupled to a common source line SLj.

Figure 46A:
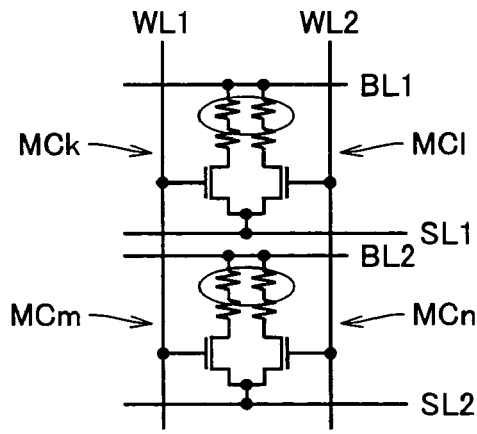
FIGS. 46A and 46B show electrically equivalent circuits of the memory cell structure shown in FIG. 45.

FIG. 46A shows an electrically equivalent circuit for the construction in which the bit and source lines are arranged parallel to each other in the memory cell structure shown in FIG. 45. FIG. 46A shows four memory cells MCk, MCl, MCm and MCn. Memory cells MCk and MCl have the phase change material elements commonly coupled to bit line BL1, and have the access transistors commonly coupled to source line SL1. Memory cells MCk and MCl are connected to word lines WL1 and WL2, respectively.

Likewise, memory cells MCm and MCn have the phase change material elements commonly connected to bit line BL2, and have the access transistors commonly connected to source line SL2. Memory cell MCm and MCn are selected by word lines WL1 and WL2. Source lines SL1 and SL2 are arranged parallel to bit lines BL1 and BL2.

Therefore, for two memory cells, only one contact is formed for the bit line, and only one contact is formed for the source line. Accordingly, the occupation area of the memory cells can be reduced.

In FIG. 46A, when the layout of memory cells MCk and MCl and the layout of memory cells MCm and MCn are made mirror-symmetrical with respect to the source line, memory cells MCk and MCl can share the source line, and memory cells MCm and MCn can share the source line (simultaneously selection of the bit lines is prohibited). However, as shown in FIG. 46A, individual source line SL (SL1 or SL2) is provided for memory cells of two bits, so that only the selected memory cell is connected to each respective source line, and the problems of write disturbance and read disturbance can be eliminated.

Figure 46B:
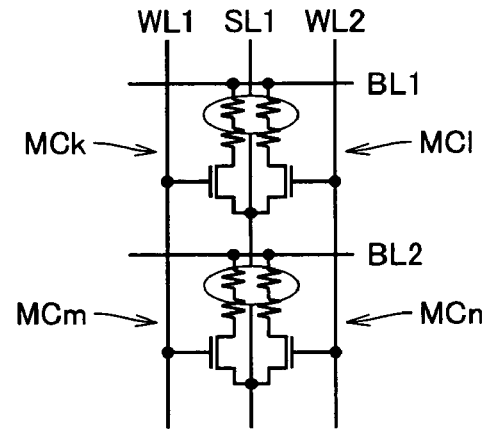

FIG. 46B shows another construction of the electrically equivalent circuit of the memory cell structure shown in FIG. 45. In the construction shown in FIG. 46B, source line SL1 is arranged perpendicular to bit lines BL1 and BL2. The access transistors of memory cells MCk, MCl, MCm and MCn are commonly connected to source line SL1. Memory cells MCk and MCl have the phase change material elements connected through a common contact hole to bit line BL1, and memory cells MCm and MCn have the phase change material elements connected through a common contact hole to bit line BL2.

In the structure shown in FIG. 46B, source line SL1 is arranged perpendicularly to bit lines BL1 and BL2, and a plurality of selected memory cells are concurrently connected to source line SL1. However, the memory cell size can be reduced because only one bit line contact and only one source line contact are provided for the two bits of memory cells.

(Sharing Structure 4)

Figure 47:
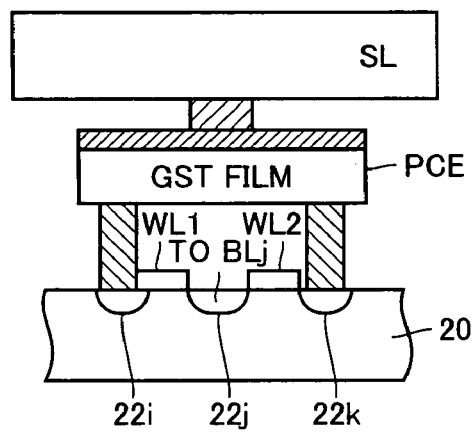
FIG. 47 schematically shows a structure of a fourth modification of the memory cell structure according to the fourth embodiment of the invention.

FIG. 47 schematically shows a fourth sectional structure of the memory cells according to the fourth embodiment of the invention. The sectional structure of the memory cells shown in FIG. 47 is the same as that shown in FIG. 45, except for that phase change material elements PCE are connected through a common contact to source line SL, and that impurity region 22g is connected to a bit line BLg instead of the source line.

In the sectional structure shown in FIG. 47, therefore, portions corresponding to those shown in FIG. 45 are allotted with the same reference numerals or characters, and description thereof is not repeated.

Figure 48A:
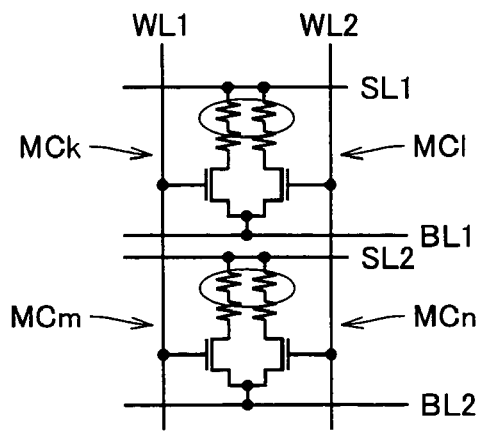
FIGS. 48A and 48B show electrically equivalent circuits of the memory cell structure shown in FIG. 47.

The electrically equivalent circuit corresponding to the sectional structure of the memory cell shown in FIG. 48 is the same as those shown in FIGS. 46A and 46, except for that the bit lines and the source lines are exchanged with each other. Specifically, in the structure in which the source and bit lines are arranged in parallel to each other as shown in FIG. 48A, of memory cells MCk and MCl have the phase change material elements connected to source line SL1 via the common contact, and the access transistors connected to bit line BL1 via the common contact. Likewise, memory cells MCm and MCn have the phase change material elements connected to source line SL2 via the common contact, and the access transistors connected to bit line BL2 via the common contact.

Figure 48B:
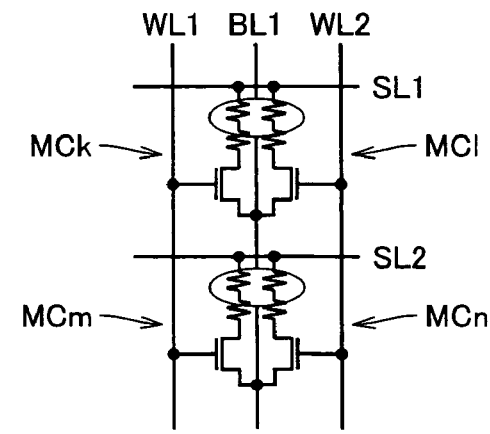

Conversely, in the structure in which the source line and the bit line are arranged perpendicular to each other, the access transistors of memory cells MCk, MCl, MCm and MCn are commonly connected to bit line BL1 as shown in FIG. 48B. The phase change material elements of memory cells MCk and MCl are commonly connected to source line SL1, and the phase change material elements of memory cells MCm and MCn are commonly connected to source line SL2.

In the structure shown in FIG. 47, therefore, the memory cells of the two bits likewise require only one contact for each of the source line and the bit line, so that the memory cell sizes can be reduced.

(Sharing Structure 5)

Figure 49:
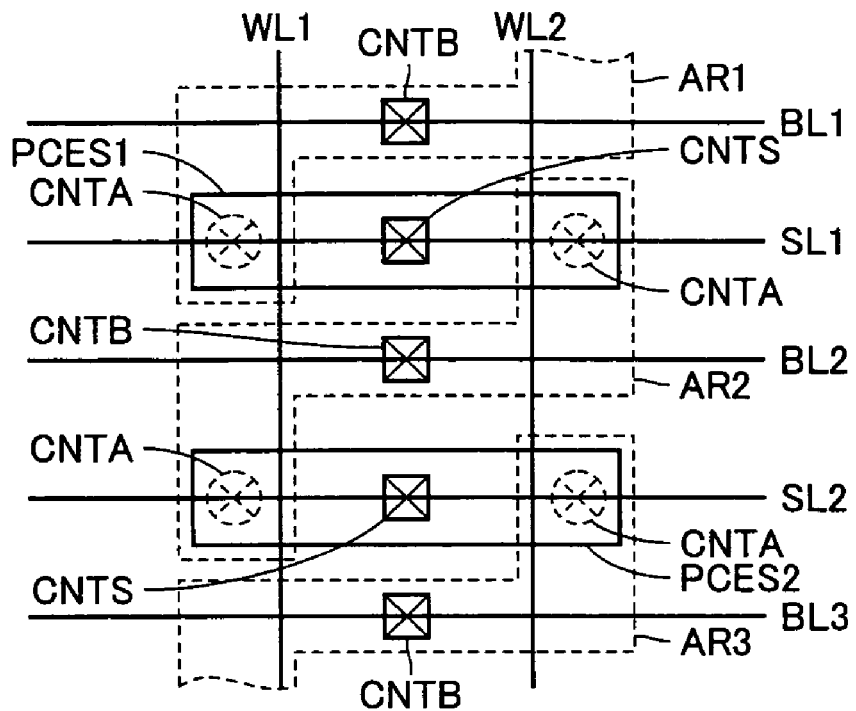
FIG. 49 schematically shows a plane layout of the memory cell structure shown in FIG. 48.

FIG. 49 schematically shows a planar layout of memory cells of a fifth sharing structure of the fourth embodiment according to the invention. In FIG. 49, source lines SL1 and SL2 are arranged in parallel to and between bit lines BL1-BL3. Word lines WL1 and WL2 are arranged perpendicular to bit lines BL1-BL3 and source lines SL1 and SL2. Phase change material elements PCES1 and PCES2 formed into rectangular-shape having longitudinal axes parallel to source lines SL1 and SL2 are arranged to cross word lines WL1 and WL2. Phase change material elements PCES1 and PCES2 are connected to source lines SL1 and SL2 via source line contacts CNTS, respectively.

Active regions AR1-AR3 forming transistors are formed at the surface of the substrate. Each of active regions AR1-AR3 has a hooked form including a region extending parallel to the bit line and crossing word lines WL1 and WL2, and regions extending in the row direction to be coupled to the phase change material elements in different columns, respectively. Active region AR1 is electrically coupled to phase change material element PCES1 via a contact CNTA, and is connected to bit line BL1 via a bit line contact CNTB. Active region AR2 is connected to bit line BL2 via bit line contact CNTB formed at its central portion, and is also connected to phase change material elements PCES1 and PCES2 via contacts CNTA located point-symmetrically with respect to bit line contact CNTB.

Active region AR3 is connected to bit line BL3 via bit line contact CNTB, and is electrically connected to phase change material element PCES2 via a contact formed in a region outside word line WL2. The layout shown in FIG. 27 is provided repeatedly in the row and column directions.

Contacts CNTA are arranged outside word lines WL1 and WL2, and contacts CNTB and CNTS are formed in a region between word lines WL1 and WL2.

When word line WL1 is selected, active region AR2 enters such a state that phase change material element PCES2 connects source line SL2 via bit line contact CNTB to bit line BL2. In active region AR2, when word line WL2 is selected, phase change material element PCES1 is connected to bit line BL2 via contacts CNTA and CNTB, and a path of current flow is formed between source line SL1 and bit line BL2.

Figure 50:
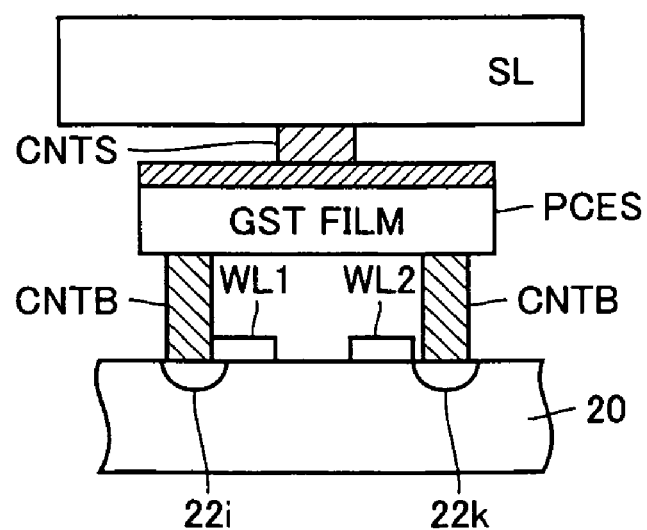
FIG. 50 schematically shows a sectional structure of a fifth modification of the memory cell according to the fourth embodiment of the invention.

FIG. 50 schematically shows a sectional structure taken along source line SL (SL1 or SL2) in FIG. 49. Phase change material element PCES (PCES1 or PCES2) is connected to source line SL via contact CNTS, and is electrically connected to impurity regions 22i and 22k formed at the surface of substrate region 20 via individual contacts CNTB, respectively. Word lines WL1 and WL2 are arranged in the region between these contacts CNTB. When word line WL1 is selected, impurity region 22i is connected to the bit line via an impurity region in the different region. When word line WL2 is selected, impurity region 22k is connected to another bit line.

Figure 51:
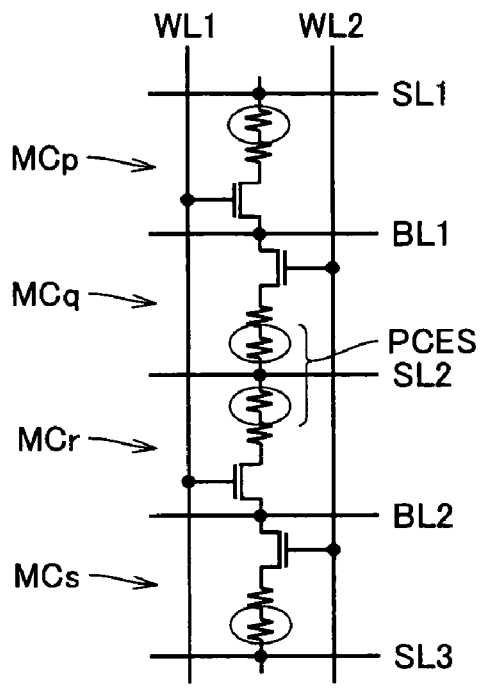
FIG. 51 shows an electrically equivalent circuit of the memory cell structure shown in FIG. 50.

FIG. 51 shows an electrically equivalent circuit of the arrangement of memory cells shown in FIGS. 49 and 50. In FIG. 51, memory cells MCp-MCs are aligned in the row direction. Memory cells MCp and MCq have access transistors commonly connected to bit line BL1, and are driven to the selected state by word lines WL1 and WL2, respectively. Memory cells MCq and MCr have phase change material elements PCES commonly connected to source line SL2. Memory cells MCr and MCs have the access transistors commonly connected to bit line BL2, and are driven to the selected state by word lines WL1 and WL2, respectively.

In the row direction, as shown in FIG. 51, the access transistors are connected to a bit line via a common contact, and the phase change material elements are connected to a common source line. The memory cells sharing the source line or the bit line are driven to the selected state by different word lines, respectively. The memory cells sharing the bit line or source line are prevented from being simultaneously driven to the selected state, and it becomes possible to prevent the occurrence of write disturbance caused by the write current flowing to an unselected memory cell when the write current is supplied.

(Sharing Structure 6)

Figure 52:
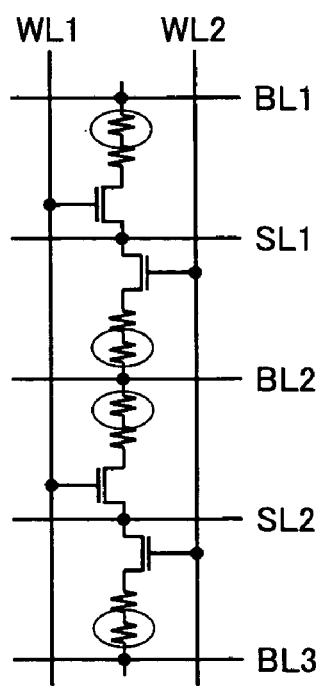
FIG. 52 shows another electrically equivalent circuit of the memory cells according to the fourth embodiment of the invention.

FIG. 52 is an electrically equivalent circuit of the memory cell arrangement of a sixth sharing structure. In the structure shown in FIG. 52, the bit line and the source line are exchanged in position, as compared with the electrically equivalent circuit shown in FIG. 51. Thus, the access transistors of the memory cells in adjacent columns are commonly connected to source line SL1 or SL2, and the phase change material elements of the memory cells in adjacent columns are commonly connected to bit line BL2 or BL3. In the construction of the electrically equivalent circuit shown in FIG. 52, the bit line and the source line are exchanged in position, as compared with the plane layout and the sectional structure shown in FIGS. 49 and 50. Therefore, in the construction shown in FIG. 52, when bit lines BL (BL1-BL3) and source lines SL (SL1 and SL2) are arranged parallel to word lines WL1 and WL2, the memory cells sharing the bit line or the source line are connected to the different word lines. Accordingly, the sizes of memory cells can be reduced while preventing occurrence of the write disturbance in the data writing.

In the case where source line SL is electrically connected to the phase change material element, source line SL may be supplied with the write current, white coupling the bit line to the ground node via the internal write data line. In this case, a source line switch is employed for selecting source line SL, and the write current is supplied from the write current source via the source line select switch to the source line corresponding to a selected column.

According to the fourth embodiment of the invention, as described above, adjacent memory cells share the phase change material element, and are connected to the source line or bit line via a common contact, and therefore, the memory cell sizes can be further reduced.

By arranging the word lines such that the memory cells sharing the source line or the bit line may not be selected concurrently, the number of selected memory cell connected to a source line is one in the case where the source line is arranged parallel to the bit line. Thus, variations in source line potential can be suppressed, and accurate writing/reading of the data can be performed, and the problem of the write disturbance can be reliably resolved.

Although the description has been given on the data writing, the bit lines and source lines are utilized also in the data read operation. Therefore, the flow of the read current in an unselected memory cell can be prevented by utilizing such a construction that adjacent cells are connected to different word lines, respectively, or only one selected memory cell is connected to a source line. Thereby, the problem of occurrence of the read disturbance can be eliminated.

Fifth Embodiment

Figure 53:
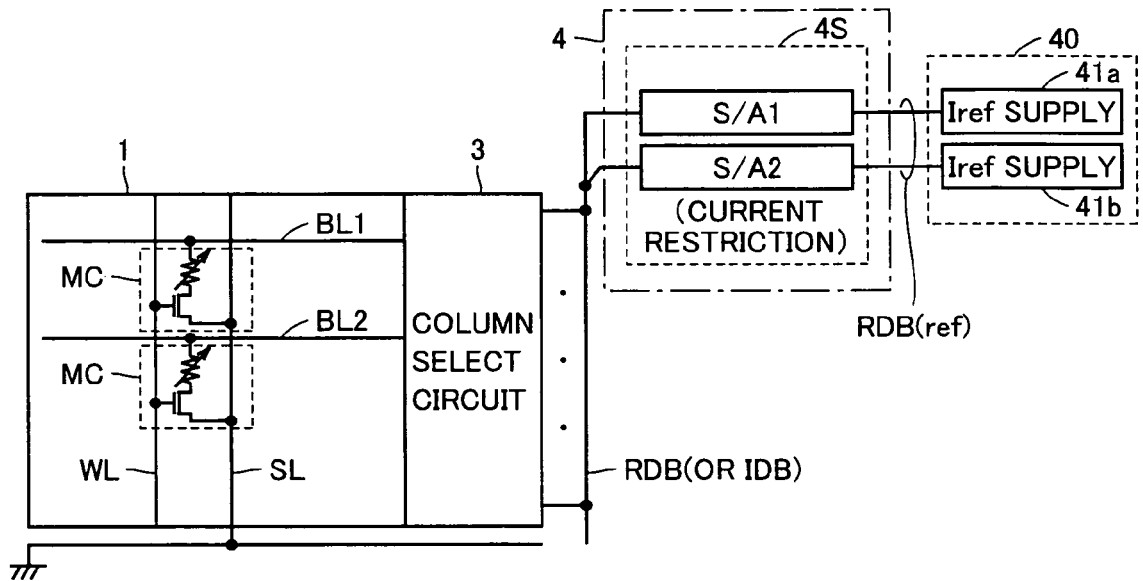
FIG. 53 schematically shows a structure of a main portion of a nonvolatile semiconductor memory device according to a fifth embodiment of the invention.

FIG. 53 schematically shows a construction of a portion related to data reading of a nonvolatile semiconductor memory device according to a fifth embodiment of the invention.

Referring to FIG. 53, memory cell array 1 includes the memory cells arranged in rows and columns and each including the phase change material element as a storage element. A storage unit including the phase change material element in the memory cell, is represented as a variable resistance element in FIG. 53.

Bit lines BL (BL1, BL2, . . . ) are arranged corresponding to the respective columns of memory cells MC, and word lines WL are arranged corresponding to the respective rows of memory cells. In memory cell array 1, source lines SL are arranged parallel to word lines WL, and memory cells MC sharing source line SL are connected commonly to a word line WL. Source lines SL are connected to global source line GSL, which in turn is arranged parallel to word line WL. Global source line GSL and source lines SL may be arranged similarly to that in the first embodiment described above.

A selected memory cell in memory cell array 1 is coupled to a read data bus RDB (or an internal data bus IDB) via column select circuit 3. Read data bus RDB is coupled to sense amplifier (S/A) 4S included in write/read circuit 4.

In memory cell array 1, column select circuit 3 selects a plurality of bits of memory cells in parallel, and couples them to read data bus RDB (internal data bus IDB) of a multi-bit width. Sense amplifier 4S includes sense amplifier circuits S/A (S/A1 and S/A2) of the multi-bit width corresponding to the bit width of read data bus RDB. The sense amplifier circuit S/A has a function of performing current limitation for each data bit.

Sense amplifier 4S produces the internal read data by comparing a reference current supplied from a reference current generating circuit 40 with a current flowing through read data line RDB. Reference current generating circuit 40 includes reference current sources (Iref sources) 41a and 41b for producing reference currents RDB(ref), provided corresponding to sense amplifier circuits S/A1 and S/A2, respectively. Reference current Iref driven by each of reference current sources 41a and 41b has a value intermediate between the current driven by a memory cell in the high resistance state and the current driven by a memory cell in the low resistance state.

By providing sense amplifier 4S with the current limiting function for each bit, the following advantage can be achieved. If a large read current flows through the memory cell of a small resistance value among the memory cells connected to common source line SL, this affects the discharging currents of other memory cells connected to common source line SL, and such a problems is caused that data cannot be read fast and read margin is reduced. By providing sense amplifier 4S with the current limiting function for each bit, it is possible to set an upper limit of the value of the current flowing through the memory cell, even when the memory cell is in the low resistance state, and may have a resistance value smaller than a specification value due to variations in resistance value caused by parameter variations such as manufacturing variations. Therefore, it is possible to prevent the read currents of other memory cells from being affected by such excessive current, and to achieve improvement of the read margin and increase in the read speed.

Figure 54:
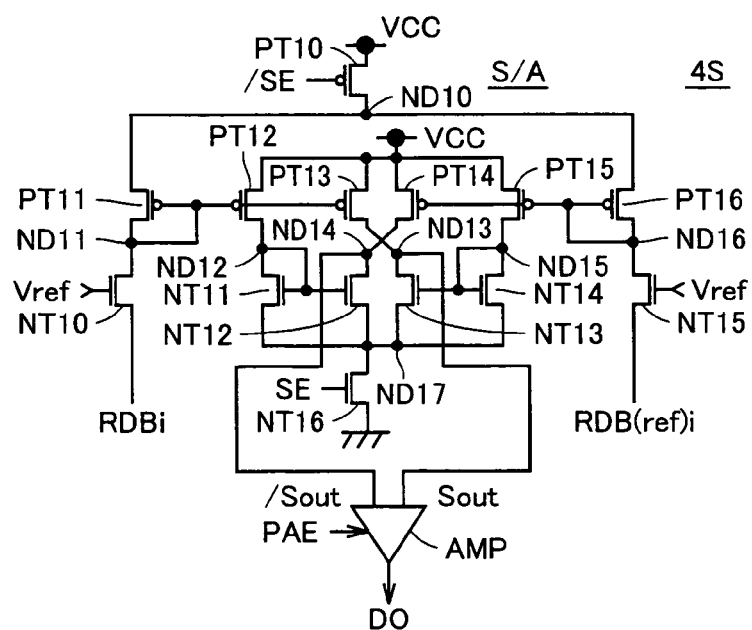
FIG. 54 shows an example of a structure of a sense amplifier circuit shown in FIG. 53.

FIG. 54 shows a configuration of one sense amplifier circuit S/A arranged in sense amplifier 4S. In FIG. 54, sense amplifier circuit S/A includes a P-channel MOS transistor (insulated gate field effect transistor) PT10 connected between the power supply node and a node ND10 and having a gate receiving a sense amplifier activating signal SE; a P-channel MOS transistor PT11 connected between nodes ND10 and ND11 and having a gate connected to node ND11; a P-channel MOS transistor PT12 connected between the power supply node and node ND10 and having a gate connected to node ND11; a P-channel MOS transistor PT13 connected between the power supply node and a node ND13 and having a gate connected to node ND11; a P-channel MOS transistor PT14 connected between the power supply node and a node ND14 and having a gate connected to a node ND16; a P-channel MOS transistor PT15 connected between the power supply node and a node ND15 and having a gate connected to node ND16; and a P-channel MOS transistor PT16 connected between nodes ND10 and ND16 and having a gate connected to node ND16.

Reference data lines RDB(ref)i is coupled to a corresponding reference current source 41 (Iref sources 41a and 41b).

When sense amplifier circuit S/A is active, MOS transistors PT11 and PT12 form a current mirror circuit with MOS transistor PT11 being a master, and MOS transistors PT15 and PT16 form a current mirror circuit with MOS transistor PT16 being a master. Therefore, when sense amplifier circuit S/A is made active, currents of magnitudes corresponding to the currents flowing through MOS transistors PT11 and PT16 flow through MOS transistors PT12 and PT15, respectively.

Further, sense amplifier circuit S/A includes an N-channel MOS transistor NT10 connected between node ND11 and read data line RDBi and having a gate receiving reference voltage Vref; an N-channel MOS transistor NT11 connected between nodes ND12 and ND17 and having a gate connected to node ND12; an N-channel MOS transistor NT12 connected between nodes ND14 and ND17 and having a gate connected to node ND12; an N-channel MOS transistor NT13 connected between nodes ND13 and ND17 and having a gate connected to node ND15; an N-channel MOS transistor NT14 connected between nodes ND15 and ND17 and having a gate connected to node ND15; an N-channel MOS transistor NT15 connected between node ND16 and reference data line RDB(ref)i and having a gate receiving reference voltage Vref; and an N-channel MOS transistor NT16 connected between node ND17 and the ground node and having a gate receiving a sense amplifier activating signal SE.

When sense amplifier circuit S/A is active, MOS transistors NT11 and NT12 form a current mirror circuit, and MOS transistors NT13 and NT14 form a current mirror circuit. When these MOS transistors NT11-NT14 have the same size, currents of the same magnitude as those flowing through MOS transistors NT11 and NT14 flow through MOS transistors NT12 and NT13, respectively.

Sense amplifier circuit S/A further includes a differential amplifier circuit (preamplifier) AMP, which is made, active in response to a preamplifier activating signal PAE to produce internal read data DO by differentially amplifying sense signals Sout and /Sout supplied from nodes ND13 and ND14, respectively.

In sense amplifier circuit S/A shown in FIG. 54, reference voltage Vref determines the amounts of driving currents of MOS transistors NT10 and NT15 supplying the currents to data lines RDBi and RDB(ref)i, respectively.

The reference current driven on reference data lines RDB (ref)i is determined by the drive current of reference current source (Iref source) 41 (41*a*, 41*b*).

When sense amplifier circuit S/A is inactive, both MOS transistors PT10 and NT16 are off, and the path of the sense operation current is cut off, and sense amplifier circuit S/A is kept inactive.

For activating sense amplifier circuit S/A, sense amplifier activating signals /SE and SE are driven to the L and H levels, respectively, and both MOS transistors PT10 and NT16 are turned on. Responsively, node ND10 attains a power supply voltage VCC, and node ND17 is driven to the ground voltage level. In the memory cell array, the operation of selecting a memory cell is performed, and read data line RDBi is coupled to the bit line on a selected column via a column select gate included in the column select circuit.

In the sense operation, the read current is supplied via MOS transistors PT11, NT11 and read data line RDBi to the bit line onto the selected column. Reference voltage Vref to MOS transistor NT10 restricts the upper limit of the current supplied to read data line RDBi. Likewise, MOS transistors PT16 and NT15 supply the current through the reference data line RDB(ref)i, and the reference current is discharged. MOS transistor NT15 restricts the upper limit of the reference current.

When the selected memory cell is in the low resistance state, the current flowing through read data line RDBi is larger than the current flowing through reference data line RDB (ref), and the current flowing through MOS transistor PT11 is larger than the current flowing through MOS transistor PT16. Thus, the current flowing through MOS transistor PT12 is larger than the current flowing through MOS transistor PT15. For the sake of simplicity, it is assumed in the following description that P-channel MOS transistors PT11-PT16 have the same size, i.e., the same ratio (W/L) of a channel width W to a channel length L of the transistor, and N-channel MOS transistors NT11-NT14 have the same size.

The current flowing through MOS transistor PT12 is supplied to MOS transistor NT11 via node ND12. The current flowing from MOS transistor PT15 is supplied to MOS transistor NT14. MOS transistor NT12 can drive the current of the same magnitude as the driving current of MOS transistor NT11. MOS transistor NT13 can drive the current of the same magnitude as the current flowing through MOS transistor NT14. MOS transistors PT12 and PT13 have gates commonly connected to node ND11. Therefore, MOS transistor PT13 drives the current of the same magnitude as MOS transistor PT11, and MOS transistor PT14 drives the current of the same magnitude as MOS transistors PT15 and PT16.

Since the selected memory cell is in the low resistance state, the current flowing through MOS transistor PT13 is larger than the current flowing through MOS transistor PT14.

MOS transistor NT12 can drive a larger current than MOS transistor NT13 so that the potential level of node ND14 rapidly lowers. Conversely, the potential on node ND13 hardly lowers because the drive current of MOS transistor PT13 is larger than the discharge current of MOS transistor NT13.

When a potential difference between complementary signals Sout and /Sout on nodes ND13 and ND14 is sufficiently developed, preamplifier activating signal PAE is activated and responsively, differential amplifier AMP differentially amplifies complementary signals Sout and /Sout so that internal read data D0 is produced.

When the selected memory cell is in the high resistance state, the current flowing through read data line RDBi is smaller than the current flowing through reference data line RDB(ref)i. In contrast to the operation described above, therefore, the potential level of node ND14 is lower than the potential level of node ND13, and internal read data DO supplied from differential amplifier AMP takes a logical value opposite to that in reading data from the memory cell in the low resistance state.

By utilizing this sense amplifier circuit S/A, the internal read data can be produced by rapidly converting the difference between the read current (memory cell current) and the reference current into a voltage difference. Reference voltage Vref is applied to MOS transistor NT11 to restrict its current driving power. When the bit line potential of the memory cell in the high resistance state rises, the read current flows in the memory cell to cause the phase change in the memory cell to change the state from the high resistance state to the low resistance state. By limiting the upper value of this read current, the potential rising of a corresponding bit line can be restricted even when the memory cell is in the high resistance state, and accordingly, the phase change of the phase change material element in the memory cell can be prevented. Thereby, it is possible to avoid the problem of the read disturbance that the read current changes the resistance state of a memory cell to change the storage data. Also, the following problem can be eliminated.

In the case where sense amplifier circuit S/A shown in FIG. 54 is provided for each selected memory cell and multiple bits of data are read in parallel, a plurality of memory cells MC are connected in parallel to shared source line SL. Even when one memory cell has a decreased resistance value to increase the drive current due to variations in manufacturing parameter or others, MOS transistor NT10 restricts the upper limit of the driving current. Thus, it is possible to suppress the rising of potential on shared source line SL, and adverse effect of restricting the read currents of other selected memory cells can be prevented. Also, it is possible to avoid impairing of the read margin.

According to the fifth embodiment of the invention, as described above, even in the case where the multiple bits of data are read in parallel, and the selected memory cells are connected to a common source line, the sense amplifier circuits provided for the respective bits have the current restricting functions, so that flow of a large current onto the shared, common source line can be prevented, and fast and accurate reading can be achieved.

Sixth Embodiment

Figure 55:
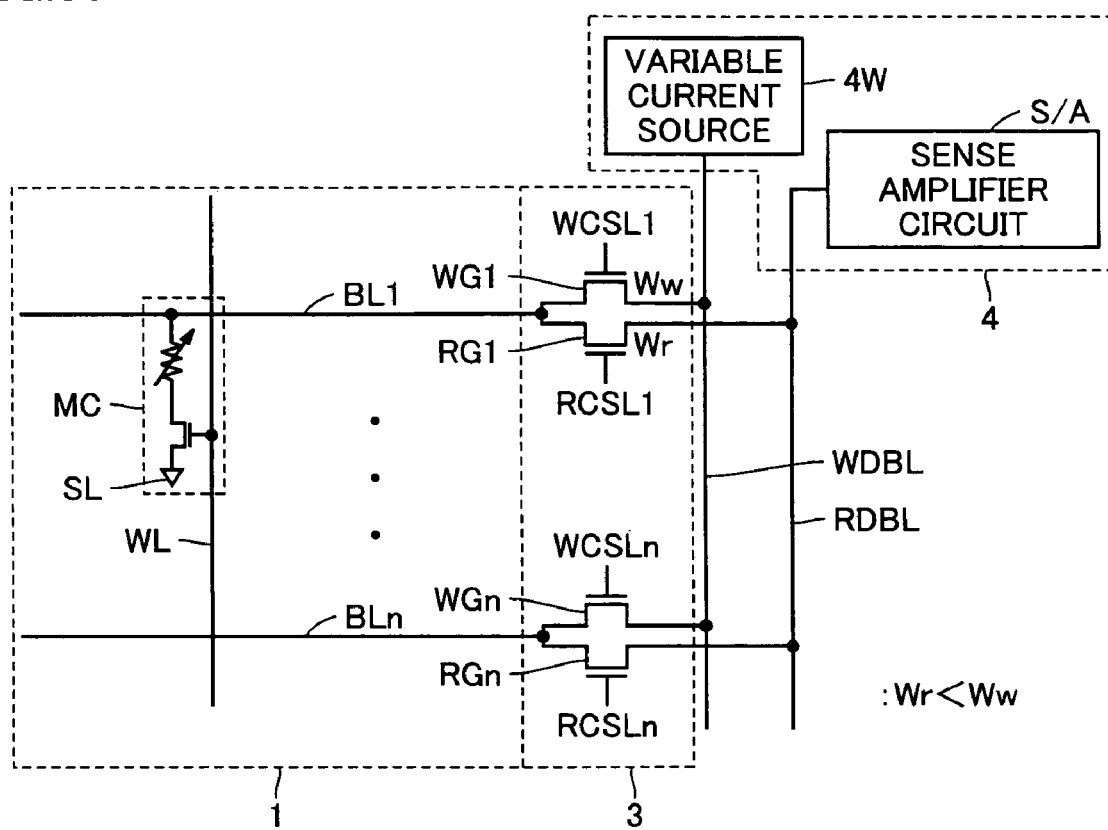
FIG. 55 schematically shows a configuration of a main portion of a nonvolatile semiconductor memory device according to a sixth embodiment of the invention FIG. 56 schematically shows a configuration of a main portion of a nonvolatile semiconductor memory device according to a seventh embodiment of the invention.

FIG. 55 schematically shows a structure of a main portion of a nonvolatile semiconductor memory device according to a sixth embodiment of the invention. In the construction shown in FIG. 55, memory cells MC are arranged in rows and columns in a memory cell array 1. Word lines WL are arranged corresponding to the memory cell rows, respectively, and bit lines BL (BL1, . . . BLn) are arranged corresponding to the memory cell columns, respectively. FIG. 55 representatively shows memory cell MC arranged corresponding to a crossing of word line WL and bit line BL1. Memory cell MC has an access transistor coupled to source line SL, and a variable resistance element including a phase change material element and being connected to bit line BL1. In memory cell array 1, the extending direction of source line SL and the structure of memory cell MC may be the same as those in any one of the first to fourth embodiment already described.

Column select circuit 3 includes write column select gates WG1-WGn provided corresponding to bit lines BL1-BLn and made selectively conductive according to write column select signals WCSL1-WCSLn to connect corresponding bit lines BL1-BLn to write data line WDBL, and read column select gates RG1-RGn provided corresponding to bit lines BL1-BLn and made selectively conductive in response to read column select signals RCSL1-RCSLn to connect corresponding bit lines BL1-BLn to read data line RDB. Each of write column select gates WG1-WGn has a channel width Ww larger than a channel width Wr of read column select gates RG1-RGn.

Write data line WDBL is coupled to variable current source 4W included in write/read circuit 4, and read data line RDBL is coupled to sense amplifier circuit S/A included in write/read circuit 4.

As shown in FIG. 55, write data line WDBL is separately provided read data line RDBL. Read data line RDBL is not connected to variable current source 4W nor to write column select gates WG1-WGn. Therefore, read data line RDBL can be supplied with the read current in the data read operation without an influence of parasitic capacitances of the write related circuitry, so that the read current can be changed rapidly to achieve fast reading.

By sufficiently increasing the channel widths Ww of write column select gates WG1-WGn, it is possible to allow a large write current supplied from variable current source 4W to flow with a sufficient margin, so that fast data writing can be performed.

When read column select gates RG1-RGn each have small channel width Wr, it is possible to suppress flow of a large read current when the read current flows through the memory cell in the low resistance state.

FIG. 55 shows a construction, in which writing and reading of one-bit data is performed. However, the construction shown in FIG. 55 can likewise be applied to the construction for performing writing/reading of data of multiple bits in parallel. In this case, write data line WDBL and read data line RDBL are provided for each data bit.

According to the sixth embodiment of the invention, as described above, the write data line and the read data line are provided separately from each other, and the write column select gate and the read column select gate are provided separately from each other. Consequently, a large write current can be sufficiently supplied fast, and the read current can be changed fast without an influence of the parasitic capacitance of the write column select gates. Thus, the fast reading can be achieved.

Seventh Embodiment

Figure 56:
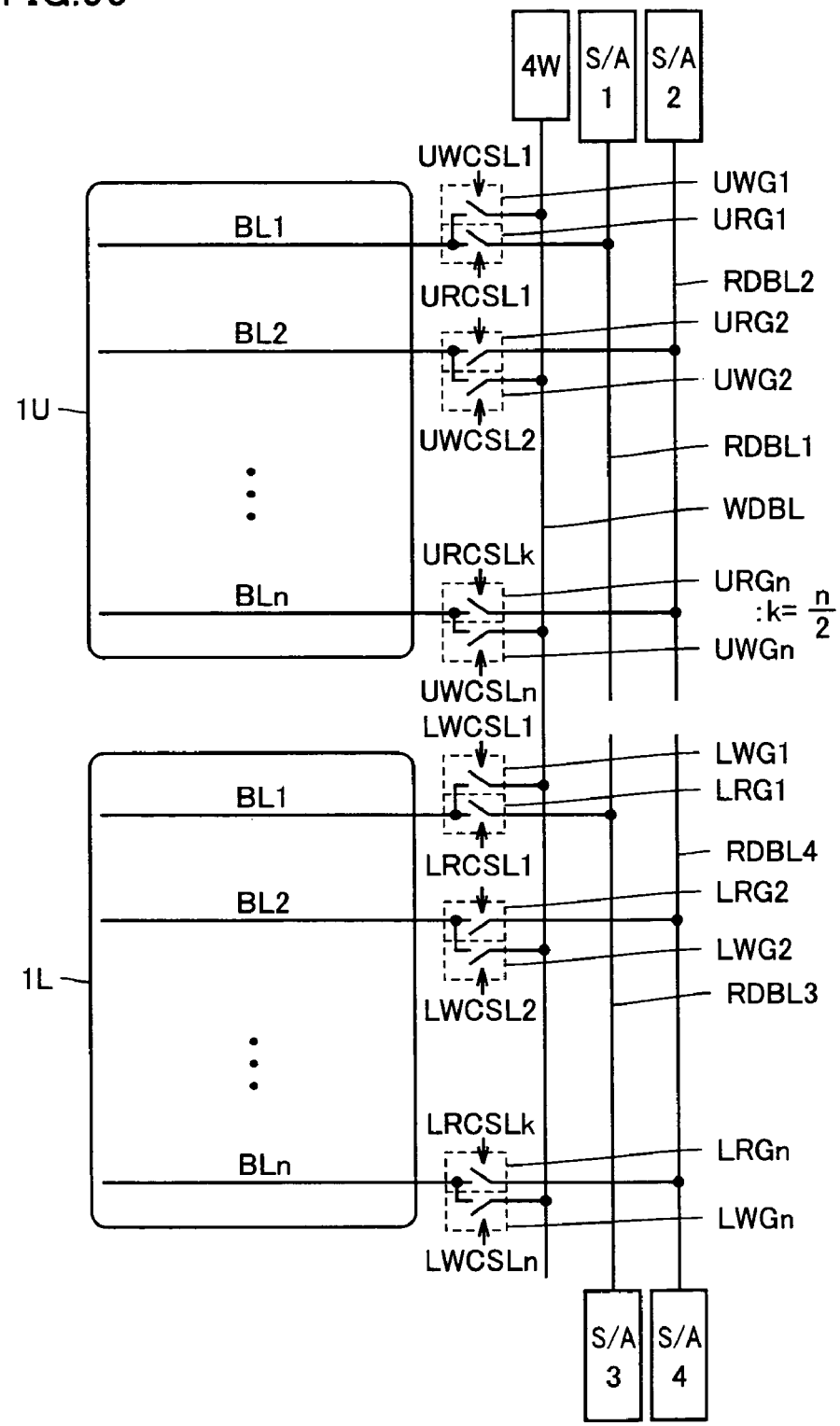

FIG. 56 schematically shows a construction of a main portion of a nonvolatile semiconductor memory device according to a seventh embodiment of the invention. In FIG. 56, a memory cell array is divided into two memory sub-arrays 1U and 1L. Bit lines BL1-BLn are arranged in each of memory sub-arrays 1U and 1L. For memory sub-array 1U, read data lines RDBL1 and RDBL2 are arranged in a direction crossing the bit line. For memory sub-array 1L, read data lines RDBL3 and RDBL4 are arranged in a direction crossing bit lines BL. Sense amplifier circuits S/A1-S/A4 are provided corresponding to read data lines RDBL1-RDBL4, respectively.

Write data line WDBL is provided in common to memory sub-arrays 1U and 1L and in a direction crossing the bit lines. Write data line WDBL has an end coupled to variable current source 4W. Memory sub-array 1U is provided with write column select gates UWG1-UWGn provided corresponding to bit lines BL1-BLn and made selectively conductive in response to write column select signals UWCL1-UWCLn to connect corresponding bit lines BL1-BLn to write data line WDBL, and read column select gates URG1-URGn provided corresponding to bit lines BL1-BLn, respectively, and coupling bit lines in selected columns to read data lines RDBL1 and RDBL2 in the data read operation.

Read column select gates URG1-URGn supply read column select signals URCSL such that adjacent bit lines receive the same read column select signal URCSL. In FIG. 34, read column select gates URG1 and URG2 are supplied with the same read column select signal URCSL1, and bit lines BL1 and BL2 are coupled to read data lines RDBL1 and RDBL2 when bit lines BL1 and BL2 are selected, respectively. Read column select gate URGn arranged on bit line BLn receives read column select signal URCSLk, and bit line BLn, where n is equal to 2×k (n=2×k), is coupled to read data line RDBL2 when selected.

Memory sub-array 1L includes write column select gates LWG1-LWGn provided corresponding to bit lines BL1-BLn, and made conductive in response to write column select signals LWCSL1-LWCSLn to couple corresponding bit lines BL1-BLn to write data line WDBL. Memory sub-array 1L further includes read column select gates LRG1-LRGn provided corresponding to bit lines BL1-BLn, respectively, and coupling a selected column to read data line RDBL3 or RDBL4 in the data read operation.

Each of read column select signals LRCSL1-LRCSLk is applied to read column select gates provided corresponding to adjacent bit lines, and accordingly, the selected bit line pair is coupled to internal read data lines RDBL3 and RDBL4. In FIG. 56, read column select signal LRCSL1 is applied commonly to read column select gates LRG1 and LRG2, so that selected bit lines BL1 and BL2 are coupled to read data lines RDBL3 and RDBL4, respectively. Read column select gate LRGn is selectively turned on in response to read column select signal LRCSLk, to couple bit line BLn to read data line RDBL4.

A decode circuit (not shown) selects one-bit data from the data of four or two bits read in parallel by sense amplifier circuits S/A1-S/A4, and thereby produces the read data.

According to the data line structure shown in FIG. 56, between selected memory cells for the write data (the memory cells simultaneously selected for one bit of data) and the memory cells selected for the read data, the number of memory cells is made greater, to reduce the number of read column select gates connected to each of read data lines RDBL1-RDBL4, as compared to the write column selected gates. Accordingly, the stray capacitances of read data lines RDBL1-RDBL4 can be reduced so that the data reading can be performed faster.

Since the read data lines are formed into a divided structure corresponding to respective memory sub-arrays 1U and 1L, the interconnection length can be reduced, and the stray capacitance of the read data lines can be reduced so that faster access can be achieved.

In each of memory sub-arrays 1U and IL shown in FIG. 56, the memory cell structure and the source line arrangement in any one of the foregoing first to fourth embodiments can be employed.

According to the seventh embodiment of the invention, as described above, the paths (the internal data lines and the column select gates) for writing the internal data are arranged separately from the paths for reading the internal data, and the bit lines simultaneously selected for reading data are larger in number than the bit lines simultaneously selected for writing data. Further, the selected bit lines are connected to the different internal read data lines, respectively. Accordingly, the stray capacitance of the read data line can be smaller than that of the write data line, and therefore fast reading is achieved.

The memory cell array is divided into the sub-arrays, and the read data lines are divided corresponding to the respective divided sub-arrays so that the stray capacitance of the read data lines can be further reduced, and fast access can be achieved.

For a way configuration for the data bits (a configuration of further selecting one bit from the bit lines simultaneously and internally selected for one bit of external data), it is suffice to use a predetermined number of bits among the column address signal bits for selecting the bit lines depending on the way number (the number of the bit lines simultaneously and internally selected for one bit of external data), while using the remaining column address signal bits for selecting one bit data from the simultaneously selected bits.

Eighth Embodiment

Figure 57:
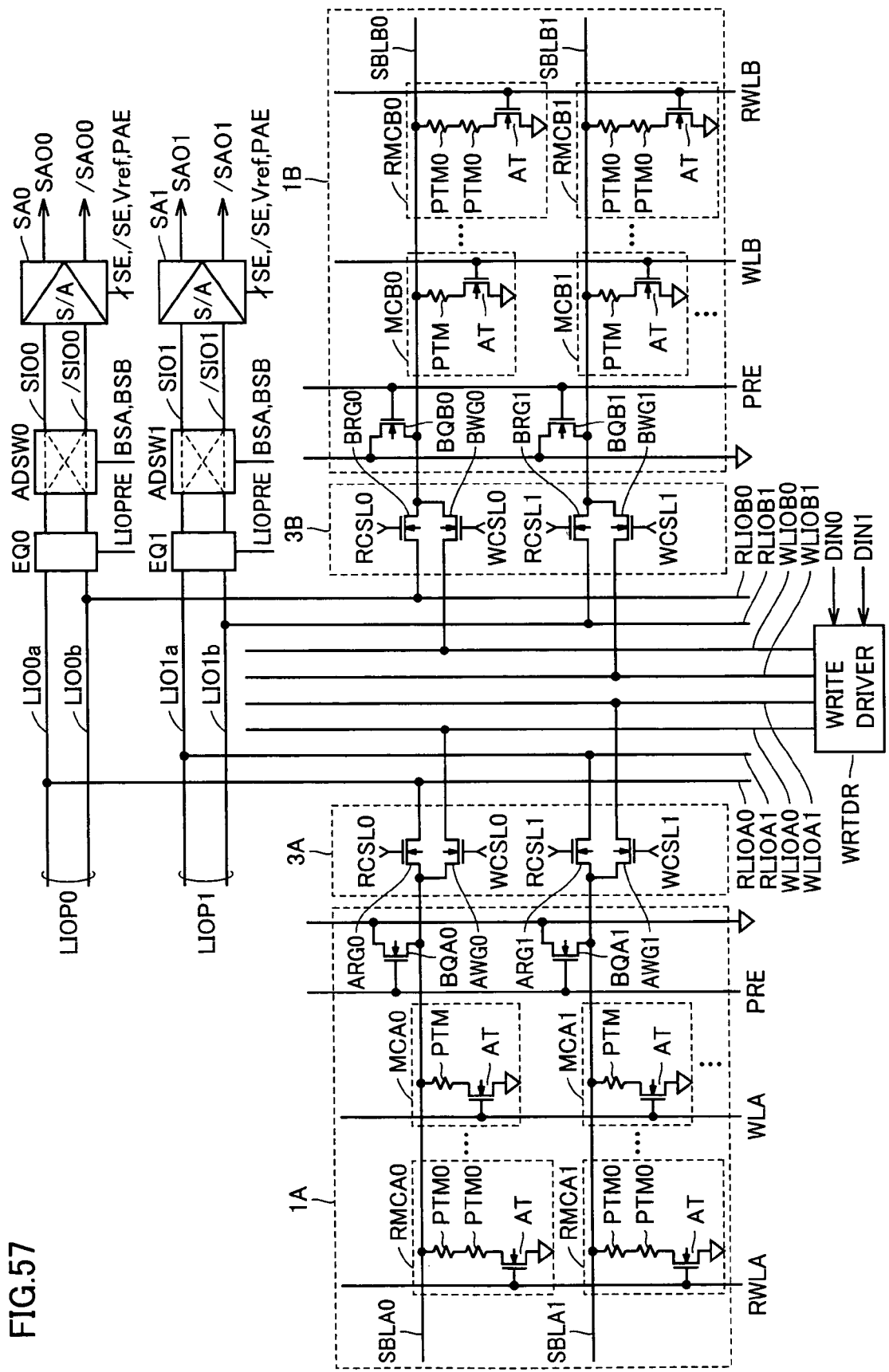
FIG. 57 schematically shows a configuration of a main portion of a nonvolatile semiconductor memory device according to an eighth embodiment of the invention.

FIG. 57 schematically shows a construction of a main portion of a nonvolatile semiconductor memory device according to an eighth embodiment of the invention. In FIG. 57, a memory cell array is divided into two memory arrays 1A and 1B. In each of memory arrays 1A and 1B, memory cells MC are arranged in rows and columns, and FIG. 57 representatively shows memory cells for data storage (normal memory cells) arranged in one row and two columns. In memory array 1A, memory cells MCA0 and MCA1 are commonly connected to word line WLA, and variable resistance elements PTM including the phase change material elements of memory cells MCA0 and MCA1 are connected to sub-bit lines SBLA0 and SBLA1, respectively. The source lines of access transistors AT of memory cells MCA0 and MCA1 may be arranged as in any one of the first to fourth embodiments. Thus, the source line may be parallel to the word line, or may be parallel to the bit line.

In memory array 1A, reference cells RMCA0 and RMCA1 are aligned to the (normal) memory cells. Reference cells RMCA (RMCA0 and RMCA1) are aligned in the row direction, and access transistors AT thereof are connected to reference word line RWL. In each of reference memory cells RMCA0 and RMCA1, two variable resistance elements PTM0 in the low resistance state are connected in series between access transistor AT and a corresponding sub-bit line SBLA0 or SBLA1.

For sub-bit lines SBLA0 and SBLA1, sub-bit line precharge transistors BQA0 and BQA1 are provided for precharging sub-bit lines SBLA0 and SBLA1 to the ground voltage level in response to a sub-bit line precharge instruction signal PRE. Similarly to memory array 1A, in memory array 1B, memory cells MCB0 and MCB1 are aligned in the row direction, access transistors AT are connected to word line WLB and variable resistance elements PTM are connected to corresponding sub-bit lines SBLB0 and SBLB1, respectively.

Reference cells RMCB0 and RMCB1 are aligned to memory cells MCB0 and MCB1, respectively, and are arranged in the respective columns. In each of reference cells RMCB0 and RMCB1, two variable resistance elements (including the phase change material elements) PTM0 in the low resistance state are connected in series, and reference word line RWLB is commonly connected to access transistors of these reference cells RMCB0 and RMCB1.

Sub-bit line precharge transistors BQB0 and BQB1 are provided corresponding to sub-bit lines SBLB0 and SBLB1 for precharging the corresponding sub-bit lines to the ground voltage level in response to sub-bit line precharge instruction signal PRE.

The internal data lines transmitting the write/read currents are arranged in a region between memory arrays 1A and 1B. For memory array 1A, read data lines RLIOA0 and RLIOA1 as well as write data lines WLIOA0 and WLIOA1 are arranged. For memory array 1B, read data lines RLIOB0 and RLIOB1 as well as write data lines RLIOB0 and WLIOB1 are arranged.

Since the write and read data lines separate from each other are arranged for each of memory arrays 1A and 1B, loads on the read data lines can be reduced. A write driver WRPDR is coupled to write data lines WLIOA0, WLIOA1, RLIOB0 and WLIOB1. Write driver WRTDR has a configuration similar to that of the variable current source shown in FIG. 2, produces the write current according to internal write data DIN0 and DIN1, and transmits the write current thus produced to the write data line provided for a selected memory array.

In the construction shown in FIG. 57, two-bit parallel writing and two-bit parallel reading are performed. A column select circuit 3A for memory array 1A includes a read column select gate ARG0 and a write column select gate AWG0 for sub-bit line SBLA0, and a read column select gate ARG1 and a write column select gate AWG1 for sub-bit line SBLA1. Read column select gate ARG0 connects sub-bit line SBLA0 to read data line RLIOA0 according to a read column select signal RCSL0, and read column select gate ARG1 connects sub-bit line SBLA1 to read data line RLIOA1 according to a read column select signal RCSL1.

Write column select gate AWG0 connects sub-bit line SBLA0 to write data line WLIOA0 according to a write column select signal WCSL0, and write column select gate AWG1 connects sub-bit line SBLA1 to write data line WLIOA1 according to write column select signal WCSL1.

A column select circuit 3B for memory array 1B includes a read column select gate BRG0 and a write column select gate BWG0 for sub-bit line SBLB0, and a read column select gate BRG1 and a write column select gate BWGL for sub-bit line SBLB1. Read column select gates BRG0 and BRG1 couple sub-bit lines SBLB0 and SBLB1 to read data lines RLIOB0 and RLIOB1 according to read column select signals RCSL0 and RCSL1, respectively.

Write column select gates BWG0 and BWG1 connect sub-bit lines SBLA0 and SBLB1 to write data lines WLIOA0 and WLIOB1 according to write column select signals WCSL0 and WCSL1, respectively.

Column select circuits 3A and 3B are commonly supplied with the column select signal to select in parallel the sub-bit lines on the corresponding columns. When a (normal) memory cell is selected in one of memory arrays 1A and 1B, the reference cell is selected in the other memory array. Reference cells RMC (RMCA0, RMCA1, RMCB0 and RMCB1) are formed in the same manufacturing steps as normal memory cells MC (MCA0, MCA1, MCB0 and MCB1), and have the same structures, configurations and characteristics as the memory cells MC. Therefore, reference cell RMC has the same temperature characteristics as memory cell MC, and produces a reference current subject equivalently to temperature compensation accurately for the memory cell current.

Read data lines RLIOA0 and RLIOA1 are connected to local data lines LIO0a and LIO1a, respectively, and read data lines LIOB0 and LIOB1 are connected to local data lines LIO0b and LIO1b, respectively. One of paired local data lines LIO0a and LIO0b transmits the memory cell read current, and the other transmits the reference current flowing through the reference cell. Likewise, the memory cell current flows through one of local data lines LIO1a and LIO1b, and the reference cell current flows through the other. Fast reading can be achieved by utilizing the reference currents on local data line pair LIOP0 comprised of local data lines LIO0a and LIO0b as well as local data line pair LIOP1 comprised of local data lines LIO1a and LIO1b.

The data read circuitry includes a data line equalize circuit EQ0 which precharges and equalizes local data lines LIO0a and LIO0b to a predetermined potential according to a precharge instruction signal LIOPRE, a data line switch circuit ADSW0 for switching a connection path between local data lines LIO0 and LIO0b and sense input lines SIO0 and /SIO0 according to array select signals BSA and BSB, and a sense amplifier circuit (S/A) SA0 for differentially amplifying the signals on sense input lines SIO1 and /SIO0 to produce internal read data SAOA and /SAOA.

Likewise, for local data lines LIO1a and LIO1b, there are arranged a data line equalize circuit EQ1 for precharging and equalizing local data lines LIO1a and IO1b to a predetermined potential according to precharge instruction signal LIOPRE, a data line switch circuit ADSW1 for switching a connection path between local data lines LIO1a and LIO1b and sense input lines SIO1 and /SIO1 according to array select signals BSA and BSB, and a sense amplifier circuit (S/A) SA1 for differentially amplifying the signals on input lines SIO1 and /SIO1 to produce internal read data SAOB and /SAOB.

For sense amplifier circuits SA0 and SA1, selected memory cells MC are coupled to sense input lines SIO0 and SIO1 and the reference cells are coupled to complementary sense input lines /SIO0 and /SIO1, respectively, for accurately and quickly performing data reading. Depending on which of memory arrays 1A and 1B is selected the reference cell is selectively connected to the different local data lines. For sense amplifier circuits SA0 and SA1, data line switch circuits SW00 and SW1 are arranged for coupling the selected memory cells to sense input lines SIO and SIO1, respectively.

Sense amplifier circuits SA0 and SA1 have substantially the same structure as the sense amplifier circuit (S/A) shown in FIG. 32, and are activated to perform the sense operation when sense amplifier activating signals SE and /SE are made active. Reference voltage VRef is a reference voltage for restricting the memory cell current, and preamplifier activating signal PAE is an output control signal for activating the differential amplifier (AMP) at the output stage.

In order to simplify the following description, it is assumed, on the change quantity of the resistance of variable resistance element PTM formed of the phase change element, that the resistance values in the low and high resistance states are about 10 KΩ and about 1000 KΩ, respectively. When setting the reference resistance value of the reference cell to an intermediate resistance value, accordingly, the resistance value of reference cell RMC comes to have about 500 KΩ. In this case, the current flowing through the reference cell is extremely small. When the storage data of the memory cell in the high resistance state is to be read, the memory cell read current is small, and a difference between the reference cell current and the memory cell read current becomes small, so that the accurate sensing cannot be achieved.

In the case of reading the data in the current sensing method, the optimum point of the reference current is equal to the intermediate value between the memory cell currents which flow through the memory cells in the high and low resistance states, respectively. In the data read operation, If the voltage on sub-bit line SBL is set (precharged) to 0.1 V and the resistance element in the low resistance state is set to 10 KΩ, the current flowing through the memory cell in the low resistance state becomes 10 μA (microamperes). In the case where 1000 KΩ is set for the high resistance state, the current flowing through the memory cell in the high resistance state is 0.1 μA. When the memory cell in the high resistance state is assumed to have an infinite resistance and substantially zero current flows, then the intermediate current attains 5 μA. When the bit line read voltage is 0.1 V, the resistance value for producing the intermediate current described above is 20 KΩ. Therefore, in reference cell RMC, the resistance value producing the intermediate current can be achieved by serially connecting two variable resistance elements PTM0 each in the low resistance state. The phase change material element in the low resistance state is in the crystallized state and thus in the stable state, and therefore is greatly resistant to the read disturbance. Accordingly, even when reference cells RMC are selected more times as compared with the number of times that the normal memory cells are selected, the resistance value of the reference cell does not substantially change, and the reference current can be stably supplied.

Figure 58:
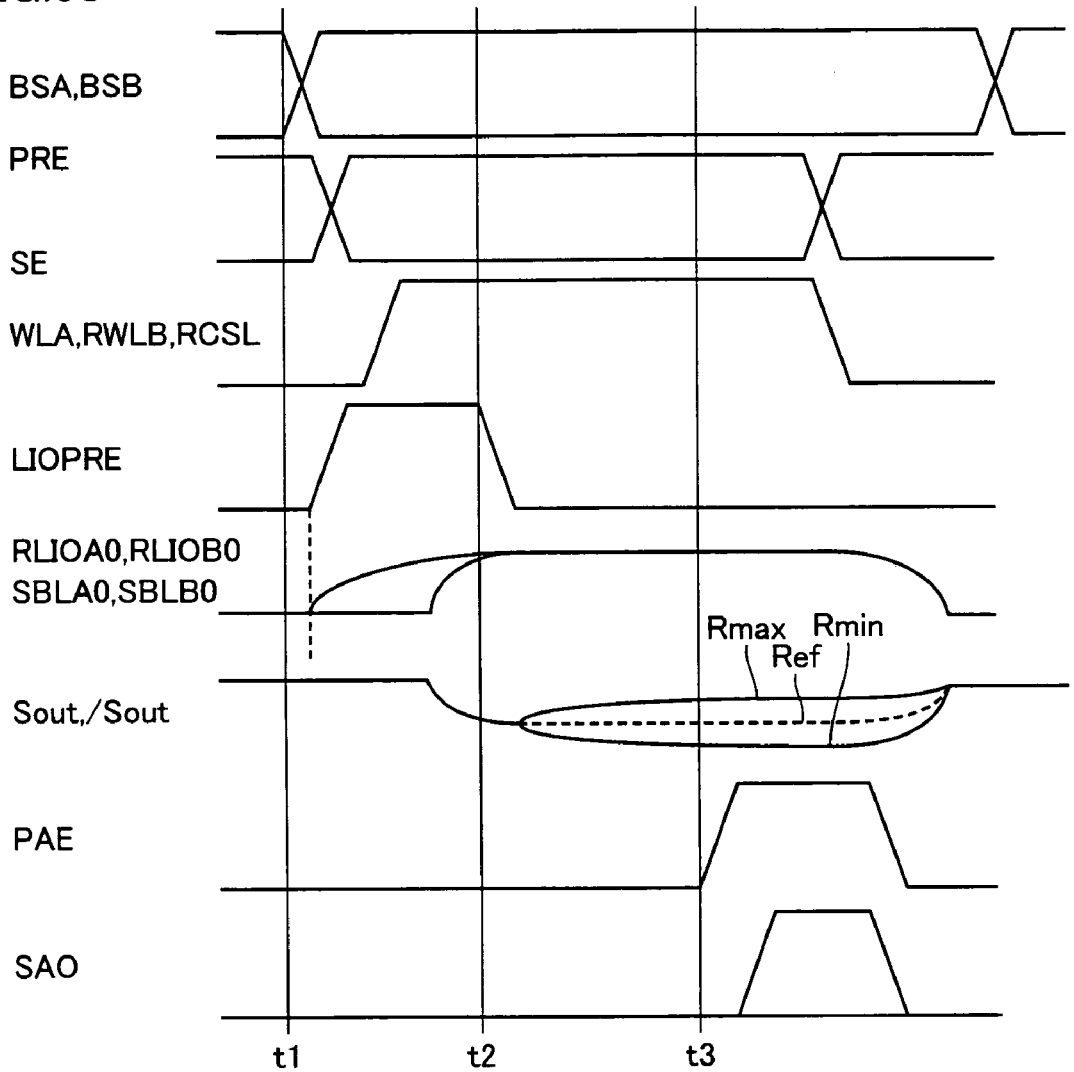
FIG. 58 is a signal waveform diagram representing data reading operation of the nonvolatile semiconductor memory device shown in FIG. 57.

FIG. 58 is a signal waveform diagram representing the operation for column reading in the nonvolatile semiconductor memory device shown in FIG. 57. Referring to FIG. 58, an operation for data reading of the nonvolatile semiconductor memory device shown in FIG. 57 will now be described. Here, FIG. 58 shows a signal waveform of a portion related to reading of one-bit data.

Before time t1, the nonvolatile semiconductor memory device is in a standby state, the sub-bit line precharge instruction signal PRE is at the H level, sub-bit line equalize transistors BQA0, BQA1, BQB0 and BQB1 are all conductive, and all sub-bit lines SBLA0, SBLA1, SBLB0 and SBLB1 are precharged to the ground voltage level. In data line equalize circuits EQ0 and EQ1, the precharge transistors are active, and local data lines LIO0a, LIO0b, LIO1a and LIO1b are all held at the ground voltage level. Sense amplifier circuits SA0 and SA1 are inactive, and data line switch circuits ADSW0 and ADSW2 set their connection paths to the initial state (which may be a high-impedance state) according to array select signals BSA and BSB, respectively.

At time t1, the address signal is input, sense activating signal SE for sense amplifier circuits SA0 and SA1 becomes active according to the transition in the address signal, and bit line precharge instruction signal PRE is driven to the inactive state. Accordingly, the precharge operations of the sub-bit line and the local data line stop. Then, local data line precharge instruction signal LIOPRE is made active, and equalize circuits EQ0 and EQ1 is made active to precharge read data lines RLIOA0, RLIOB0, RLIOA1 and RLIOB1 to a predetermined voltage level via local data lines LIOP0 and LIOP1. In accordance with the input of the address signal, the selected memory array including a memory cell to be selected is set, and array select signals BSA and BSB are produced.

Data line switch circuits ADSW (ADSW1 and ADSW0) set the connection path of the data lines according to array select signals BSA and BSB. When memory array 1A is selected, local data lines LIO0a and LIO1a are coupled to sense input lines SIO0 and SIO1, respectively. Conversely, when memory array 1B includes the memory cell to be selected, data line switch circuits ADSW0 and ADSW1 couple local data lines LIO0b and LIO1b to sense input lines SIO0 and SIO, respectively.

After the precharge operation starts, the word line and the reference word line are driven to the selected state according to array select signals BSA and BSB as well as the row address signal. It is now assumed that normal memory cell MC is selected in memory array 1A, and reference memory cell RMCB is selected in memory array 1B. According to the column address signal, read column select signals RCSL0 and RCSL1 are driven to the selected state, sub-bit lines SBLA0 and SBLA1 are connected to read data lines RLIOA0 and RLIOA1, and sub-bit lines SBLB0 and SBLB1 are connected to read data lines RLIOB0 and RLIOB1, respectively. Concurrently therewith, word line WLA is driven to the selected state, and reference word line RWLB is driven to the selected state. According to the selection of the sub-bit line, the word line and the reference word line, the precharge currents supplied from equalize circuits EQ0 and EQ1 raises the voltages on the sub-bit lines to the predetermined potential level.

In sense amplifier circuits SA0 and SA1, P-channel MOS transistors PT13 and PT14 shown in FIG. 54 internally maintain read signals Sout and /Sout on initial sense outputs thereof at the power supply voltage level, respectively.

At time t2, data line precharge signal LIOPRE is rendered inactive, so that the currents corresponding to the storage data in memory cells MCA0 and MCA1 flow through sub-bit lines SBL0 and SBL1 to cause the potential changes on local data lines LIO0a and LIO1a in accordance with the drive currents of the memory cells, respectively. Reference cells RMCB0 and RMCB1 drive the intermediate current, and the potential levels on local data lines LIO0b and LIO1b lower according to the reference current.

Between initial sense outputs Sout and /Sout of each of sense amplifier circuits SA0 and SA1, a potential difference occurs according to the storage data (drive current) of the selected memory cell and the drive current of the reference cell. When the resistance value of the selected memory cell is in the high resistance state of Rmax, this resistance value is higher than resistance value Ref of the reference cell, and the drive current is small. Accordingly, the voltage level of internal signal Sout of each of sense amplifier circuits SA0 and SA1 becomes high. Conversely, when the selected memory cell is in the low resistance state of Rmin, the driving current of the memory cell is larger than the driving current of the reference cell, so that the potential level of internal signals Sout of each of sense amplifier circuits SA0 and SA1 further lowers.

When the potential difference corresponding to the drive currents of the reference cell and selected memory cell is sufficiently developed, preamplifier activating signal PAE is rendered active at time t3, and the differential amplifiers in sense amplifier circuits SA0 and SA1 is rendered active, so that read data SA0 (complementary data SAO and /SAO) corresponding to read signals Sout and /Sout at the sense initial outputs are produced.

The memory cells are arranged in a so-called open bit line structure, and the accurate data reading can be performed using the reference current.

Figure 59:
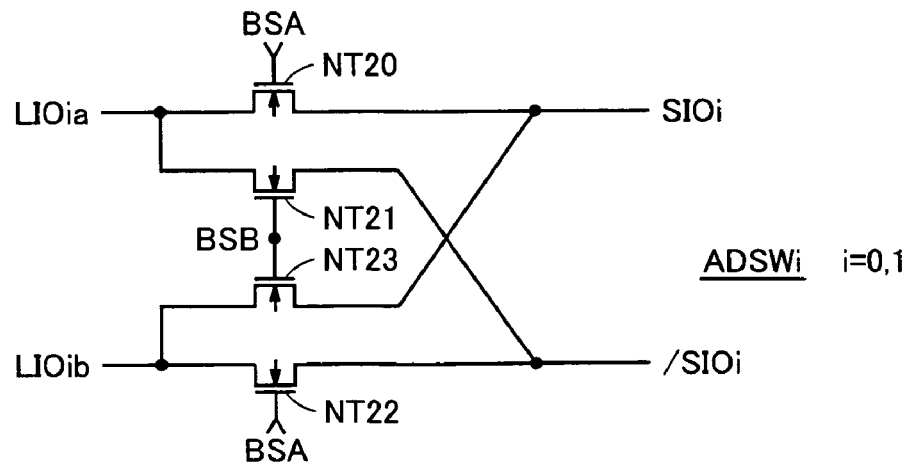
FIG. 59 shows an example of a configuration of a data line switch circuit shown in FIG. 57.

FIG. 59 shows an example of configuration of data line switch circuits ADSW0 and ADSW1 shown in FIG. 57. In FIG. 37, data line switch circuit ADSWi (i=0 or 1) includes an N-channel MOS transistor NT20 connecting a local data line LIOia to a sense input line SIOi according to array select signal BSA, an N-channel MOS transistor NT21 connecting local data line LIOia to sense input line /SIOi according to array select signal BSB, an N-channel MOS transistor NT22 connecting a local data line LIOib to sense input line /SIOi according to array select signal BSA, and an N-channel MOS transistor NT23 connecting local data line LIOib to sense input line SIOi according to array select signal BSB.

Array select signals BSA and BSB are produced using, e.g., the most significant bit (or least significant bit) of the row address signal, and array select signal BSA is driven to the H level when memory array 1A includes the selected memory cell. When memory array 1B includes the selected memory cell, array select signal BSB is driven to the H level. Therefore, when memory array 1A is selected, N-channel MOS transistors NT20 and NT22 are turned on, and local data lines LIOia and LIOb are connected to sense input lines SIOi and /SIOi, respectively. When memory array 1b is selected, array select signal BSB is driven to the H level, and local data lines LIOia and LIOb are connected to sense input lines /SIOi and SIOi.

By utilizing data line switch circuit ADSWi, sense amplifier circuit SAi can have the sense input lines SIOi and /SIOi connected to the selected memory cell and the reference cell, respectively, even when the reference cell is utilized in the open bit line structure.

Figure 60:
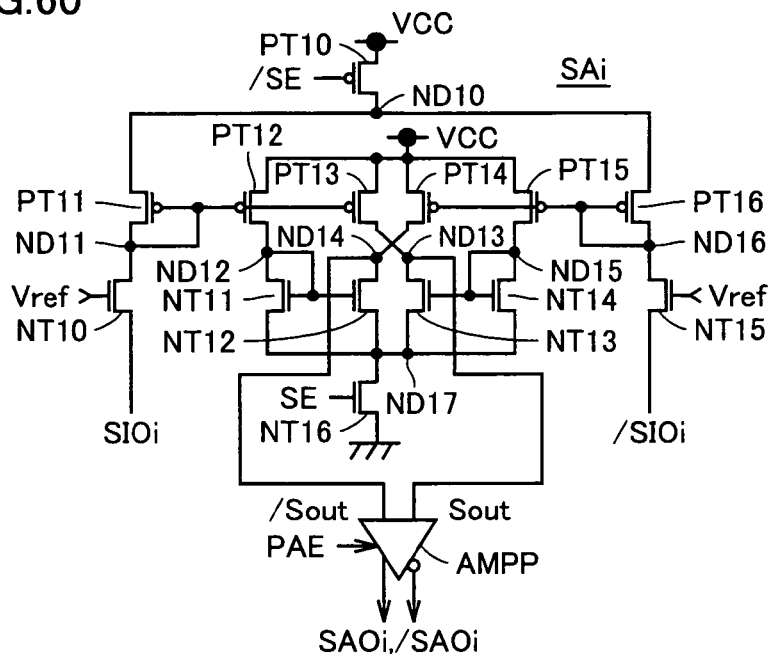
FIG. 60 shows a configuration of a sense amplifier circuit shown in FIG. 57.

FIG. 60 shows a structure of sense amplifier circuit SAi (i=0, 1) shown in FIG. 57. Sense amplifier circuit SAi shown in FIG. 60 differs from the sense amplifier circuit shown in FIG. 54 in the following configuration. MOS transistors NT10 and NT15 supplying the read current and reference current in the read operation are connected to sense input lines SIOi and /SIOi, and a differential amplifier (preamplifier) AMPP made activate in response to preamplifier activating signal PAE produces complementary signals SAOi and /SAOi when the differential amplifier performs the amplifying operation. Other configuration of sense amplifier circuit SAi shown in FIG. 60 is the same as that of sense amplifier circuit S/A shown in FIG. 54. Corresponding portions are allotted with the same reference numerals or characters, and description thereof is not repeated.

As shown in FIG. 60, when sense amplifier circuit SAi is inactive, sense input lines SIOi and /SIOi are at the ground voltage level so that nodes ND11 and ND16 attain the ground voltage level, and nodes ND13 and ND14 are precharged to the level of power supply voltage VCC. Thereby, initial stage sense outputs Sout and /Sout are at the level of power supply voltage VCC during standby.

Figure 61:
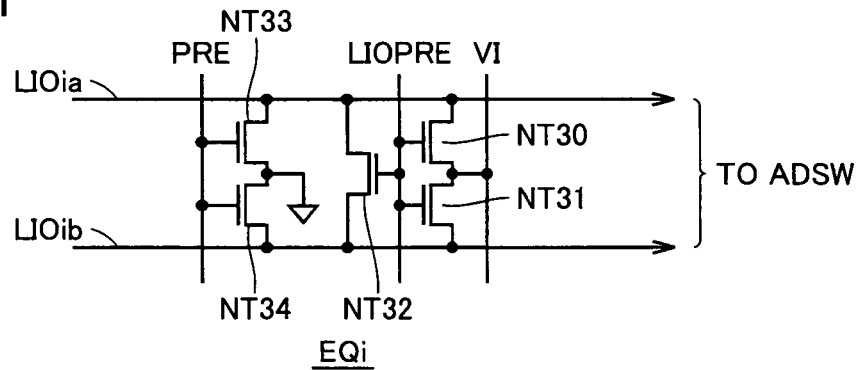
FIG. 61 shows an example of a configuration of a data line equalize circuit shown in FIG. 57.

FIG. 61 shows an example of the configuration of data line equalize circuit EQi (i=0 or 1). In FIG. 61, data line equalize circuit EQi includes N-channel MOS transistors NT30 and NT31 for transmitting a precharge voltage VI to local data lines LIOia and LIOb according to data line precharge signal LIOPRE, respectively, an N-channel MOS transistor NT32 electrically short-circuiting local data lines LIOia and LIOib according to data line precharge signal LIOPRE, and N-channel MOS transistors NT33 and NT34 for coupling local data lines LIOia and LIOib to the ground node according to the activation of sub-bit line precharge instruction signal PRE.

Precharge voltage VI is produced, e.g., by an N-channel MOS transistor which receives on its gate the reference voltage and operates in a source follower mode. By increasing the current driving power of the source follower mode transistor, precharge voltage VI can be set to the voltage level lower by the magnitude of the threshold voltage of the source follower mode transistor than the reference voltage, and the local data line, data read line and sub-bit line can be precharged to the predetermined potential level by the large current driving power.

In the case of the configuration of local data line equalize circuit EQi shown in FIG. 61, when local data line precharge instruction signal LIOPRE attains the H level, MOS transistors NT30 and NT32 precharge local data lines LIOia and LIOib to the level of voltage VI, respectively. During this operation, MOS transistors NT33 and NT34 are kept off. During standby, sub-bit line precharge instruction signal PRE is active, and local data lines LIOia and LIOib are precharged to the ground voltage level.

By utilizing the data line equalize circuit, as shown in FIG. 61, the local data line and the read data line can be reliably precharged to the ground voltage level even if sub-bit lines SBL is precharged while being isolated from read data lines RLIOAi and RLIOBi.

Figure 62:
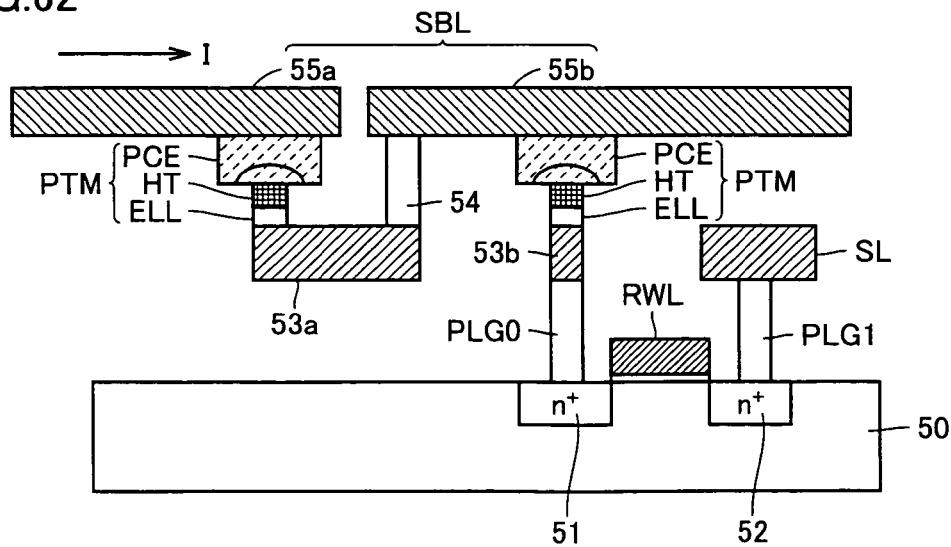
FIG. 62 schematically shows a sectional structure of a reference cell shown in FIG. 57.

FIG. 62 schematically shows a sectional structure of the reference cell shown in FIG. 57. A sectional structure of one reference cell is shown in FIG. 62.

In FIG. 62, n-type impurity regions 51 and 52 are formed being spaced from each other at the surface of a substrate region 50. An impurity region is not formed at the region corresponding to the position of the adjacent reference cell in substrate region 50. Impurity regions 51 and 52 are electrically connected to plugs PLG0 and PLG1 of a low resistance. Reference word line RWL is formed above the surface of the substrate region between plugs PLG0 and PLG1 with a gate insulating film (not shown) in between.

Source line SL is formed at a layer above the word line. Intermediate base layers 53b and 53a are formed in the same manufacturing steps as source line SL. Source line SL is electrically connected to plug PLG1, and intermediate base layer 53b is connected to plug PLG0.

An electrode layer ELL, heater layer HP and phase change material element PCE are successively stacked on each of intermediate base layers 53a and 53b. These phase change material element PCE, heater layer HT and electrode layer ELL form phase change element PTM. FIG. 62 shows a state in which crystal phase change occurs in a portion of phase change material element PCE in contact with heater layer HT. A volume of a region where the crystal phase change occurs can be changed by adjusting the region at which heat generated by heater layer HT arrives. Usually, in the phase change memory, it is not particularly required to cause the phase change over an entire phase change material element, and even a phase change in a partial region thereof can cause a sufficiently large change in resistance value.

A conductor 54 is connected to a region of intermediate base layer 53a different from the region to which phase change element PCE is connected. Conductive lines 55a and 55b of a low resistance formed of, e.g., second metal are arranged being spaced from each other above phase change material element PCE. Conductive lines 55a and 55b are formed in the same manufacturing steps as the sub-bit lines. Conductive line 55b is electrically connected to conductor 54. Conductive lines 55a and 55b formed into a divided structure form sub-bit line SBL.

In the operation of writing or reading the data, conductive line 55a supplies a current I, and a current flows from phase change element PTM through intermediate base layer 53a, conductor 54 and divided interconnection 55b. Two phase change elements PTM set to the low resistance state provide the structure in which the phase change elements in the low resistance state are connected in series.

For example, the reference cell is manufactured in the following steps. In normal memory cell forming steps, an access transistor is formed for one reference cell, and intermediate base layer 53a is formed for the other cell in steps of manufacturing source line SL. Conductor 54 is formed in steps of manufacturing phase change element PTM. Conductor 54 may be formed concurrently in the steps of forming the upper electrode of phase change element PTM and the bit line contact, or a part of conductor 54 may be formed in the same steps as electrode interconnection ELL. In the sub-bit line formation steps, a mask is formed for isolating a portion between conductive lines 55a and 55b, to form the sub-bit lines into the divided structure. Through the above series of steps, two phase change elements PTM can be connected in series. Without adding any additional step, the phase change elements in the low resistance state can be connected in series.

In the structure shown in FIG. 62, source line SL is perpendicular to sub-bit line SBL. However, source line SL may be parallel to sub-bit line SBL and in this case, intermediate base layers 53a and 53b are formed at positions displaced in the row direction from source line SL, and such a structure can be achieved that the two phase change elements in the low resistance state are connected in series while preventing the collision of source line SL with intermediate base layers 53a and 53b.

According to the eighth embodiment of the invention, as described above, the memory cell data is read in the open bit line structure, and the reference cell producing the reference current is formed by connecting the two phase change elements in the low resistance state in series. Accordingly, the reference current at the intermediate current value level can be produced reliably and stably without being influenced by the read disturbance. Thereby, the fast data reading can be performed, and reliability of the data reading can be improved.

Ninth Embodiment

Figure 63:
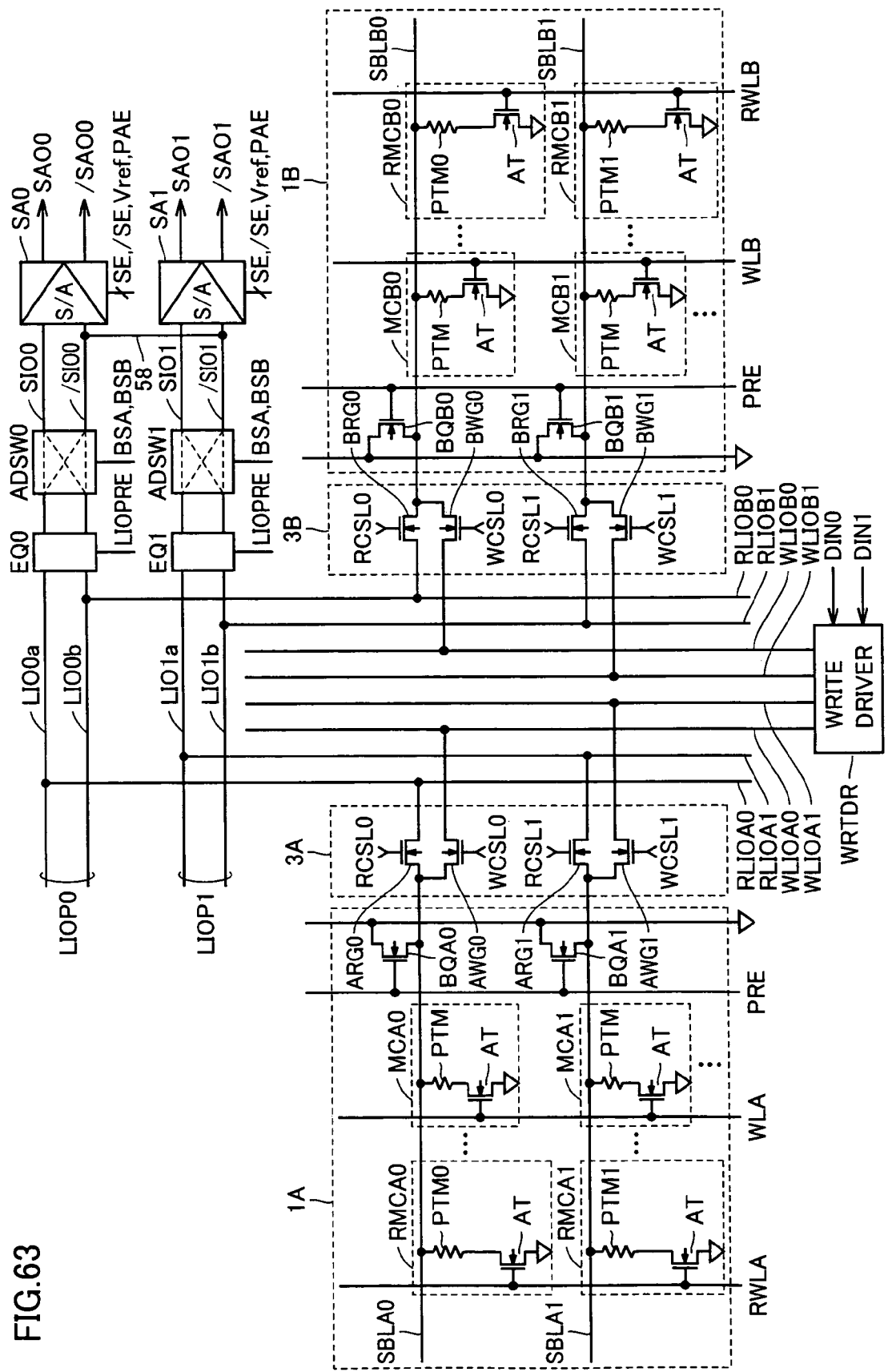
FIG. 63 shows a configuration of a main portion of a nonvolatile semiconductor memory device according to a ninth embodiment of the invention.

FIG. 63 schematically shows a construction of a main portion of a nonvolatile semiconductor memory device according to a ninth embodiment of the invention. In the construction shown in FIG. 63, reference cells RMCA0 and RMCA1 include phase change element PTM0 in the low resistance state and phase change element PTM1 in the high resistance state, respectively. Likewise, reference cells RMCB0 and RMCB1 in memory array 1B include phase change element PTM0 in the low resistance state and phase change element PTM1 in the high resistance state, respectively.

In sense amplifier circuits SA0 and SA1, short circuiting interconnection line 58 connects complementary sense input lines /SIO0 and SIO1 together. Other construction of the nonvolatile semiconductor memory device shown in FIG. 63 is the same as that of the nonvolatile semiconductor memory device shown in FIG. 57. Corresponding portions are allotted with the same reference numerals or characters, and description thereof is not repeated.

It is now assumed that the resistance value of phase change element PTM in the high resistance state included in memory cell MC (MCA or MCB) may vary from about 20 KΩ to about 500 KΩ due to variations in manufacturing parameters. Also, it is assumed that the precharge voltage (VI) of the bit line is 0.1 V in the data read operation.

In the sense operation, sense amplifier circuits SA0 and SA1 supply the read currents to local data lines LIO0a, LIO0b, LIO1a and LIO1b. Short circuiting interconnection line 58 combines the currents supplied from sense amplifier circuits SA0 and SA1 to local data lines LIO0b and LIO1b, respectively, and the current supplied from two sense amplifier circuits SA0 and SA1 flow to phase change elements PTM0 and PTM1 in the high resistance state. It is assumed that phase change element PTM1 in the high resistance state has a resistance value, e.g., of about 20 KΩ and a drive current of 5 µA, and phase change element PTM0 in the low resistance state has a resistance value of about 10 KΩ and a drive current of 10 µA. In this case, sense amplifier circuits SA0 and SA1 supply a total drive current of 15 µA so that each of sense amplifier circuits SA0 and SA1 supplies a current of 7.75 µA which is an average of the total drive current.

When phase change element PTM of memory cell MC (MCA or MCB) in the high resistance state has the resistance value higher than the resistance value (20 KΩ) of phase change element PTM1 in the high resistance state of the reference cell, the current flowing through the selected memory cell becomes smaller than 5 µA (e.g., 1 µA when the resistance value is 100 KΩ), and the difference to the reference current increases so that a sufficiently accurate reference current can be supplied to even such memory cell-in the high resistance state, for performing the reading of the memory cell data.

When phase change element PTM1 of memory cell MC (MCA or MCB) is in the low resistance state, the memory cell current of about 10 µA is driven so that a sufficiently large current difference occurs between sense amplifier circuits SA0 and SA1, leading to the accurate sense operation (in the amorphous state, the phase change element is in an unstable crystalline state and has a resistance value variable by about two orders of magnitude).

When phase change element PTM1 of the reference cell in the high resistance state has the resistance value of about 100 KΩ, the current that flows in this state is 1 µA, and the reference current is 5.5 µA so that the intermediate current can be produced further accurately to improve the reliability of reading.

The resistance value of phase change element PTM1 in the high resistance state of the reference cell is set to the intermediate resistance value which is lower than the resistance value of phase change elements PTM of normal memory cell (MCA or MCB) in the high resistance state in data storage, and which is much higher than the resistance value of the normal memory cell in the low resistance state. According to such setting, even when the reference cell is repetitively selected to cause the read current flow in data reading, the crystal phase of the reference cell is in the state comparatively close to the stable state, and the influence of the read disturbance can be suppressed.

According to the ninth embodiment of the invention, as described above, the reference cells are configured such that a reference cell in the high resistance state and a reference cell in the low resistance state are connected in parallel to the reference node of the sense amplifier circuit, and the reference current at the intermediate current level can be stably produced.

Tenth Embodiment

Figure 64:
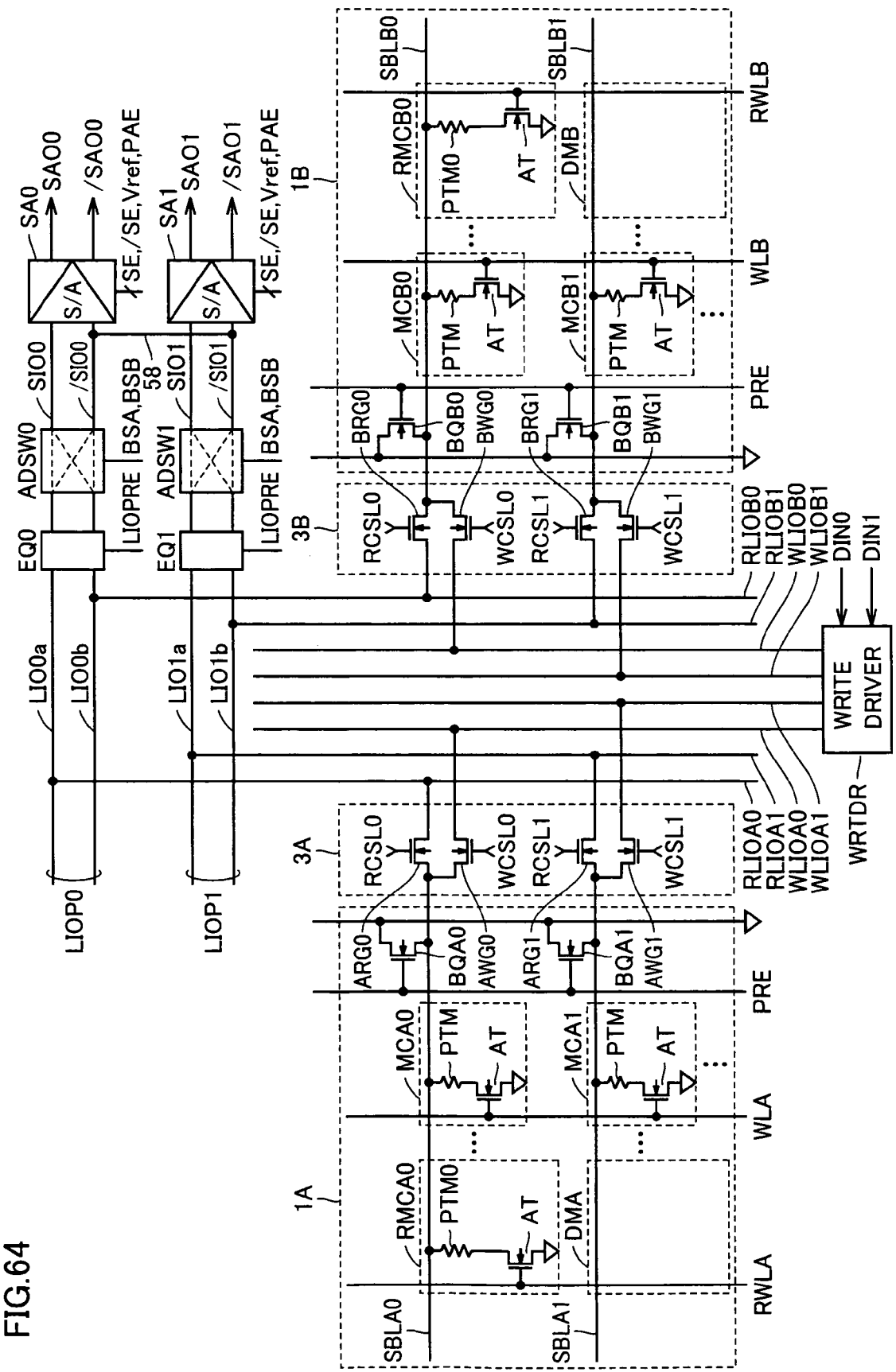
FIG. 64 shows a configuration of a main portion of a nonvolatile semiconductor memory device according to a tenth embodiment of the invention.

FIG. 64 schematically shows a structure of a main portion of a nonvolatile semiconductor memory device according to a tenth embodiment of the invention. The construction of the nonvolatile semiconductor memory device shown in FIG. 64 differs from that of the nonvolatile semiconductor memory device shown in FIG. 63 in the following points. A reference cell is not connected to sub-bit lines SBLA1 and SBLB1. Therefore, when reference word line RWLA is selected, sub-bit line SBLA1 enters an open state. When reference word line RWBLB is selected, sub-bit line SBLB1 enters an open state. The cell in this open state will be referred to as a "dummy cell" DM (DMA or DMB) hereinafter. Reference cells RMCA0 and RMCB0 connected to sub-bit lines SBLA0 and SBLB0 include phase change elements PTM0 in the low resistance state connected to sub-bit lines SBLA0 and SBLB0, respectively.

Other configuration of nonvolatile semiconductor memory device shown in FIG. 64 is the same as that of the nonvolatile semiconductor memory device shown in FIG. 63. Corresponding portions are allotted with the same reference numerals or characters, and description thereof is not repeated.

When the drive currents of reference cells RMCA0 and RMCB0 in the low resistance state are 10 µA and reference cells RMCA1 and RMCB1 in the low resistance state drives 0.1 µA, the reference current is 5.05 µA. However, the difference of about 0.05 µA does not exert a large influence on the sense operation, and therefore a current of 5 µA is produced as the reference current. Thus, in the case where sense amplifier circuits SA0 and SA1 supply the reference current to reference cell RMCA0, each of sense amplifier circuit SA0 and SA1 supplies the reference current of 5 µA. In this case, the driving current of the memory cell in the low resistance state in the normal memory cell MC (MCA or MCB) is 10 µA, and the data can be sufficiently read from the memory cell in the low resistance state. When the resistance value of normal memory cell MC (MCA or MCB) in the high resistance state is about 100 KΩ, the driving current of the selected (normal) memory cell is 1 µA. In this case, the reference current is likewise 5 µA, and a sufficiently large current difference is present so that sense amplifier circuits SA0 and SA1 can reliably perform the sense operation.

Therefore, in the configuration wherein the reference cell described above is achieved by the combination of the sub-bit line (dummy cell) in the open state and the reference cell (standard cell) in the low resistance state and the reference current is produced from the arithmetic average of the drive current of the reference cell (standard cell) in the low resistance state, the reference current exhibiting a sufficient current difference to the read data can be produced even when variations occur in resistance value of the normal memory cell in the high resistance state. Therefore, fast data reading can be performed without reducing the read margin.

Since the phase change element in the high resistance state is not used for the reference cell, the problem of read disturbance can be reliably avoided, and the intermediate current at a predetermined current level can be stably supplied as the reference current so that the data reading can be performed stably.

Eleventh Embodiment

Figure 65:
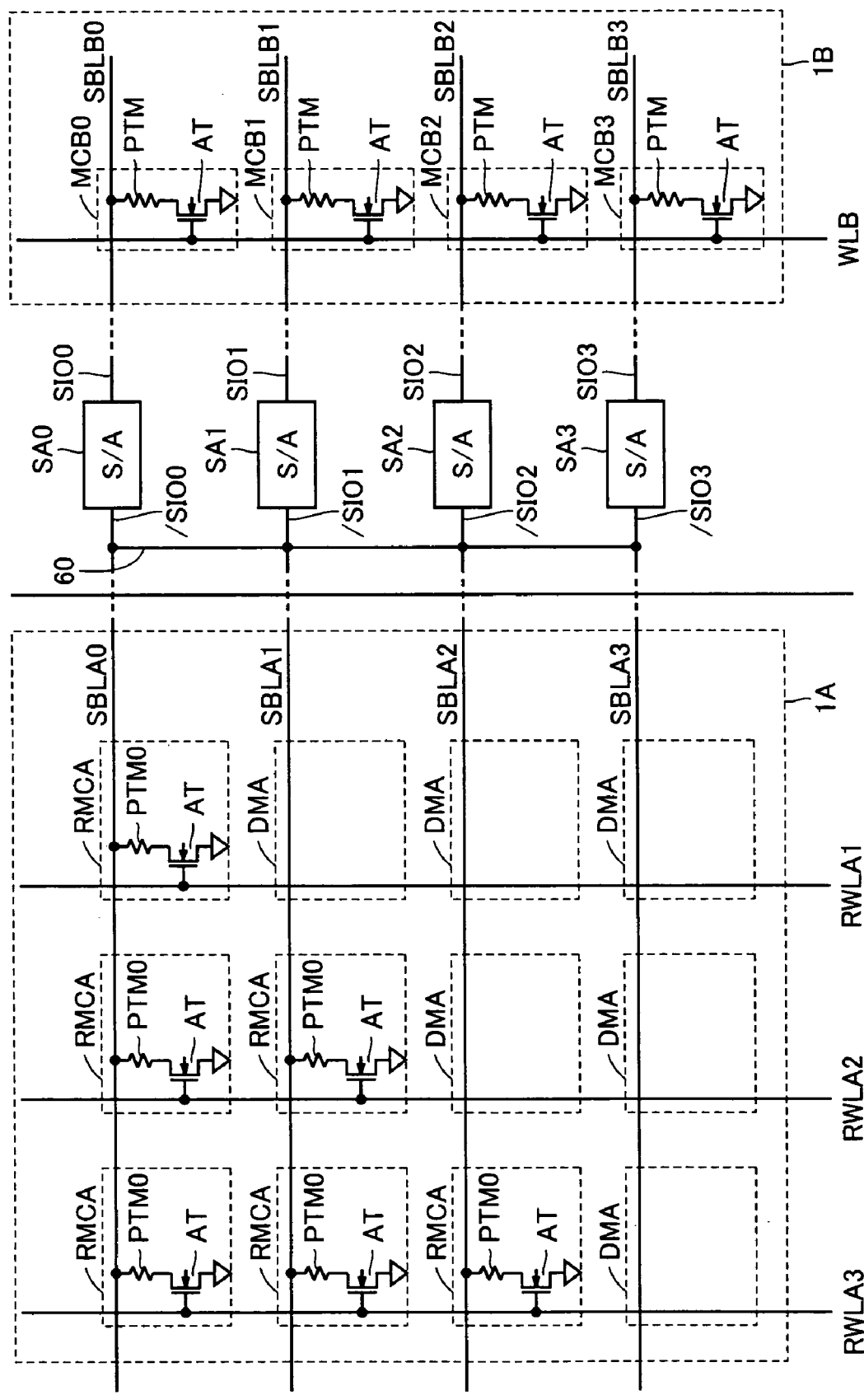
FIG. 65 schematically shows a configuration of an array portion of a nonvolatile semiconductor memory device according to an eleventh embodiment of the invention.

FIG. 65 schematically shows a construction of a main portion of a nonvolatile semiconductor memory device according to an eleventh embodiment of the invention. FIG. 65 schematically shows connections of read paths in the case where memory array 1A is used as a reference cell array, and memory array 1B includes a selected cell. In memory array 1A, three reference word lines RWLA1-RWLA3 are arranged crossing sub-bit lines SBLA0-SBLA3. Reference cells (standard cells) RMCA in the low resistance state are arranged corresponding to crossings between sub-bit line SBLA0 and reference word lines RWLA1-RWLA3, respectively. Standard (reference) cell RMCA includes phase change element PTM0 in the low resistance state and access transistor AT. The term "standard cell" is used as the term "reference cell" is used to indicate a combination of the dummy cell and the standard cell in the following description.

Standard (reference) cells RMCA are arranged corresponding to the crossings between sub-bit line SBLAM and reference word lines RWLA2 and RWLA3, respectively, and a dummy cells DMA formed of the sub-bit line in the open state and virtually implementing the high resistance state is arranged corresponding to the crossings between reference word line RWLA1 and sub-bit line SBLA1.

For sub-bit lines SBLA2, dummy cells DMA are arranged corresponding to the crossings with reference word lines RWLA1 and RWLA2, respectively, and standard cell RMCA is arranged corresponding to the crossings with reference word line RWLA3. For sub-bit line SBLA3, dummy cells DMA are arranged corresponding to the crossings with reference word lines RWLA1-RWLA3, respectively.

In memory array 1A, the memory cells each storing information are connected to sub-bit lines SBLA0-SBLA3, but are not shown in FIG. 65 for the sake of emphasizing the structure in which memory array 1A is used as the reference array supplying the reference current.

The memory cell stores four-valued data, and reference word lines RWLA1-RWLA3 are successively driven to the selected state in a predetermined sequence. Sub-bit lines SBLA0-SBLA3 are selected in parallel to flow the reference current, and the four-valued memory cell data of four bits is read in parallel.

In memory array 1B, memory cells MCB0-MCB3 are arranged corresponding to the crossings between word line WLB and sub-bit lines SBLB0-SBLB3, respectively. Each of memory cells MCB0-MCB3 includes phase change element PTM and access transistor AT.

Sub-bit lines SBLA0-SBLA3 are coupled to sense amplifier circuits (S/A) SA0-SA3 via complementary sense input lines /SIO0-/SIO3, respectively, and sub-bit lines SBLB0-SBLB3 are coupled to sense amplifier circuits (S/A) SA0-SA3 via sense input lines SIO0-SIO3, respectively.

In memory array 1B, the reference cells are arranged similarly to memory cell array 1A, and are arranged according to the connection and arrangement similar to that of standard cells RMCA and dummy cells DMA.

Complementary sense input lines /SIO0-SIO3 of sense amplifier circuits (S/A) SA0-SA3 are interconnected via a short-circuit line 60.

Figure 66:
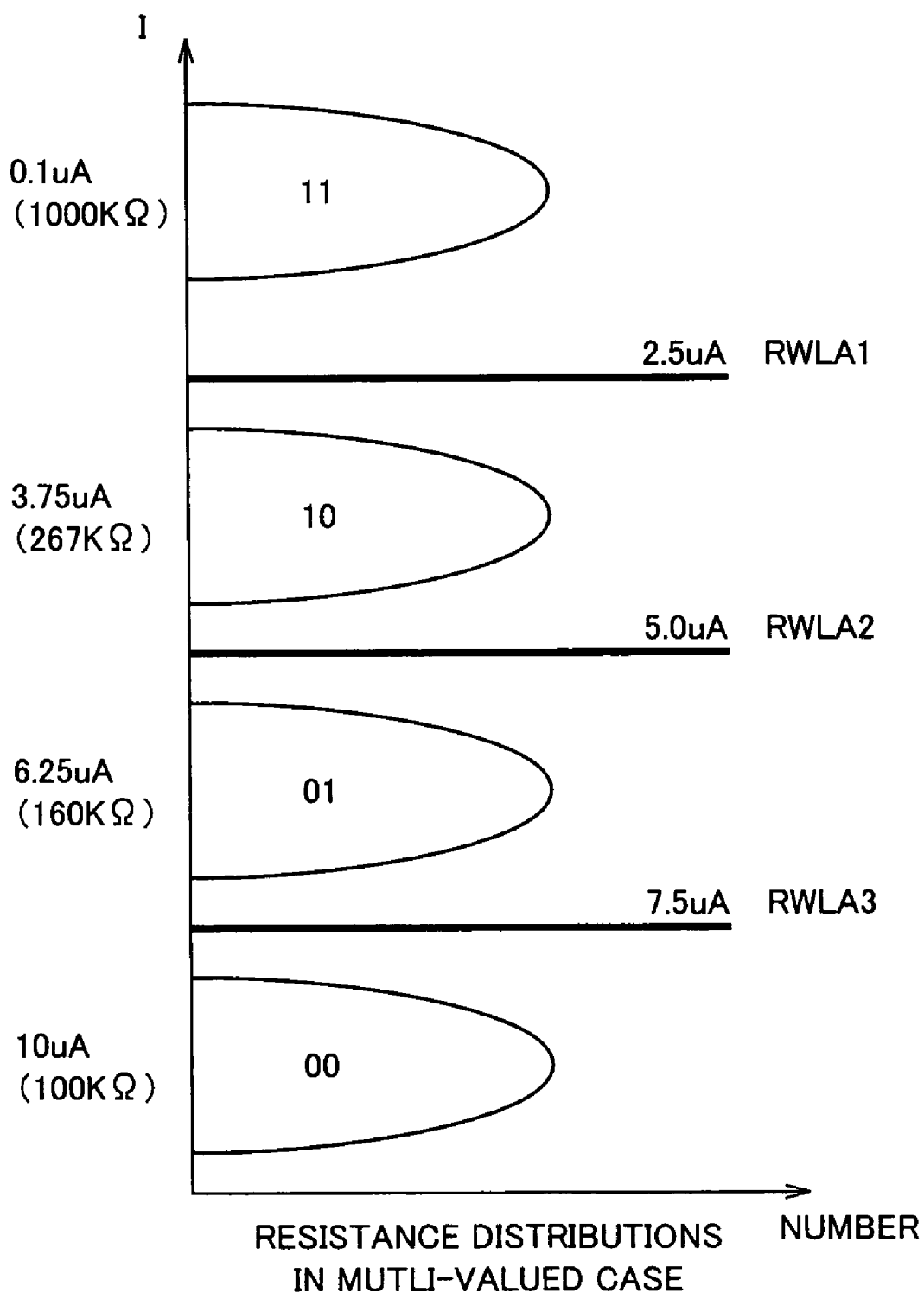
FIG. 66 illustrates a relationship between a drive current of the reference cell and storage data in the memory cell shown in FIG. 65.

FIG. 66 schematically shows a distribution of the drive current of the four-valued data stored in the memory cell. The ordinate represents the cell current I (or resistance value) flowing through the memory cell in the read operation, and the abscissa represents the number of memory cells. The memory cell storing data "00" exhibits the distribution with the cell current of 10 μA being a central driving current. The memory cell storing data "01" exhibits the distribution with cell current of 6.25 μA being a central current. The memory cell storing data "10" exhibits the distribution with cell current of 3.75 μA being a central driving current. The memory cell storing data "11" exhibits the distribution with a cell current of 0.1 μA being a central driving current.

As described above, the state of the crystal phase in the memory cell varies to exhibit the distributions over certain widths with 10 μA, 6.25 μA, 3.75 μA and 0.1 μA being the respective center values depending on the storage data. These currents of 10 μA, 6.25 μA, 3.75 μA and 0.1 μA correspond to the resistance values of 100 KΩ, 160 KΩ, 267 KΩ and 1000 KΩ, respectively.

For determining the storage data of the memory cell, a determination level is set with a margin for a boundary region of each data. Currents of 7.5 μA, 5.0 μA and 2.5 μA are used as the reference currents for the data (level) determination. The reference current value of 2.5 μA is intermediate between the cell current values of the memory cells storing data "11" and "10". The reference current value of 5.0 μA is intermediate between the cell current values of the memory cells storing data "10" and "01". The reference current value of 7.5 μA is intermediate between the cell current values of the memory cells storing data "01" and "00". The reference currents of 2.5 μA, 5.0 μA and 7.5 μA correspond to reference word lines RWLA1, RWLA2 and RWLA3, respectively.

Specifically, when reference word line RWLA1 shown in FIG. 65 is selected, standard cell RMCA and three dummy cells DMA are coupled in parallel to complementary input nodes /SIO0-/SIO3 of sense amplifier circuits SA0-SA3. Standard cell RMCA has phase change element PTM0 in the low resistance state, and is in the state corresponding to data "00". Therefore, standard cell RMCA can drive the cell current of 10 μA, and the currents supplied from four sense amplifier circuits SA0-SA3 flow to one standard cell RMCA so that each of sense amplifier circuits SA0-SA3 supplies a current of 10/4 μA. Therefore, a current of 2.5 μA flows as the reference current in each of sense amplifier circuits SA0-SA3.

When reference word line RWLA2 is selected, two standard cells RMCA are selected in parallel, and two dummy cells DMA are selected in parallel. Dummy cells DMA are in the open state, and do not cause the current to flow. Therefore, the current of 10 μA flowing in each of two standard cells RMCA is supplied from the four sense amplifier circuits, and the current of 20 μA in total is supplied from four sense amplifier circuits SA0-SA3. Therefore, the reference current in each of sense amplifier circuits SA0-SA3 is equal to 5.0 μA (=20/4 μA).

When reference word line RWLA3 is selected, three standard cells RMCA and one dummy cell DMA are selected in parallel. In this case, four sense amplifier circuits SA0-SA3 supply the current of (3×10 μA) in total flowing these standard cells RMCA so that the reference current in each of sense amplifier circuits SA0-SA3 is equal to 7.5 μA (=30/4 μA).

In the data read operation, reference word lines RWLA1-RWLA3 are selected in a predetermined sequence, i.e., in the order of reference word lines RWLA2, RWLA1 and RWLA3, or in the order of RWLA2, RWLA3 and RWLA1. Reference word-line RWLA2 is selected, and "1" or "0" of the upper bit of four-valued data represented by two bits is determined according to the output value of the sense amplifier circuit at this time. When reference word line RWLA1 is selected, it is determined whether the lower bit in the memory cell storing data of the upper bit of "1" is "1" or "0". When reference word line RWLA3 is selected, it is determined whether the lower bit in the memory cell storing data of the upper bit of "0" is "1" or "0". Therefore, the four-valued data represented by two bits can be read by validating the output signal of the sense amplifier circuit when reference word line RWLA1 or RWLA3 is selected according to the value of the upper bit. Since the four memory cells are selected in parallel, the four four-valued data can be internally read in parallel.

In the data write operation, all the memory cells are first set to the low resistance state corresponding to the state of storing data "00". Then, reference word line RWLA3 is driven to the selected state, and it is determined whether a current larger than the reference current flows in the sense amplifier circuit. When data "00" is to be written into the memory cells through which the larger current flows, data writing into these memory cells are no longer performed.

The write current pulse is applied to the other memory cells, and rapid heating and rapid cooling are effected on these memory cells to increase the resistance values. Then, reference word line RWLA2 is set up to the selected state, and it is determined whether the current flowing through the memory cell is larger than the reference current. The memory cell causing the current flow larger than the reference current is the memory cell to store data "01" or data "00". In this state, reference word line RWLA3 is selected, and the lower limit current is detected. As for the memory cells storing data "01" other than the memory cells storing data "00", if the driving current is within the rage between the upper and lower limits of the current distribution range, it is determined that data writing is complete, and no further data writing is performed.

Then, the write pulse is applied to the remaining memory cells again, and the rapid heating and rapid cooling are performed to raise the resistance value of each memory cell. After this writing, reference word lines RWLA1 and RWLA2 are successively driven to the selected state. When reference word line RWLA1 is selected, if the memory cell drives a current larger than the reference current, this memory cell stores data "10", "01" or "00". When reference word line RWLA2 is selected, if the memory cell drives a current larger than the reference current, this memory cell stores data "01" or "00". Therefore, when it is determined that the memory cell of write target of data "10" passes the current of a magnitude between the magnitudes of the reference currents flowing upon selection of word lines RWLA1 and RWLA2, it is determined that data "10" is written to the target memory cell, and the subsequent writing is stopped.

Then, the write pulse is applied again to the remaining memory cells to perform a verify operation. When reference word line RWLA1 is selected for verifying the writing of data "10", the memory cell causing the drive current flow larger than reference current of 2.5 μA receives the write pulse to increase further its resistance value. Therefore, in verifying the writing of data "11", when the memory cell to be verified drives (passes) a current smaller than the reference current which flows upon of selection of reference word line RWLA1, it is determined that the writing of data "11" is completed.

According to the write sequence described above, the four-valued data can be reliably written. Also, by utilizing the structure shown in FIG. 65, the reference current for each data can be accurately produced.

By utilizing the standard cell and dummy cell DMA shown in FIG. 65 as the reference cells, the reference currents assume the values of 2.5 μA, 5.0 μA and 7.5 μA, and all the intervals are the equal width of 2.5 μA. By multiplying ¼, 2/4 or ¾ times the drive current of the memory cell in the low resistance state (memory cell storing data "00"), the reference currents can be accurately produced at equal intervals. Since the reference currents are produced at equal intervals, the distribution width of the resistance values of the memory cells can be accurately adjusted, so that the resistance values can be distributed within a small width with high accuracy.

The difference between the reference current and the memory cell drive current for each resistance value can be uniform, and the read speed corresponding to each resistance value can be uniform so that fast data reading can be achieved. The standard cell is the phase change element in the low resistance state, and is less affected by the read disturbance so that it can stably produce the reference current, and reliable writing and reading of data can be achieved.

Figure 67:
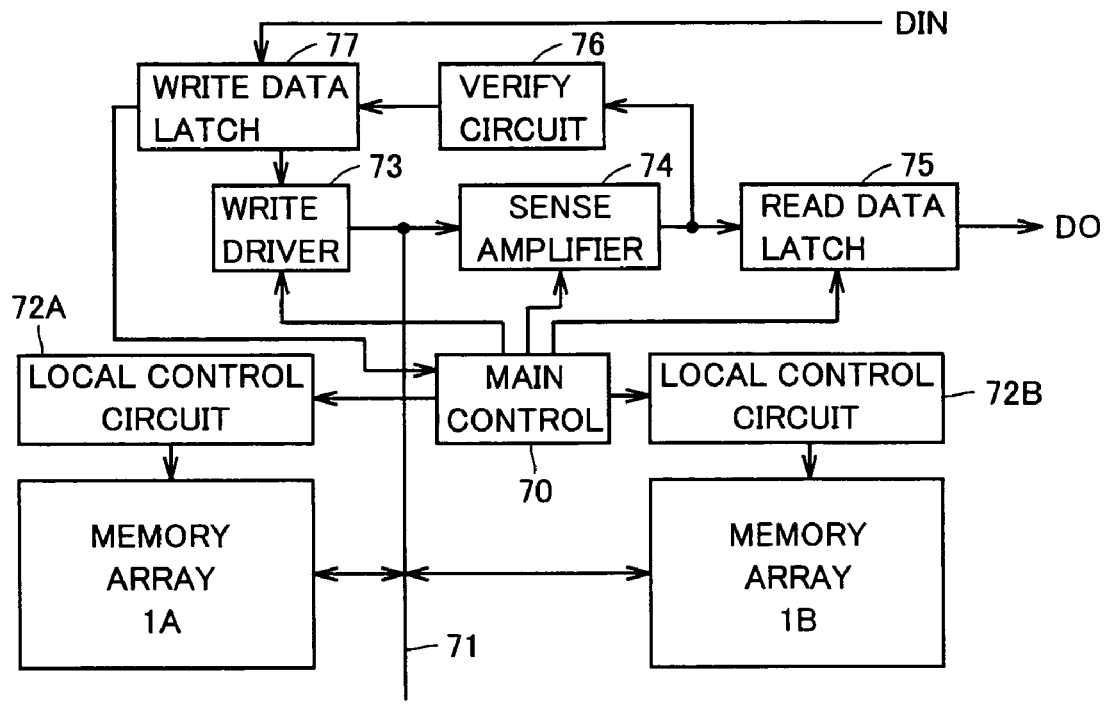
FIG. 67 schematically shows a whole configuration of the nonvolatile semiconductor memory device according to the eleventh embodiment of the invention.

FIG. 67 schematically shows a whole construction of the nonvolatile semiconductor memory device according to the eleventh embodiment of the invention. In FIG. 67, a data bus 71 is arranged between memory arrays 1A and 1B. Data bus 71 includes read and write data lines RLIO and WLIO for memory arrays 1A and 1B as well as a local data line LIO. Data bus 71 is coupled to a write driver 73 and a sense amplifier 74. Peripheral circuits such as a data line switch circuit switching the read current path and an equalize circuit are arranged at preceding stage of sense amplifier 74, but FIG. 67 does not show these components for the sake of simplicity.

For memory arrays 1A and 1B, local control circuits 72A and 72B are arranged for controlling the write/read of data and the memory cell selecting operation. Local control circuits 72A and 72B operate under the control of a main control circuit 70, and execute the selection of a word line in the memory array including a selected memory cell and the selection of a reference word line in the other memory array according to an address signal (not shown) including the array designating address bit.

The main control circuit 70 controls the write and read operations in write driver 73 and sense amplifier 74 based on an operation mode instruction signal (not shown).

The nonvolatile semiconductor memory device further includes a write data latch 77 successively latching write data DIN, a verify circuit 76 for making a comparison between the output data of sense amplifier 74 and the output data of data latch 77 in the data write operation, and a read data latch 75 for latching the output data of sense amplifier 74 to produce read data DO in the read operation.

In the data write operation, verify circuit 76 reads the selected memory cell data via sense amplifier 74 after a write pulse is applied to the memory cells. When the data stored in data latch 77 matches with the read data from sense amplifier 74, verify circuit 76 resets the write data latched by write data latch 77, and stops the subsequent write operation to the memory cell.

When the output data of sense amplifier 74 does not match with the stored data of write data latch 77, verify circuit 76 does not reset the data corresponding to the write data of write data latch 77, and executes the writing again.

When the write data of write data latch 77 is applied to write driver 73, and the data bit stored in write data latch 77 is in the state other than the initial state (data "00"), write driver 73 supplies the write pulse to a corresponding memory cell.

Main control circuit 70 repeats the above write operation until all the data stored in write data latch 77 attain the initial state of "00".

In the data write operation, therefore, write driver 73 does not request the write pulse for the memory cell in which data "00" is to be stored, (all the memory cells of the write targets are initially reset to the initial state). Then, write driver 73 requests the write pulse to perform the writing of data. Then, for performing the verification operation, local control circuits 72A and 72B, under the control by main control circuit 70, drive the selected word line and the corresponding reference word line to the selected state, and drive reference word line RWLA2 shown in FIG. 65 to the selected state. In this operation, the output data of sense amplifier 74 is provided to verify circuit 76. Verify circuit 76 determines whether the data of the memory cell to store writing data "01" matches with the output data of this sense amplifier 74 or not.

For the memory cell to which data "01" is to be written, such a situation may occur that a current larger than the reference current flows when reference word line RWLA2 is selected, and then a current larger than the reference current does not flow when reference word line RWLA3 is selected.

When this situation occurs, it is determined that data "01" is written, and the corresponding data in write data latch 77 is reset to "00". Alternative to this write sequence, such a sequence may be employed in the data write operation that reference word line RWLA3 is selected, and the data write operation is performed after it is verified that the memory cell for the data writing is to store the write data other than data "00".

Thereafter, the write pulse is successively generated to perform the data writing while increasing the amount of write current, and it is determined whether the drive current of the write target memory cell falls within in a range between the upper and lower limits of the current distribution range of the write data, and the latch data of write data latch 77 is reset to the initial value ("00") when the writing is completed. Thereafter, write driver 73 supplies the write current to the memory cell which latches the data other than data "00".

Figure 68:
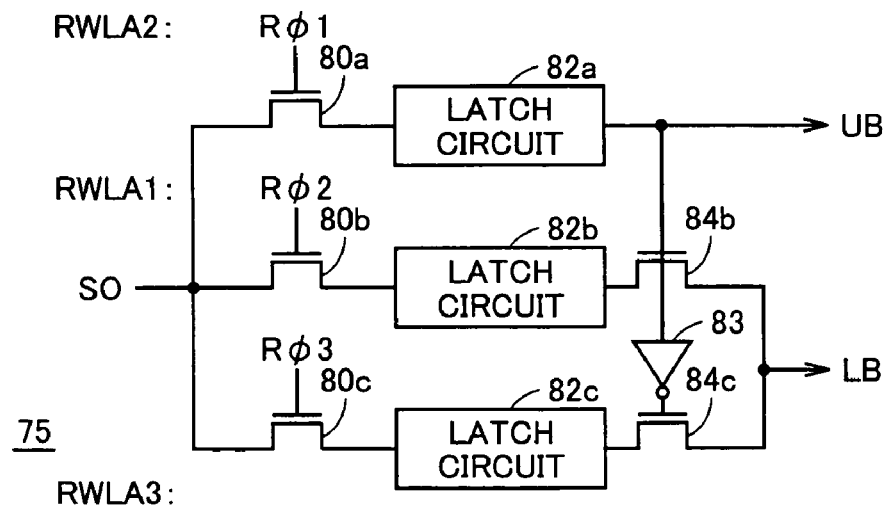
FIG. 68 shows an example of a configuration of a read data latch shown in FIG. 67.

FIG. 68 shows an example of the configuration of read data latch 75 shown in FIG. 67. FIG. 68 shows a configuration of the read data latch receiving an output signal SO of one sense amplifier circuit. In FIG. 68, the read data latch includes transfer gates 80a-80c which are selectively turned on in response to read timing signals Rφ1-Rφ3, to pass output signals SO of the corresponding sense amplifier circuit, latch circuits 82a-82c which latch the data passed through transfer gates 80a-80c, respectively, an inverter 83 inverting the latched data of latch circuit 82a, a transfer gate 84b transmitting the latched data of latch circuit 82b according to the output signal of latch circuit 82a, and a transfer gate 84c passing the latched data of latch circuit 82c according to the output signal of inverter 83. Latch circuit 82a outputs a upper bit UB, and transfer gate 84b or 84c outputs a lower bit LB.

Read timing signals Rφ1-Rφ3 correspond to the selection sequence of the reference word line in the read operation. When control signal Rφ1 is active, reference word line RWL2 is-driven to the selected state in memory array 1A or 1B. When control signal Rφ2 is active, reference word line RWLA1 is driven to the selected state. When read timing control signal Rφ3 is active, reference word line RWLA3 is driven to the selected state. The data bit of "1" corresponds to the voltage at the H level.

When reference word line RWLA2 is selected, the output signal SO of the sense amplifier circuit indicates the upper bit of the four-valued data (2-bit data), and latch circuit 82a stores upper bit UB. When read control signal Rφ2 is active, reference word line RWLA1 is selected. In this case, it is determined, according to sense amplifier circuit output SO, whether the lower bit of the memory cell storing upper bit UB of "1" is "1" or "0". Therefore, when latch circuit 82a has stored data bit "1", the output bit of latch circuit 82b is selected as lower bit LB.

In the above operation, the output signal of inverter 83 is at the L level, and transfer gate 84c is non-conductive, and data is not transferred to latch circuit 82c.

Then, read control signal 43 is driven to the active state. In this operation, reference word line RWLA3 is driven to the selected state, and it is determined whether the lower bit of the memory cell storing the data of upper bit UB being "0" is "1" or "0". Therefore, when latch circuit 82a provides upper bit UB of "0", transfer gate 84c is turned on, and the data latched by latch circuit 82c is output as lower bit LB.

Read data latch 75 of the configuration shown in FIG. 68 is utilized. Thereby, when the reference word lines are successively selected, the potential of selected word lines can be set to the read voltage level of the constant read voltage level similarly to the case of the usual binary data reading, and the reading of the multi-valued data can be performed accurately.

According to the eleventh embodiment of the invention, as described above, the reference cells are formed of different kinds of combinations of the standard cells and the dummy cells, and the respective kinds of reference cells are selected by different reference word lines. Thus, it is possible to form the reference current source for accurately reading the four-valued data while maintaining the potential of a selected word line at the constant read voltage level. Further, the intervals between the reference currents for the respective data can be constant, and the difference between the memory cell current corresponding to the memory cell data and the reference current can be uniform so that fast data reading can be performed.

In the operation of producing the reference current, the standard cell and the dummy cell are used, and only the phase change elements in the low resistance state are used. Thus, the influence of the read disturbance can be suppressed, and the reliable reference current source can be formed, which achieves the reliable data reading.

Twelfth Embodiment

Figure 69:
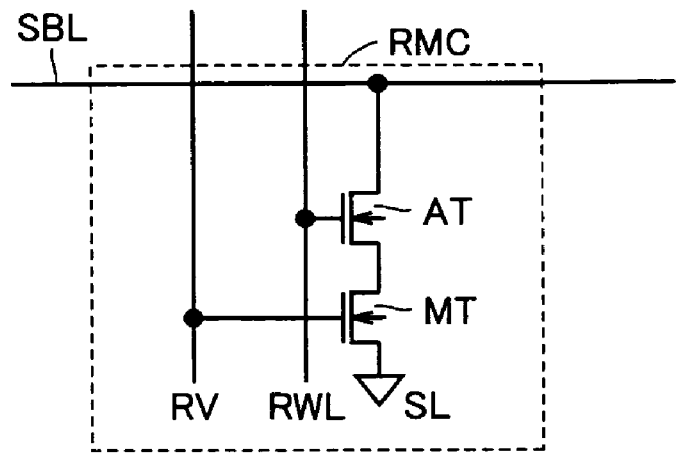
FIG. 69 shows a structure of a reference cell according to a twelfth embodiment of the invention.

FIG. 69 shows a structure of the reference cell according to the twelfth embodiment of the invention. In FIG. 69, reference cell RMC includes access transistor AT and a reference transistor MT connected in series between sub-bit line SBL and source line SL. The gate of access transistor AT is connected to reference word line RWL, and reference transistor MT is coupled to a reference voltage line RV transmitting the reference voltage at the predetermined voltage level. Reference transistor MT is a MOS transistor (insulated gate field effect transistor) of a single gate, and access transistor AT and reference transistor MT preferably have the same size, and are preferably formed in the same manufacturing steps.

By adjusting the voltage level of the reference voltage transmitted through reference voltage line RV, a channel resistance of reference transistor MT is set to a value which is nearly twice as large as the resistance value of the phase change element in the low resistance state.

Figure 70:
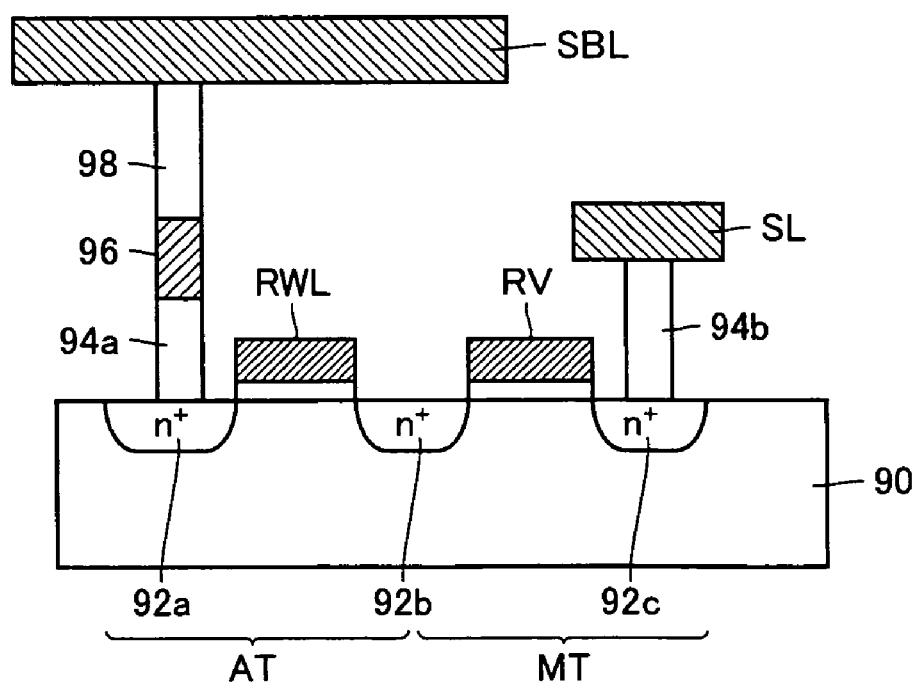
FIG. 70 schematically shows a sectional structure of a reference cell shown in FIG. 69.

FIG. 70 schematically shows a sectional structure of reference cell RMC shown in FIG. 69. In FIG. 70, n-type impurity regions 92a, 92b and 92c are formed at the surface of a substrate region 90. Reference word line RWL is formed above the surface of substrate region 90 between impurity regions 92a and 92b with a gate insulating film (not shown) in between. Reference voltage line RV is formed on the surface of substrate region 90 between impurity regions 92b and 92c with a gate insulating film (not shown) in between. These reference word line RWL and reference voltage line RV are formed in the same manufacturing steps as the word line manufacturing steps for the normal memory cells.

Impurity region 92a is coupled to sub-bit line SBL via a plug 94a, an intermediate base layer 96 and a contact layer 98. Impurity region 92c is coupled to source line SL via a plug 94b.

Contact layer 98 is formed in the same manufacturing steps as the step of forming the contact connecting the upper electrode of the phase change material element to the sub-bit line, and intermediate base layer 96 is formed in the same manufacturing steps as source line SL. Thereby, reference cell RMC can be formed in the same manufacturing steps as the normal memory cell.

By setting the voltage supplied to reference voltage line RV at a certain voltage level, it is possible to adjust the resistance value of the channel region between impurity regions 92b and 92c. It is merely required to supply always the reference voltage at the predetermined voltage level onto reference voltage line RV, and it is not necessary to charge or discharge the voltage on reference voltage line RV in response to the selection/non-selection of reference word line RWL. When reference cell RMC is not selected, access transistor AT is held off, and sub-bit line SBL is electrically isolated from reference transistor MT, so that no adverse effect is exerted on the driving current of the normal memory cell on sub-bit line SBL.

As shown in FIGS. 69 and 70, the reference resistance value is implemented in the reference cell by using the MOS transistor. Thereby, such a problem can be avoided that the read current causes the changes in crystal phase state (resistance value) in the reference cell, and the problem of the read disturbance can be eliminated, so that the reliable data reading can be achieved. By setting the channel resistance of the reference transistor to a value nearly twice as large as the resistance value of the phase change element in the low resistance state, it is possible to increase the reference current even with the low power supply voltage, and the fast data reading can be achieved.

In the memory array including the memory cells (MC), reference cells RMC are aligned to the memory cells, and the stray capacitance and others of the reference sub-bit line can be made equal to those of a selected sub-bit line, so that the accurate reference current can be supplied.

The reference cell RMC shown in FIG. 69 may be combined with the dummy cell in the open state, to implement the structure for producing the reference current.

The nonvolatile semiconductor memory device according to the invention can be applied to the memory devices each utilizing the phase change element as the storage element. The nonvolatile semiconductor memory device utilizing the phase change material element as the storage element may be used in a single chip form, or may be integrated together with a processor or the like on the same chip to form an SOC (System On Chip). Also, it may be used as a memory embedded in a processor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a memory array having a plurality of phase change memory cells arranged in rows and columns, each having a resistance value changed through application of heat to store data according to the resistance value;
    write current supply circuitry for supplying a write current to a selected memory cell among the memory cells in a data write operation;
    a plurality of bit lines, arranged corresponding to the memory cell columns, each connected to the memory cells in a corresponding column; and
    a plurality of source lines for forming current paths each for conducting said write current in combination with said selected memory cell and a corresponding bit line, said write current flowing through a current path formed of a bit line connected to the selected memory cell, said selected memory cell and the source line connected to said selected memory cell, and a total resistance value of the path of said write current from said write current supply circuitry to a reference voltage node except a resistance value of the selected memory cell being substantially constant independently of a position of the selected memory cell in said memory array.

2. The nonvolatile semiconductor memory device according to claim 1, wherein
    each of the write current path from said write current supply circuitry to the selected memory cell and the write current path from said selected memory cell to said reference voltage node has a resistance value substantially not greater than 500Ω.

3. The nonvolatile semiconductor memory device according to claim 1, wherein
    the source lines are arranged in parallel to the bit lines.

4. The nonvolatile semiconductor memory device according to claim 1, wherein
    the source lines are arranged perpendicularly to the bit lines.

5. The nonvolatile semiconductor memory device according to claim 1, wherein
    each of the source lines is shared by the memory cells adjacent to each other in a direction perpendicular to an extending direction of the source lines.

6. The nonvolatile semiconductor memory device according to claim 1, further comprising:
    a plurality of word lines arranged corresponding to the memory cell rows, the memory cells adjacent to each other in a row direction being connected to different word lines, respectively.

7. The nonvolatile semiconductor memory device according to claim 1, further comprising:
    current restricting circuitry arranged for the selected cell and for restricting the current flowing through the current path.

8. The nonvolatile semiconductor memory device according to claim 1, further comprising:
    read current supply circuitry for supplying a read current to the path of the bit line, the source line and the selected memory cell in a data read operation, a total resistance value of the read current path from said read current supply circuitry to said reference voltage supply node except the selected memory cell being substantially constant independently of a position of the selected memory cell in said array.

9. The nonvolatile semiconductor memory device according to claim 8, further comprising:
    a write gate for coupling the selected memory cell to said write current supply circuitry in said data write operation; and
    a read gate arranged separately from said write gate, for coupling said selected memory cell to said read current supply circuitry via a path different from a path of said write current in the data read operation.

10. The nonvolatile semiconductor memory device according to claim 9, further comprising:
    at least one write data line for transmitting a current from said write current supply circuitry; and
    read data lines arranged separately from the at least one write data line and being larger in number than said at least one write data line, for transmitting the read current supplied from said read current supply circuitry, the read gates connected to each of the read data lines being smaller in number than the write gates connected to each of the at least one write data line, and the read data lines being coupled to different bit lines in the data read operation in parallel.

11. The nonvolatile semiconductor memory device according to claim 8, wherein said plurality of memory cells are divided into a plurality of memory blocks, and said read current supply circuitry is arranged corresponding to each of the memory blocks; and said write current supply circuitry is arranged commonly to said plurality memory blocks.

* * * * *